(12) United States Patent
Sano et al.

(10) Patent No.: US 7,268,647 B2
(45) Date of Patent: Sep. 11, 2007

(54) FILM BULK ACOUSTIC-WAVE RESONATOR AND METHOD FOR MANUFACTURING THE SAME

(75) Inventors: Kenya Sano, Kawasaki (JP); Naoko Yanase, Kawasaki (JP); Kazuhiko Itaya, Yokohama (JP); Takaaki Yasumoto, Kawasaki (JP); Ryoichi Ohara, Kawasaki (JP); Takashi Kawakubo, Yokohama (JP); Takako Motai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/626,270

(22) Filed: Jan. 23, 2007

(65) Prior Publication Data

US 2007/0115078 A1    May 24, 2007

Related U.S. Application Data

(62) Division of application No. 11/108,671, filed on Apr. 19, 2005, now Pat. No. 7,187,253.

(30) Foreign Application Priority Data

Apr. 20, 2004 (JP) .............................. 2004-124774
Mar. 30, 2005 (JP) .............................. 2005-099911

(51) Int. Cl.
H03H 9/15 (2006.01)
H03H 9/13 (2006.01)
H03H 3/02 (2006.01)
H03H 9/54 (2006.01)

(52) U.S. Cl. ...................... 333/187; 310/322; 310/324; 257/416; 438/48; 438/53; 29/25.35; 333/189

(58) Field of Classification Search .................. 333/187
See application file for complete search history.

(56) References Cited

U.S. PATENT DOCUMENTS

| 6,204,737 | B1 | 3/2001 | Ella ............................ 333/187 |
| 6,662,419 | B2 | 12/2003 | Wang et al. ................ 29/25.35 |
| 7,019,604 | B2 | 3/2006 | Gotoh et al. ................. 333/187 |
| 7,053,456 | B2 | 5/2006 | Matsuo ........................ 257/415 |
| 7,129,806 | B2 | 10/2006 | Sato ............................ 333/187 |
| 7,214,564 | B2 * | 5/2007 | Sung et al. .................. 438/107 |

FOREIGN PATENT DOCUMENTS

JP        2000-69594        3/2000

\* cited by examiner

*Primary Examiner*—Barbara Summons
(74) *Attorney, Agent, or Firm*—Oblon, Spivak, McClelland, Maier & Neustadt, P.C.

(57) ABSTRACT

A film bulk acoustic-wave resonator having, a substrate having a cavity, the substrate being formed of one of semi-insulating material and high-resistivity material, a bottom electrode partially fixed to the substrate, part of the bottom electrode is mechanically suspended above the cavity, a piezoelectric layer disposed on the bottom electrode, the shape of the piezoelectric layer is defined by a contour, a top electrode on the piezoelectric layer, a semiconductor intermediate electrode buried at and in a surface of the substrate, being located at the contour of the piezoelectric layer, the semiconductor region having a lower resistivity than the substrate, the intermediate electrode is connected to the bottom electrode in the inside of the contour, and a bottom electrode wiring connected to the semiconductor intermediate electrode extending from the contour to an outside of the contour in the plan view.

5 Claims, 21 Drawing Sheets

FILM BULK ACOUSTIC-WAVE RESONATOR AND METHOD FOR MANUFACTURING THE SAME

CROSS REFERENCE TO RELATED APPLICATION AND INCORPORATION BY REFERENCE

This application is a divisional and claims the benefit of priority under 35 U.S.C. §120 from U.S. application Ser. No. 11/108,671 now U.S. Pat. No. 7,187,253, filed Apr. 19, 2005 and claims benefit of priority under 35 USC 119 based on Japanese Patent Application No. P2004-124774 filed Apr. 20, 2004, and Japanese Patent Application No. P2005-99911 filed Mar. 30, 2005. The entire contents of these applications are incorporated herein by reference.

BACKGROUND OF THE INVENTION

1. Field of the Invention

The present invention relates to a film bulk acoustic-wave resonator (FBAR) using longitudinal vibration mode along a thickness direction of a piezoelectric layer, and a method for manufacturing the FBAR.

2. Description of the Related Art

Recent wireless communication technology has accomplished rapid development, and various approaches for achieving a high-speed transmission are developing more and more. The move to higher operation frequencies of communication devices has been motivated by the need for larger and larger data rate, and in addition, there is a great demand that high frequency communication devices should be fabricated into lighter and smaller geometries. Each of such wireless communication devices encompasses a radio frequency (RF) front-end unit, which processes radio frequency signal, and a base-band (BB) unit, which processes digital signal. In the two units, the BB unit modulates and demodulates signals by digital signal processing architecture and can be easily miniaturized, since the circuitry for the BB unit can be monolithically integrated in a single LSI chip. The circuitry for the RF front-end unit, however, is difficult to be merged into a single LSI chip, since the RF front-end unit must amplify high frequency analog signals and convert frequency in a high frequency band, therefore the RF front-end unit requires a complicated configuration, which includes oscillators and many and various passive components such as filters. Generally, a surface acoustic wave (SAW) device is used as an element for RF filters and IF filters in mobile communication devices of earlier technology. However, since resonance frequency of the SAW device is inversely proportional to a spacing between comb-shape electrodes, in frequency band exceeding 1 GHz, the spacing between comb-shape electrodes becomes 1 µm or less, it is difficult to meet the demand for higher frequency of operation, and the frequency increases higher and higher, recently. Because the configuration with the SAW device is assembled by discrete components, for instance, special substrates such as lithium tantalate ($LiTaO_3$), the RF front-end unit is not suitable for miniaturization.

For a substitute of the SAW device, as a resonator, which attracts attention recently, there is a FBAR using longitudinal vibration mode along a thickness direction of a piezoelectric layer. The FBAR is called "bulk acoustic wave" (BAW) element, etc. Because, in the FBAR, the resonance frequency is determined by acoustic wave velocity and film thickness of the piezoelectric layer, the resonance frequency is about 2 GHz at a film thickness of one to two µm and is about 5 GHz at a film thickness of 0.4 to 0.8 µm. Therefore, the FBAR facilitates high frequency operations up to several decades GHz. As the FBARs are comparatively easy to fabricate on a silicon (Si) substrate, the FBARs are advantageous for miniaturization of the wireless communication devices.

A representative structure of the FBAR of earlier technology has been disclosed in Japanese Published Unexamined Patent Application No. 2000-69594. As shown in the Japanese Published Unexamined Patent Application No. 2000-69594, the FBAR is manufactured by the following formation process sequences. First, a cavity is formed on a Si substrate by anisotropic etching, and next, a sacrificial layer such as boro-phosphate-silicate-glass (BPSG), which is easily etched by a specific etchant, is buried in the cavity at the top surface of the substrate. Afterwards, the sacrificial layer is polished flat until the top surface of the Si substrate is exposed. By the process, the sacrificial layer is embedded in the cavity at the top surface of the Si substrate and the surface of the Si substrate surrounds the perimeter of the sacrificial layer. On the sacrificial layer, a bottom electrode, a piezoelectric layer and a top electrode are deposited successively. Afterwards, an etchant supplying conduit is excavated until the etchant-supplying conduit reaches the top surface of the sacrificial layer. Then, the sacrificial layer is removed by selective etching with etchant supplied through the etchant supplying conduit, and a cavity is selectively formed under the bottom electrode. By such a sequence of formation processes, the FBAR is completed.

According to the manufacturing method of the FBAR disclosed in Japanese Published Unexamined Patent Application No. 2000-69594, the sacrificial layer is formed at the top surface of the Si substrate, and the bottom electrode is formed on the Si substrate so as to cover the sacrificial layer, and further, on the top surface of the bottom electrode, a piezoelectric layer is stacked. Then, the piezoelectric layer is delineated to occupy a given limited area, and the top electrode is delineated on the piezoelectric layer. In the sequence of formation processes, after the piezoelectric layer is delineated, a pattern of an extraction wiring of the bottom electrode is delineated by wet etching using such solutions as potassium hydroxide (KOH), tetra methyl ammonium hydroxide (TMAH), for instance, or dry etching such as reactive ion etching (RIE) method. Aluminum nitride (AlN), or alternatively zinc oxide (ZnO) is generally adopted for material of the piezoelectric layer and especially AlN is widely used because of the material behavior that facilitates the matching with the semiconductor manufacturing processes.

However, there are problems in that in either case of using AlN or ZnO, the etching rate of the piezoelectric dielectric film is low and sufficient etching selectivity of the piezoelectric dielectric film to a metallic film for the bottom electrode is hard to be achieved, when the piezoelectric dielectric film is selectively etched to expose the bottom electrode so that the extraction wiring can be connected to the bottom electrode. When the etching selectivity of the piezoelectric dielectric film to a metallic film for the bottom electrode is not sufficient, an over-etching for assuring uniformity of the etching depth decreases the film thickness of the bottom electrode in part of an element region or over the whole element region. Then, series resistance of the bottom electrode increases and contact resistance between the extraction wiring and the bottom electrode increases due to surface roughness and degeneration of the bottom electrode.

As parameters representing resonance characteristic of the FBAR, electromechanical coupling factor $k_t^2$, which is an indicator of the effectiveness with which a piezoelectric material converts electrical energy into mechanical energy, or converts mechanical energy into electrical energy and Q-value, which is a measure of the sharpness of the resonance peak in the frequency response of the system, are employed. There are two Q-values; one is a Q-value at a resonance frequency in which electrical impedance becomes a minimum and another is a Q-value at an anti-resonance resonance frequency in which the electrical impedance becoming a maximum. When a filter is implemented by a combination of resonators, a frequency bandwidth of the filter is proportional to the electromechanical coupling factor $k_t^2$, and insertion losses in the subject frequency band are inversely proportional to a quality factor defined by product of the Q-value and the electromechanical coupling factor $k_t^2$. Since the electromechanical coupling factor $k_t^2$ is a value proper to material, there is no necessity for increasing the electromechanical coupling factor $k_t^2$, if an appropriate frequency bandwidth can be realized by improving crystal purity and controlling crystal orientation to a polarization direction. Therefore, the Q-value must be set as high as possible so as to decrease the insertion losses.

Elastic loss of the piezoelectric layer, elastic loss of the electrode, and series resistance of the electrode affect the Q-value at resonance frequency and the elastic losses of the piezoelectric layer, the elastic losses of the electrode, conductance of the substrate, and dielectric losses of the piezoelectric layer affect the Q-value at anti-resonance frequency. According to analysis of experimental data of inventors of the present invention, series resistance of the bottom electrode play a dominant role as the origin of degradation of the Q-value at resonance frequency, and elastic losses of the piezoelectric layer is the dominant origin of degradation of the Q-value at anti-resonance frequency. From the investigation, an increase of series resistance of the bottom electrode by etching failure, causes the degradation of the Q-value at resonance frequency, which greatly affects performances of the FBAR. In addition, e investigation proved a possibility in which disconnection of the bottom electrode is caused by over-etching.

So to overcome the above-mentioned problems due to over-etching, various methodologies such as:

(a) selecting material of the bottom electrode so that etching selectivity of the piezoelectric dielectric film to a metallic film for the bottom electrode is sufficiently large (hereinafter called "the first methodology");

(b) providing some margins for over-etching by increasing the film thickness of the bottom electrode (hereinafter called "the second methodology"); and (c) decreasing etching rate of the piezoelectric dielectric film so as to facilitate detecting the end point of the etching (hereinafter called "the third methodology"), are adopted.

However, in the first methodology, if a high selectivity is required as one of the specific material properties so as to overcome the problems associated with the low etching selectivity, freedom for selecting materials becomes small, because the material property must satisfy the required low resistance value and low elastic losses (internal friction), etc. Because the thickness of the bottom electrode has great effect upon the resonance characteristic itself, there is an optimum film thickness of the bottom electrode. If the thickness of the bottom electrode cannot satisfy the optimum film thickness, the electromechanical coupling factor $k_t^2$, which is an index to the intensity of the piezoelectricity, decreases, and further the Q-value, which is a measure of the sharpness of resonance peak in the frequency response of the system, decreases, and still further shift of the resonant frequency is generated. Therefore, the second methodology such that providing some margins for the etching process, by increasing the film thickness of the bottom electrode so as to overcome problems associated with over-etching of the bottom electrode has a limitation. Further, by the third methodology, decreasing the etching rate of the piezoelectric dielectric film so as to facilitate detecting the end point of the etching process, the processing time for each etching process becomes long, which increases the throughput time.

In view of these situations, it is an object of the present invention to provide a FBAR, which has a large electromechanical coupling factor $k_t^2$ and a large Q-value, and a method for manufacturing the FBAR.

SUMMARY OF THE INVENTION

An aspect of the present invention may inhere in a film bulk acoustic-wave resonator encompassing (a) a substrate having a cavity, (b) a bottom electrode partially fixed to the substrate, part of the bottom electrode is mechanically suspended above the cavity, (c) a piezoelectric layer disposed on the bottom electrode, a planar shape of the piezoelectric layer is defined by a contour, which covers an entire surface of the bottom electrode in a plan view, (d) a top electrode on the piezoelectric layer, (e) an intermediate electrode located between the substrate and the piezoelectric layer, and at the contour of the piezoelectric layer, the intermediate electrode is connected to the bottom electrode in the inside of the contour, and (f) a bottom electrode wiring connected to the intermediate electrode extending from the contour to an outside of the contour in the plan view, wherein a longitudinal vibration mode along a thickness direction of the piezoelectric layer is utilized.

Another aspect of the present invention may inhere in a film bulk acoustic-wave resonator encompassing (a) a substrate having a cavity, the substrate being formed of one of semi-insulating material and high-resistivity material, (b) a bottom electrode partially fixed to the substrate, part of the bottom electrode is mechanically suspended above the cavity, (c) a piezoelectric layer disposed on the bottom electrode, the shape of the piezoelectric layer is defined by a contour, (d) a top electrode on the piezoelectric layer, (e) a semiconductor intermediate electrode buried at and in a surface of the substrate, being located at the contour of the piezoelectric layer, the semiconductor region having a lower resistivity than the substrate, the intermediate electrode is connected to the bottom electrode in the inside of the contour, and (f) a bottom electrode wiring connected to the semiconductor intermediate electrode extending from the contour to an outside of the contour in the plan view, wherein a longitudinal vibration mode along a thickness direction of the piezoelectric layer is utilized.

Still another aspect of the present invention may inhere in a method for manufacturing a film bulk acoustic-wave resonator including (a) forming an intermediate electrode on a substrate, (b) forming a bottom electrode on the substrate, the bottom electrode is connected to the intermediate electrode, (c) forming a piezoelectric layer on the bottom electrode and on the intermediate electrode, such that a contour of the piezoelectric layer covers an entire surface of the bottom electrode in a plan view, and the contour passes on the intermediate electrode, (d) forming a top electrode on the piezoelectric layer, and (e) forming a bottom electrode wiring connected to the intermediate electrode, the bottom electrode wiring extending from the contour of the piezoelectric layer to an outside of the contour in the plan view.

Yet still another aspect of the present invention may inhere in a method for manufacturing a film bulk acoustic-wave resonator including (a) forming an semiconductor intermediate electrode on a semiconductor substrate, the semiconductor intermediate electrode having a lower resistivity than the semiconductor substrate, (b) stacking a metallic film for forming a bottom electrode on the entire surface of the semiconductor substrate so as to include the semiconductor intermediate electrode, (c) stacking a piezoelectric dielectric film on the entire surface of the bottom electrode and on the semiconductor intermediate electrode, (d) delineating the piezoelectric dielectric film and the metallic film with an identical etching mask so as to form the piezoelectric layer and the bottom electrode, the piezoelectric layer has the same shape and the same size as the bottom electrode in a plan view, the bottom electrode is connected to the semiconductor intermediate electrode, (e) forming a top electrode on the piezoelectric layer, and (f) forming a bottom electrode wiring so as to be connected to the semiconductor intermediate electrode.

DETAILED DESCRIPTION OF THE INVENTION

Figure 1A:
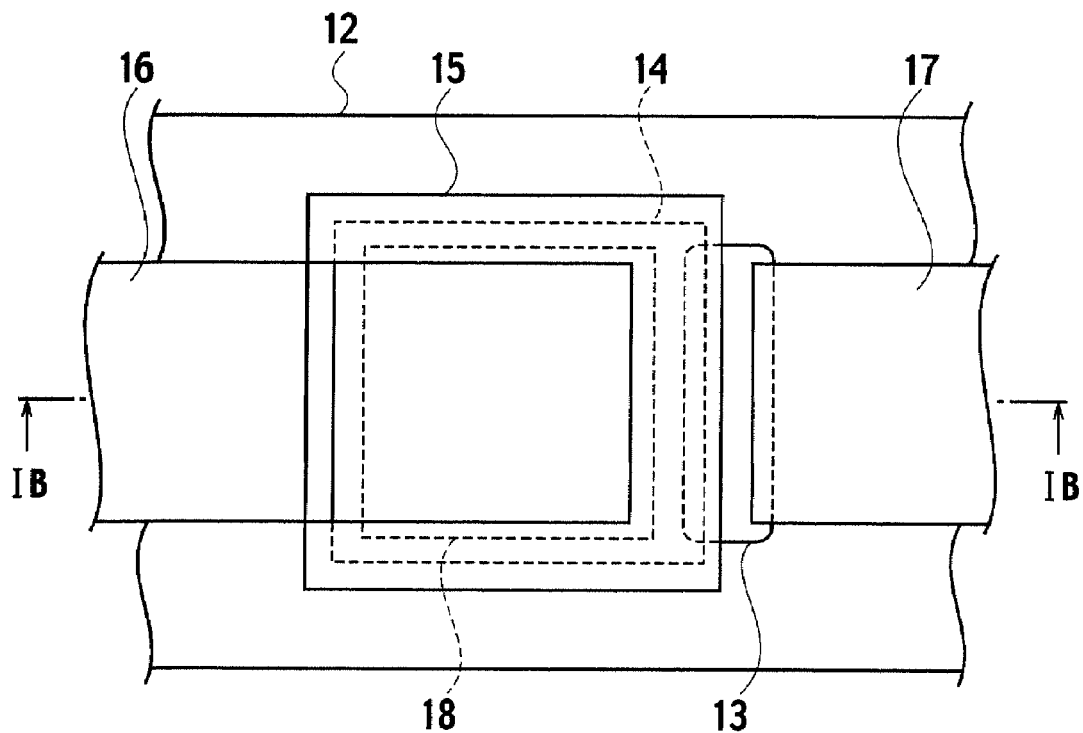
FIG. 1A is a schematic plan view of a film bulk acoustic-wave resonator (FBAR) according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of acoustic devices, it will be appreciated that the various drawings are not drawn to scale from one figure to another nor inside a given figure, and in particular that the layer thicknesses are arbitrarily drawn for facilitating the reading of the drawings.

In view of material properties such as resistivity, elastic constant, and density, materials for top and bottom electrodes of the FBAR are determined. Especially, for materials of the bottom electrode, crystal structure of the bottom electrode material, preferred orientation plane of the bottom electrode material and orientation of the piezoelectric dielectric film must be added as the selection constraints, since the bottom electrode is supposed to serve as an underlying film, which influences the orientation of the piezoelectric dielectric film, which will deposit on the bottom electrode. Therefore, materials such as tungsten (W), molybdenum (Mo), titanium (Ti), aluminum (Al), ruthenium (Ru), rhodium (Rh), palladium (Pd), iridium (Ir), platinum (Pt) are generally used as materials of the bottom electrode.

Through the experimental investigation by inventors of the present invention, it is clear that if Al and Ti are used as the bottom electrode materials, by any methods in wet etchings and dry etchings, the etching selectivity of the piezoelectric layer over the bottom electrode is low, and therefore, manufacturing margin is very low. For instance, when Al is used for the bottom electrode and AlN is used for the piezoelectric layer, the selectivity, which is defined by:

(AlN etching rate)/(Al etching rate)

is about 0.5 by dry etching with chloride based etching gas. When over-etching occurs, since series resistance of the bottom electrode increases and the Q-value deteriorates, it is necessary to minimize any decrease in thickness of the bottom electrode. However, in a case where the selectivity is less than about 0.5, fluctuation of detection sensitivity in the etching end point monitoring occurs, and it is difficult to take sufficient margins for over-etching, and the manufacturing margin allowed in the process sequence becomes very narrow. For instance, if an AlN film of 2 μm thickness is used as a piezoelectric layer, the thickness of the bottom electrode becomes ½ of the original value by an error in seconds, or the time interval between the instant at which the etching end point is detected and the instant at which the etching is actually stopped, and resistance of the bottom electrode increases over double of the original value.

With regard to materials such as W, Mo, Ru, Rh, Pd, Ir, Pt, etc., although the etching selectivity of the piezoelectric layer over the bottom electrode can be ensured to some extent, the film thickness of the bottom electrode must be thinned up to under several hundred nm, because specific gravities of W, Mo, Ru, Rh, Pd, Ir, Pt, etc., are large. Also, according to the experimental investigation, it turned out that especially for a resonator operating at higher frequency bands, the manufacturing margin is very narrow, since the resonance characteristic deteriorates due to the increase of the series resistance of the bottom electrode, which is caused by localized over-etching. For instance, when Mo film is used as the bottom electrode and operation frequency is over 5 GHz, the film thickness of the bottom electrode must be less than about 100 nm, resulting in a deterioration of the Q-value by a slight error of the time interval between the instants at which the etching end point is detected and at which the etching is actually stopped.

Therefore, inventors of the present invention repeated a wide range of various experimental investigations over various factors and conditions so as to specify a best processing condition and a best configuration, in which an increase of resistance in the bottom electrode can not be generated, when AlN, or alternatively ZnO, serving as the piezoelectric layer, is processed under a sequence of formation processes. And the inventors concluded that a margin can be expanded and characteristics of a FBAR can be extraordinarily improved, by forming an intermediate electrode, which is implemented by an electrically conductive thin film, so that an extraction wiring, configured to connect the bottom electrode to an external interconnection, can be connected to the intermediate electrode.

According to the above-mentioned methodology, if the intermediate electrode formed of electrically conductive material can increase the etching selectivity of the piezoelectric layer over the intermediate electrode, any material constraints for the bottom electrode and process margins for the film thickness of the bottom electrode are not necessary. And, since the film thickness of the intermediate electrode has no relation with resonator characteristics directly, it is possible to increase the film thickness of the intermediate electrode. Furthermore, a range of selecting materials for the bottom electrode, in view of resistivity and etching selectivity, etc., can be expanded. Further a margin for instabilities of processes such as fluctuation of the processing condition also extends. Therefore, a large technical advantage in the manufacturing of the FBAR is achieved by the employment of the intermediate electrode.

In addition, inventors of the present invention found out that a process margin extends further, when the intermediate electrode has a specific orientation direction. AlN, or alternatively ZnO has a wurtzite lattice structure and an orientation of the piezoelectric dielectric film itself is also affected by the orientation direction of an underlying film. When the piezoelectric layer is orientated on the intermediate electrode too, a large difference is not shown in the orientations on the bottom electrode and on the intermediate electrode, and the grain sizes of the piezoelectric layers are comparatively the same, which can improve film uniformity of the piezoelectric layer. When film quality of the piezoelectric layer is not homogeneous, there is a high probability that cracks at the boundary of the piezoelectric layer may occur, consequently, failures such as film peeling may occur by an effect of residual stress.

In the following description specific details are set forth, such as specific materials, process and equipment in order to provide a thorough understanding of the present invention. It will be apparent, however, to one skilled in the art that the present invention may be practiced without these specific details. In other instances, well-known manufacturing materials, process and equipment are not set forth in detail in order not to unnecessary obscure the present invention. Prepositions, such as "on", "over", "under", "beneath", and "normal" are defined with respect to a planar surface of the substrate, regardless of the orientation in which the substrate is actually held. A layer is on another layer even if there are intervening layers.

First Enbodiment

A film bulk acoustic-wave resonator (FBAR) according to a first embodiment of the present invention encompasses a substrate 11 having a cavity 18, a bottom electrode, part of which is mechanically suspended above the cavity 18 and another part of which is mechanically fixed to the substrate 11, a piezoelectric layer 15 disposed on the bottom electrode, a planar shape of the piezoelectric layer 15 is defined by a contour, which covers an entire surface of the bottom electrode in a plan view shown in FIG. 1A, a top electrode 16 on the piezoelectric layer 15, an intermediate electrode 13 located between the substrate 11 and the piezoelectric layer 15, and at the contour of the piezoelectric layer 15, the intermediate electrode 13 is connected to the bottom electrode in the inside of the contour, and a bottom electrode wiring 17 connected to the intermediate electrode 13 extending from the contour to an outside of the contour in the plan view shown in FIG. 1A. The FBAR according to the first embodiment further encompasses an insulating film 12 inserted between the substrate 11 and the intermediate electrode 13. For materials of the insulating film 12, various dielectric films such as a silicon oxide film ($SiO_2$), a silicon nitride ($Si_3N_4$) film or a composite film of the silicon oxide film ($SiO_2$) and the silicon nitride ($Si_3N_4$) film can be used. However, the insulating film 12 can be omitted, if a high-resistivity or a semi-insulating substrate is employed for the substrate 11, as shown in FIGS. 14, 16B, 18B, 21, 22 and 27. The FBAR according to the first embodiment utilizes a longitudinal vibration mode, or a bulk vibration mode, along a thickness direction of the piezoelectric layer 15.

In the plan view shown in FIG. 1A, the contour of the piezoelectric layer 15 crosses a top surface of the intermediate electrode 13 and part of the intermediate electrode 13 extends to the outside of the contour of the piezoelectric layer 15, from the contour of the piezoelectric layer 15.

Figure 1B:
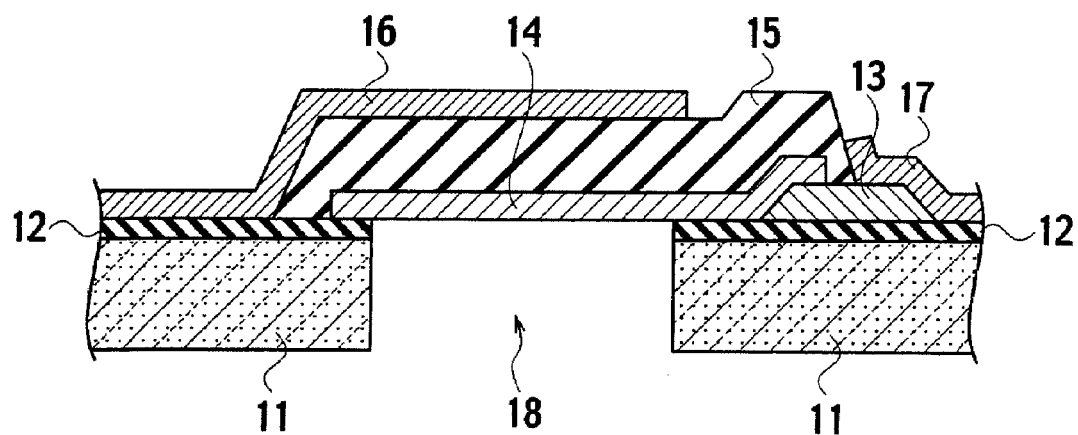
FIG. 1B is a schematic cross sectional view of the FBAR according to a first embodiment, taken on line IB-IB in FIG. 1A.

As shown in FIG. 1B, a cross sectional view of the intermediate electrode 13 is in a trapezoid configuration defined by a first main surface disposed near side of the piezoelectric layer 15, a second main surface disposed near side of the substrate 11, being opposite to the first main surface, the first and second main surfaces are in parallel, and slanted sidewalls intersecting with the second main surface with a taper angle less than 45 degrees, the slanted sidewalls are connected between the first and second main surfaces. A planar shape of the intermediate electrode 13 is a rectangle in a striped configuration and a length of the stripe is wider than the line width of the bottom electrode wiring 17 as shown in FIG. 1A. One side of the bottom electrode 14 is disposed on the intermediate electrode 13 and the bottom electrode 14 and the intermediate electrode 13 are electrically connected. Though the top electrode 16 and the bottom electrode wiring 17 have an almost equal line width, the line width of the bottom electrode 14 is wider than the length of the stripe of the intermediate electrode 13.

In addition, the FBAR according to the first embodiment includes a cavity 18, which is an open cavity implemented by a through-hole penetrating the substrate 11, formed along a direction from the bottom surface of the substrate 11 to the top surface of the substrate 111 for exposing a bottom surface of the bottom electrode 14. As shown in the plan view of FIG. 1A, an area which the cavity 18 occupies, is defined in the inside of the area which the bottom electrode 14 occupies. Further, the area, which the bottom electrode 14 occupies, is defined in the inside of the contour of the piezoelectric layer 15 in a plan view. In the FBAR shown in FIG. 1, resonance frequency can be determined by adjusting the film thicknesses of the piezoelectric layer 15 and the bottom electrode 14, since the FBAR utilizes a longitudinal vibration mode along the thickness direction of the piezoelectric layer 15.

The intermediate electrode 13 of the FBAR according to the first embodiment may have a body-centered cubic (bcc) lattice structure of <110> orientation, a face-centered cubic (fcc) lattice structure of <111> orientation or alternatively a hexagonal close-packed (hcp) lattice structure of <0001> orientation. Examples of metallic materials formed of the bcc lattice structure of <110> orientation are Ta, Mo, W, etc. Examples of metallic materials formed of the fcc lattice structure of <111> orientation are Cu, Ir, Pt, etc. Examples of metallic materials formed of the hcp lattice structure of <0001> orientation are Ti, Ru, etc. In addition, for materials of the intermediate electrode 13, W-Ta alloy (mole fraction of Ta=0.01-0.5), Mo-Ta alloy (mole fraction of Ta=0.01-0.5), W-Ti alloy (mole fraction of Ti=0.01-0.3), Mo-Ti alloy (mole fraction of Ta=0.01-0.3), Ti-W alloy (mole fraction of W=0.01-0.1), Ti-Mo alloy (mole fraction of Mo=0.01-0.1), Pt-Ir alloy (mole fraction of Ir=0.01-0.99), etc. may be used. W-Ta alloy and Mo-Ta alloy have the bcc lattice structure of <110> orientation, Pt-Ir alloy has the fcc lattice structure of <111> orientation and Ti alloys such as W-Ti alloy, Mo-Ti alloy, Ti-W alloy and Ti-Mo alloy have the hcp lattice structure of <0001> orientation. However, the intermediate electrode 13 may be formed of a mixed crystal, not perfectly establishing a crystal structure. And for materials of an underlying layer, which is mainly used as an adhering layer, Ti, or TiN can be employed, on the adhering layer, above-mentioned various metals, or alternatively above-mentioned various alloys may be stacked so as to implement the intermediate electrode 13.

The metallic intermediate electrode 13 of the FBAR according to the first embodiment has a specific orientation, and the metallic intermediate electrode 13 facilitates the matching with <0001> orientation of hexagonal crystal having a wurtzite lattice structure. Therefore, when AlN, or alternatively ZnO having the wurtzite lattice structure are employed to implement the piezoelectric layer 15, an orientation of the piezoelectric layer 15 itself is also affected by the orientation of the metallic intermediate electrode 13 which serves as the underlying film of the piezoelectric layer 15. Hexagonal crystals of the wurtzite lattice structure such as AlN and ZnO are originally subject to be oriented along the c-axis, therefore, by designating the orientation of the metallic intermediate electrode 13 to the bcc <110> orientation, the fcc <111> orientation, or alternatively the hcp <0001> orientation, the orientation of the piezoelectric layer 15 is easy to be oriented uniformly along the c-axis, namely along the <0001> orientation. In other words, in the FBAR according to the first embodiment, the orientation of the piezoelectric layer 15 is identical to the orientation of the metallic intermediate electrode 13. By controlling a polarization direction (orientation) of the piezoelectric layer 15 to the c-axis, an electromechanical coupling factor $k_t^2$ and a Q-value are easy to be ensured. When the piezoelectric layer 15 is orientated along the c-axis on the metallic intermediate electrode 13, a large difference is not observed in the orientations of the piezoelectric layer 15 on the bottom electrode 14 and on the metallic intermediate electrode 13, and the grain size of the piezoelectric layer 15 is comparatively same on the bottom electrode 14 and on the metallic intermediate electrode 13, which can improve film uniformity of the piezoelectric layer 15. When film quality of the piezoelectric layer 15 is not homogeneous, there is a high probability that cracks at a contour of the piezoelectric layer 15, defining the shape of the piezoelectric layer 15 may occur, consequently, failures such as film peeling may occur by an effect of residual stress.

For material of the metallic intermediate electrode 13 of the FBAR according to the first embodiment, a metallic film, which includes at least one of metal selected from a group consisting of Ta, Mo, W, Ni, Co, Cr, Cu, Ti, Ir, Ru and Pt, is preferable in view of resistivity and etching selectivity, etc. Then, from a viewpoint of film uniformity of the piezoelectric layer 15, 45 degrees or less is preferable for a taper angle in the slanted sidewall of the metallic intermediate electrode 13 in the cross sectional view shown in FIG. 1A, and 30 degrees or less is more suitable for the taper angle. If the taper angle in the slanted sidewall of the metallic intermediate electrode 13 exceeds 45 degrees, grain boundaries having different orientations from the orientation of the piezoelectric layer 15, are generated in a slanting plane at the edge of the metallic intermediate electrode 13, which may also cause the cracks in the contour of the piezoelectric layer 15, defining the shape of the piezoelectric layer 15. However, if the taper angle in the slanted sidewall of the metallic intermediate electrode 13 becomes below 10 degrees, the occupation area by the metallic intermediate electrode 13 relatively increases and area efficiency decreases, which does not meet the demand for miniaturization.

For instance, in a case in which the metallic intermediate electrode 13 is formed of a Mo film with a 500 nm film thickness, full width at half maximum (FWHM) of the orientation, or the FWHM established in the rocking curve of X-ray diffraction is two degrees, which shows that the metallic intermediate electrode 13 formed of the Mo film has a strong Mo <110> orientation. The taper angle in a sidewall face of the metallic intermediate electrode 13 is cut to be 20 degrees by chemical dry etching (CDE). The FBAR having a configuration such that on the metallic intermediate electrode 13 formed of Mo film with a 500 nm film thickness and on the bottom electrode 14 formed of Al film with a 300 nm film thickness, the piezoelectric layer 15 formed of AlN film with a 2 μm film thickness is stacked, and on the piezoelectric layer 15, the top electrode 16 formed of Al film with a 300 nm film thickness is stacked and further, the bottom electrode wiring 17 formed of Al film with a 300 nm film thickness, is connected to the metallic intermediate electrode 13 shows a high resonance characteristic such that the resonance frequency is 2.0 GHz, the electromechanical coupling factor $k_r^2$ is 6.5% and the Q-value at the resonance frequency is 900, the Q-value at the anti-resonance frequency is 800, according to a result of evaluating by a measurement using a vector network analyzer.

With reference to FIGS. 2A-2E, a sequence of manufacturing processes of the FBAR according to the first embodiment is explained. Note that the FBAR of the first embodiment can be manufactured by various manufacturing methods including a modification of the first embodiment, other than the sequence of manufacturing processes disclosed by the following example.

(a) First, the substrate 11 such as Si (100) substrate is prepared. And on the substrate 11, an insulating film 12 is formed by thermal oxidation methods, etc. Further, on the insulating film 12, a metallic film which includes at least one of the metals selected from the group consisting of Ta, Mo, W, Ni, Co, Cr, Cu, Ti, Ir, Ru and Pt, having a 200 to 800 nm film thickness, or preferably a 400 to 600 nm film thickness, is formed using radio frequency (RF) magnetron sputtering, etc. Afterwards, the metallic film is delineated by photolithography and accompanying CDE method using fluorine based etching gas so as to form a pattern of the metallic intermediate electrode 13 having a cross-sectional structure shown in FIG. 2A. A planar structure of the metallic intermediate electrode 13 may be formed into a striped pattern, for instance as shown in FIG. 1A.

Figure 2A:
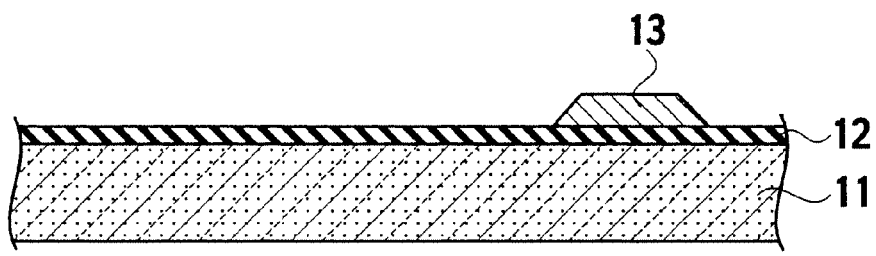
FIG. 2A is a process flow cross sectional view showing an intermediate product of the FBAR taken on line IB-IB in FIG. 1A, explaining a manufacturing method of the FBAR according to the first embodiment.
Figure 2B:
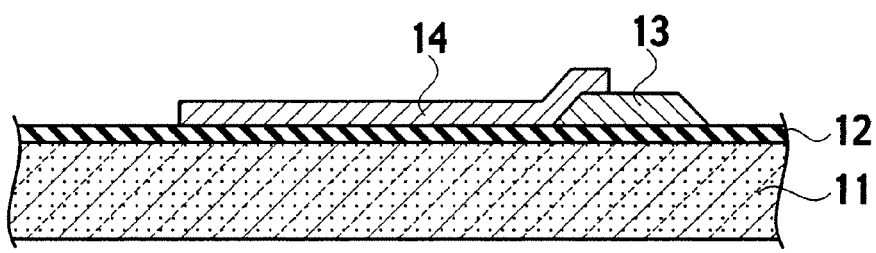
FIG. 2B is a subsequent process flow cross sectional view showing the intermediate product of the FBAR according to the first embodiment after the process stage shown in FIG. 2A.

(b) Next, on the insulating film 12 and on the metallic intermediate electrode 13, a metallic film such as an Al film, having a 150 to 600 nm film thickness, or preferably a 250 to 350 nm film thickness, is deposited using RF magnetron sputtering, etc. And the metallic film is delineated by photolithography and accompanying reactive ion etching (RIE) method so as to form a pattern of the bottom electrode 14 as shown in FIG. 2B. The bottom electrode 14 may be delineated by RIE method with chloride based etching gas, when the metallic intermediate electrode 13 is formed of a Mo film and the bottom electrode 14 is formed of an Al film. In the formation process, one of the ends of the bottom electrode 14 is stacked on the metallic intermediate electrode 13 so that the bottom electrode 14 electrically connects to the metallic intermediate electrode 13.

Figure 2C:
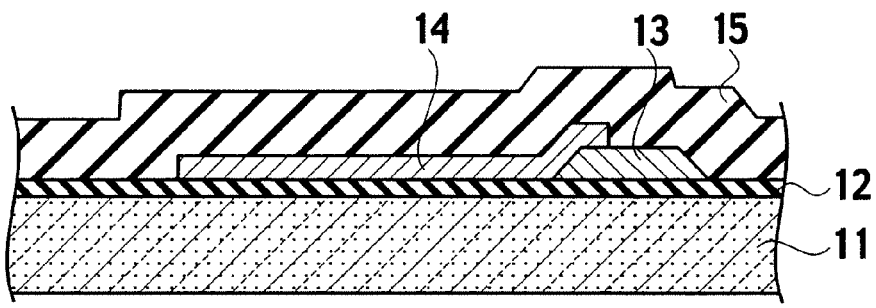
FIG. 2C is a subsequent process flow cross sectional view showing the intermediate product of the FBAR according to the first embodiment, after the process stage shown in FIG. 2B.
Figure 2D:
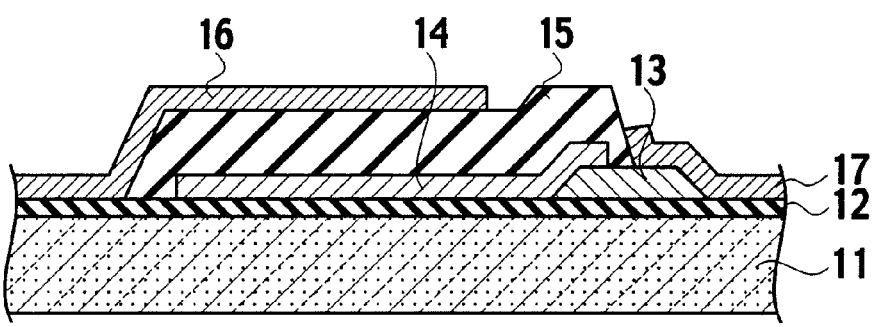
FIG. 2D is a further subsequent process flow cross sectional view showing the intermediate product of the FBAR according to the first embodiment after the process stage shown in FIG. 2C.

(c) Afterwards, on the bottom electrode 14 and on the metallic intermediate electrode 13, a piezoelectric dielectric film (mother material film) for the piezoelectric layer 15, having a wurtzite lattice structure with a 0.5 to 3 μm thickness is deposited by RF magnetron sputtering method, etc. as shown in FIG. 2C. The thickness of the piezoelectric dielectric film (mother material film) for the piezoelectric layer 15 varies by resonance frequencies, and the thickness of the material film may be determined at about 2 μm, if the piezoelectric dielectric film (mother material film) for the piezoelectric layer 15 is AlN if the resonance frequency is supposed to be about 2.0 GHz. And such AlN film is delineated by photolithography and accompanying RIE method so as to form a pattern of the piezoelectric layer 15 as shown in FIG. 2D. The AlN film may be selectively etched by RIE method with chloride based etching gas, when AlN is employed as the piezoelectric dielectric film (mother material film) for the piezoelectric layer 15 and a Mo film as the metallic intermediate electrode 13, which serves as an etching stopper layer. The AlN film is delineated so that one of the sidewall faces of the piezoelectric layer 15 may be located on the metallic intermediate electrode 13, and part of the metallic intermediate electrode 13 is exposed from the contour of the piezoelectric layer 15. And other than Mo, if the metallic intermediate electrode 13 is formed of such electrically-conductive materials as W, Ru, Rh, Pd, Ir, and Pt, the etching selectivity of the piezoelectric layer over the metallic intermediate electrode 13 can be increased and the metallic intermediate electrode 13 serves as the etching stopper layer when the piezoelectric layer 15 is delineated.

(d) Subsequently, a metallic film having a 150 to 600 nm film thickness, or preferably a 250 to 350 nm film thickness, is deposited so that the metallic film can cover the entire surfaces of the piezoelectric layer 15, the metallic intermediate electrode 13 exposed from the contour of the piezoelectric layer 15, and the insulting film 12. Afterwards the metallic film is delineated by photolithography and accompanying selective etching so as to form the top electrode 16 and the bottom electrode wiring 17 as shown in FIG. 2D. The top electrode 16 and the bottom electrode wiring 17 may be delineated by wet etching using such solutions as potassium hydroxide (KOH), tetra methyl ammonium hydroxide (TMAH), in a case in which an Al film is used for the metallic film, an AlN film is used for the piezoelectric layer 15 and a Mo film is used for the metallic intermediate electrode 13. The bottom electrode wiring 17 is electrically connected to the metallic intermediate electrode 13 exposed from the contour of the piezoelectric layer 15.

Figure 2E:
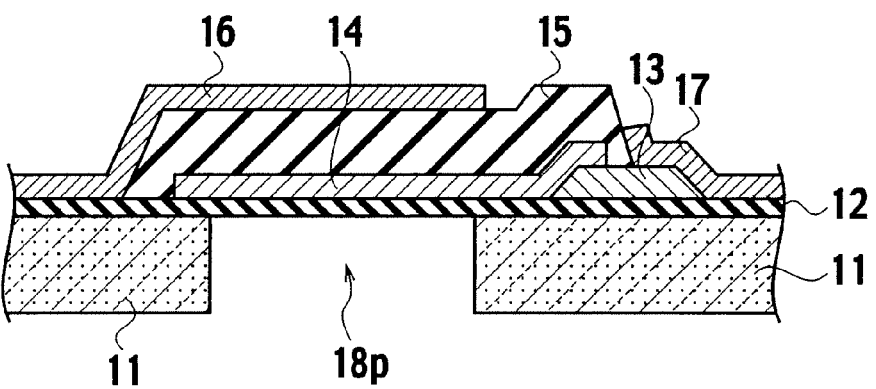
FIG. 2E is a still further subsequent process flow cross sectional view showing the intermediate product of the FBAR according to the first embodiment after the process stage shown in FIG. 2D.

(e) Afterwards, the thickness of the substrate 11 is adjusted to 100 to 300 nm, preferably to 150 to 250 nm. For instance, the thickness of the substrate 11 is adjusted up to 200 nm by polishing. Afterwards, an etching-mask is delineated on the bottom surface of the substrate 11 by photolithography. In a case using a Si substrate for the substrate 11, the substrate 11 is etched from the bottom surface by RIE method with fluoride based etching gas, so as to establish the cavity 18p as shown in FIG. 2E. Afterwards, the insulting film 12 which remains at the bottom of the cavity 18p, is removed using wet etching along with RIE method with fluoride based etching gas, so as to complete the sequence of formation processes, and the cross-sectional structure shown in FIG. 1B is achieved.

Modification of the First Embodiment

Figure 3:
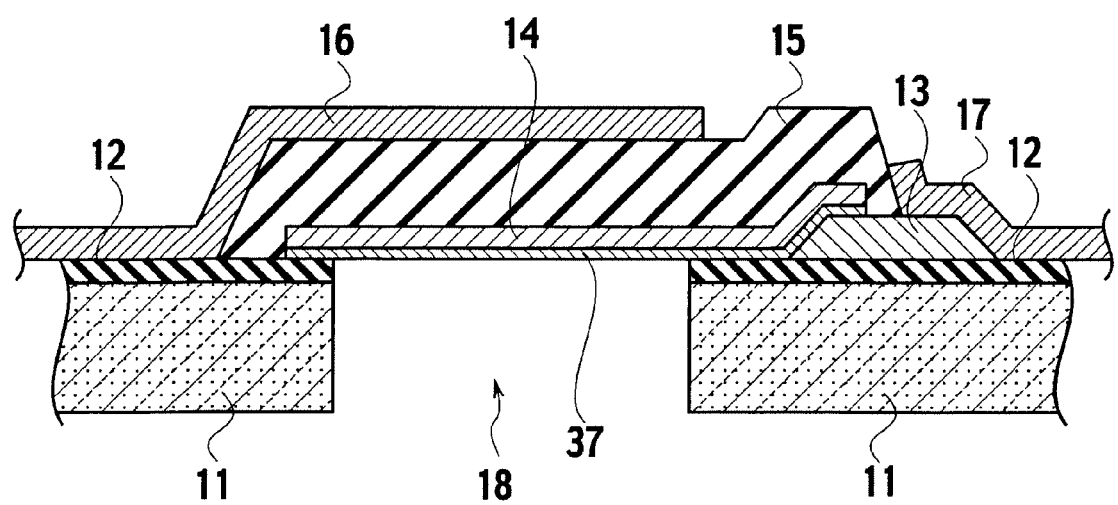
FIG. 3 is a schematic cross sectional view of the FBAR according to a modification of the first embodiment, corresponding to the cross-section taken on line IB-IB in FIG. 1A.

FIG. 3 shows a FBAR according to a modification of the first embodiment of the present invention. The FBAR shown in FIG. 3 is similar to the FBAR according to the first embodiment shown in FIG. 1 in that the FBAR according to the modification of the first embodiment includes a substrate 11, an insulating film 12 disposed on the substrate 11, a bottom electrode 14 and a metallic intermediate electrode 13 disposed on the insulating film 12, a piezoelectric layer 15 disposed on the bottom electrode 14 and the metallic intermediate electrode 13, a top electrode 16 disposed on the piezoelectric layer 15 and an bottom electrode wiring 17 electrically connected to the metallic intermediate electrode 13. In addition, the FBAR of the modification of the first embodiment includes an amorphous metallic film 37 under the bottom electrode 14. The amorphous metallic film 37 is contacted to the first main surface of the metallic intermediate electrode 13 through one of the slanted sidewalls. For materials of the amorphous metallic film 37, such materials as a Ta—Al alloy film and a $TiB_2$ film having a 5 to 100 nm film thickness, or preferably a 15 to 30 nm film thickness, can be used. Namely, when the amorphous metallic film 37 is disposed between the bottom electrode 14 and the insulating film 12, c-axis orientation of an AlN film disposed on the amorphous metallic film 37, is remarkably improved. Compared with a case in which the amorphous metallic film 37 is not inserted, the electromechanical coupling factor $k_t^2$ and the Q-value which affect greatly performances of the FBAR can be increased when the amorphous metallic film 37 is deposited. For instance, the Ta—Al alloy film can be deposited using Ta and Al target and argon gas, at a substrate temperature of room temperature by RF magnetron sputtering, etc. The Ta—Al alloy film can be selectively etched by RIE method with fluorine based etching gas, such as octafluorocyclobutane ($C_4F_8$).

Similar to the FIG. 1, a cross sectional view of the metallic intermediate electrode 13 of the FBAR according to the modification of the first embodiment is in a trapezoid configuration, a planar shape of the metallic intermediate electrode 13 is striped rectangle. One side of the bottom electrode 14 is disposed on the metallic intermediate electrode 13 and the bottom electrode 14 and the metallic intermediate electrode 13 are electrically connected. In addition, the FBAR according to the modification of the first embodiment includes a cavity 18, which is formed along a direction from the bottom surface of the substrate 11 to the top surface of the substrate 11 for exposing a bottom surface of the bottom electrode 14.

In the FBAR of the modification of the first embodiment, the amorphous metallic film 37 is disposed under the bottom electrode 14, so as to form a double-layer structure with the bottom electrode 14. For instance, when the bottom electrode 14 is formed of an Al film and the amorphous metallic film 37 is formed of a Ta—Al alloy film, since specific gravity of the Ta—Al alloy film is much larger than the specific gravity of the Al film, and the Ta—Al alloy film is heavier than the Al film, high frequency characteristic is deteriorated. Furthermore, the high frequency characteristic is deteriorated by the increase of the film thickness due to the employment of the double-layer structure. Therefore, high frequency characteristic is further improved by selectively etching the amorphous metallic film 37 at a portion where the bottom surface is exposed in the cavity 18.

Comparative Example of the First Embodiment

Figure 4:
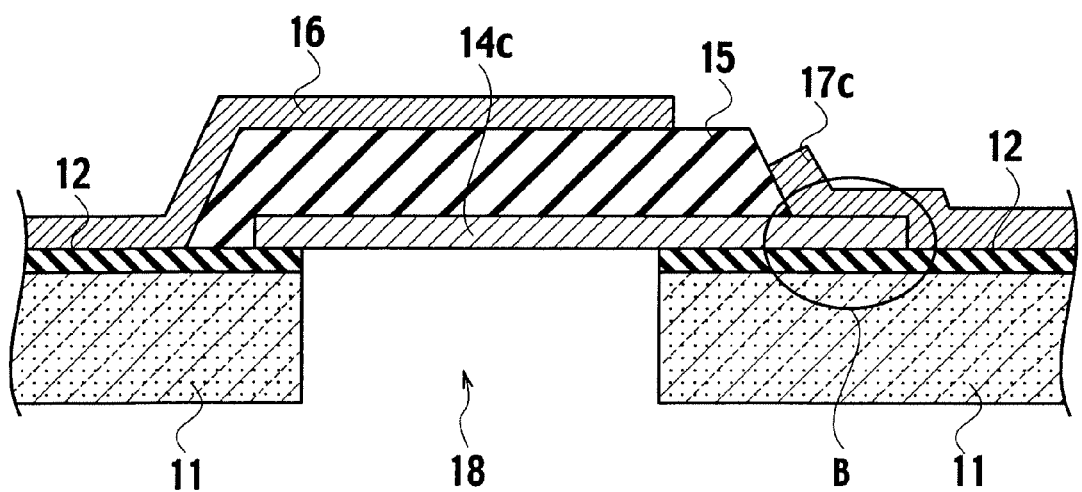
FIG. 4 is a schematic cross sectional view of the FBAR according to a comparative example of the first embodiment, corresponding to the cross-section taken on line IB-IB in FIG. 1A.

FIG. 4 shows a FBAR, which does not include the metallic intermediate electrode 13, and compares with the FBAR of the first embodiment. Namely, the FBAR according to a comparative example of the first embodiment encompasses a bottom electrode 14c formed of an Al film of 300 nm film thickness, a piezoelectric layer 15 formed of an AlN film of 2 μm film thickness stacked on the bottom electrode 14c, a top electrode 16 formed of an Al film of 300 nm film thickness stacked on the piezoelectric layer 15, and an bottom electrode wiring 17 formed of an Al film of 300 nm film thickness directly connected to the bottom electrode 14c.

In the FBAR of the comparative example of the first embodiment, disconnection of the bottom electrode 14 in an area represented by a circle labeled by B in FIG. 4, is caused by over-etching or after-corrosion. This disconnection occurs up to 40% of all the failures of the FBAR. And even if such disconnection does not occur, series resistance of the bottom electrode 14 increases by etching failure.

According to the investigation in which resonance characteristic of the FBAR of the comparative example of the first embodiment is examined by using a vector network analyzer, although the resonance frequency remains 2.0 GHz, the electromechanical coupling factor $k_t^2$ is 5.5%, the Q-value at the resonance frequency decreases to 150, and the Q-value at the anti-resonance frequency also decreases greatly to 100. And the series resistance of the bottom electrode 14c of the FBAR is determined as becoming over 15 Ω by a parameter fitting methodology.

With reference to FIGS. 5A-5E, a sequence of manufacturing processes of the FBAR according to the comparative example of the first embodiment is explained.

Figure 5A:
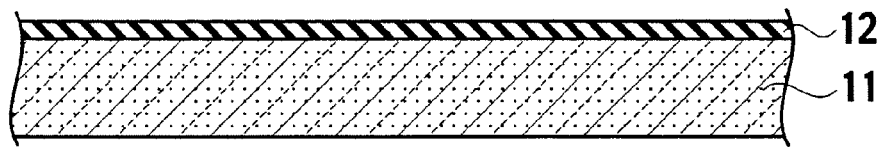
FIG. 5A is a process flow cross sectional view showing an intermediate product of the FBAR corresponding to a cross-sectional view taken on line IB-IB in FIG. 1A, explaining a manufacturing method of the FBAR according to a comparative example of the first embodiment.
Figure 5B:
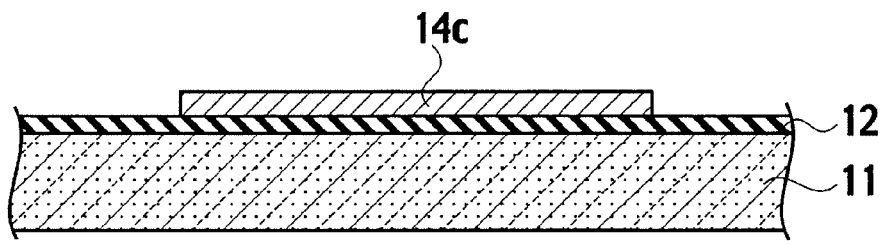
FIG. 5B is a subsequent process flow cross sectional view showing the intermediate product of the FBAR according to the comparative example of the first embodiment after the process stage shown in FIG. 5A.
Figure 5C:
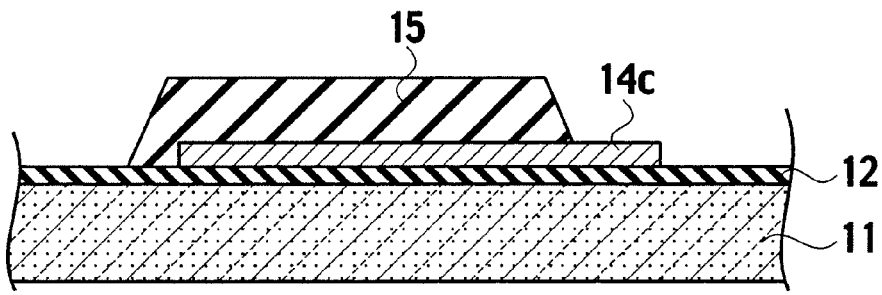
FIG. 5C is a subsequent process flow cross sectional view showing the intermediate product of the FBAR according to the comparative example of the first embodiment, after the process stage shown in FIG. 5B.
Figure 5D:
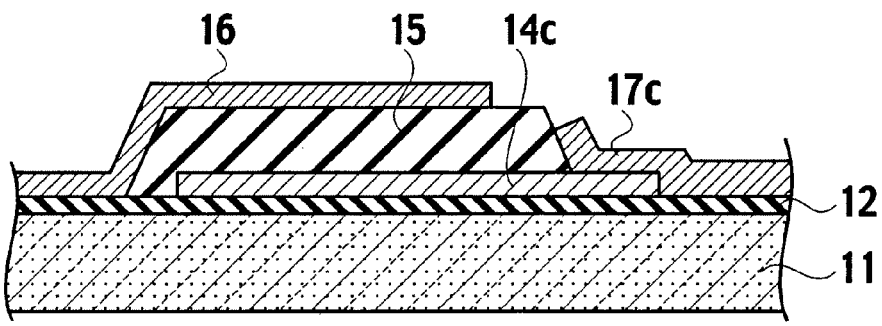
FIG. 5D is a further subsequent process flow cross sectional view showing the intermediate product of the FBAR according to the comparative example of the first embodiment after the process stage shown in FIG. 5C.
Figure 5E:
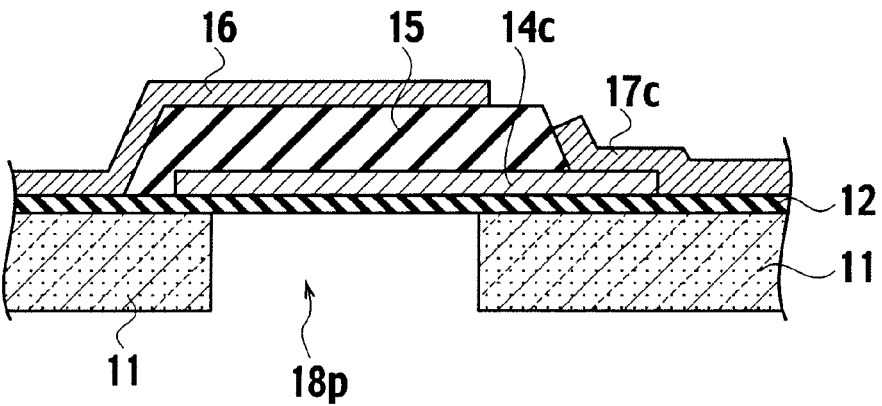
FIG. 5E is a still further subsequent process flow cross sectional view showing the intermediate product of the FBAR according to the comparative example of the first embodiment after the process stage shown in FIG. 5D.

First, as shown in FIG. 5A, on the Si (100) substrate 11 on which the insulating film 12 is formed by thermal oxidation methods, etc. an Al film of a 300 film thickness is formed by RF magnetron sputtering, etc. Afterwards, the metallic film is delineated by photolithography and accompanying RIE method with chloride based etching gas, so as to form a pattern of the bottom electrode 14c as shown in FIG. 5B. Afterwards, an AlN film for the piezoelectric layer 15 having a 2 μm film thickness, is deposited by RF magnetron sputtering method, etc, and a pattern of the piezoelectric layer 15 is delineated as shown in FIG. 5C by photolithography and accompanying RIE method with chloride based etching gas. In the process, the etching end point is monitored by plasma spectroscopy so that there is no interval between the instant at which the etching end point where the Al film is exposed on the bottom electrode 14c is detected, and the instant at which the etching is actually stopped, which prevents the bottom electrode 14c from over-etching. Subsequently, after depositing an Al film of a 300 nm film thickness, the Al film is delineated by photolithography and accompanying wet etching using a combination of nitric acid ($HNO_3$), acetic acid ($CH_3COOH$), phosphoric acid ($H_3PO_4$) so as to delineate the top electrode 16 and the bottom electrode wiring 17c as shown in FIG. 5D. Afterwards, the thickness of the Si substrate 11 is adjusted to 200 nm by polishing and a etching-mask is delineated on the bottom surface of the Si substrate 11 by photolithography and the substrate 11 is selectively etched from the bottom surface by RIE method with fluoride based etching gas, so as to establish the cavity 18p as shown in FIG. 5E. Afterwards, the insulting film 12 which remains at the bottom of the cavity 18p, is removed using wet etching by RIE method with fluoride based etching gas, thereby completing the sequence of formation processes of the FBAR of the comparative example of the first embodiment.

From the comparison between the manufacturing methods of the FBAR of the first embodiment and the FBAR of the comparative example shown in FIG. 5, according to the manufacturing method of the FBAR of the first embodiment, by establishing the metallic intermediate electrode 13 formed of such materials as W, Mo, Ru, Rh, Pd, Ir, Pt, the etching selectivity of the piezoelectric layer 15 over the bottom electrode 14 can be ensured to some extent. In other words, the metallic intermediate electrode 13 can serve as the etching stopper indirectly toward the bottom electrode 14 when the pattern of the piezoelectric layer 15 is delineated. Therefore, there is no possibility that the bottom electrode 14 becomes too thin by over-etching and is disconnected by after-corrosion. And because the structure provided with the metallic intermediate electrode 13 can prevent series resistance of the bottom electrode 14 from increasing over a designated value by etching failure, the FBAR of the first embodiment can achieve high frequency characteristic in frequency band up to GHz.

According to the manufacturing method of the FBAR of the first embodiment, because the metallic intermediate electrode 13 is formed of electrically-conductive materials which have a large etching selectivity over the piezoelectric layer 15, any material constraints for the bottom electrode 14 and an extra process margin for the film thickness of the bottom electrode 14 are not necessary. And, since the film thickness of the metallic intermediate electrode 13 has no relation with resonator characteristics directly, it is possible to increase the film thickness of the metallic intermediate electrode 13. Furthermore, a range of selecting materials for the bottom electrode 13, in view of resistivity and etching selectivity, etc., can be expanded. Further a margin for instabilities of processes such as fluctuation of the processing condition also extends. Therefore, a large technical advantage in the manufacturing of the FBAR is achieved by the employment of the metallic intermediate electrode 13.

[Micro Mechanical Filter]

Figure 6:
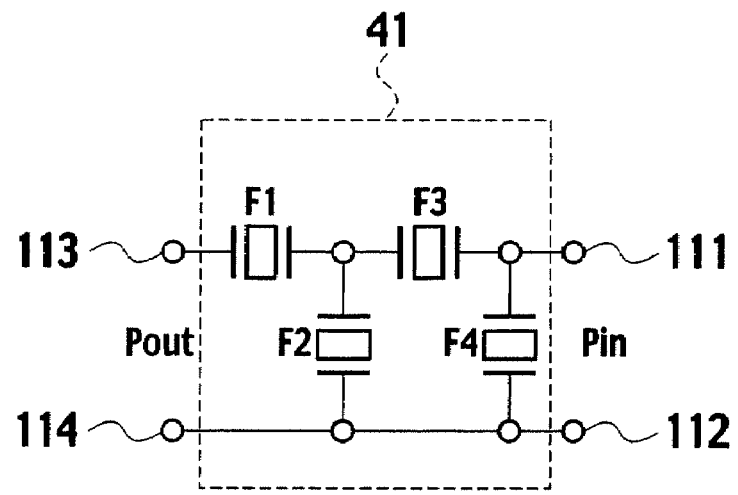
FIG. 6 is a schematic circuit diagram illustrating an example of a micro mechanical filter implemented by a plurality of FBARs of the first embodiment of the present invention.

FIG. 6 shows an example of a micro mechanical filter implemented by a plurality of FBARs of the first embodiment. A ladder-type filter 41 shown in FIG. 6 is arranged so that four FBARs of $F_1$, $F_2$, $F_3$, $F_4$ are connected in series and in parallel to each other. With regard to a configuration of the ladder-type filter 41 shown in FIG. 6, when the ladder-type filter 41 is actually manufactured, various topologies can be considered. For instance, the ladder-type filter 41 can be monolithically integrated in an identical substrate. An input port $P_{in}$ shown in FIG. 6 has two terminals 111 and 112 and an upper input terminal 111 of the input port $P_{in}$ is connected to the top electrode 16 of the $F_4$ and the lower input terminal 112 of the input port $P_{in}$ is connected to the bottom electrode wiring 17 of the $F_4$. By the configuration, the top electrode 16 of the $F_4$ is connected to the top electrode 16 of the $F_3$, and the bottom electrode wiring 17 of the $F_3$ is connected to the top electrode 16 of the $F_1$, and the top electrode 16 of the $F_2$ respectively.

[Voltage-Controlled Oscillator]

Figure 7:
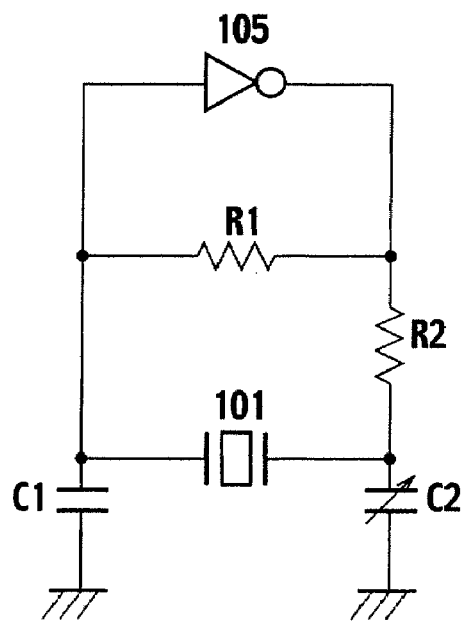
FIG. 7 is a schematic circuit diagram illustrating an example of a voltage-controlled oscillator (VCO) implemented by the FBAR of the first embodiment of the present invention.

Also the FBAR of the first embodiment can be employed in a voltage-controlled oscillator (VCO) of mobile communication devices by a combination of a variable capacitance C2 and an amplifier 105 as shown in FIG. 7. Namely, in FIG. 7, the top electrode 16 of a FBAR 101 is connected to the variable capacitance C2, and the bottom electrode wiring 17 of the FBAR 101 is connected to a fixed capacitance C1, and further the top electrode 16 of the FBAR 101 is connected to one terminal of a resistance R2. Between the other terminal of the resistance R2 and the bottom electrode wiring 17 of the FBAR 101, a parallel circuit implemented by the amplifier 105 and a feedback resistance R1 is connected. To an input terminal of the amplifier 105, signal from an output terminal of the amplifier 105 is positively feedbacked by the feedback resistance R1 so that the signal can oscillate at the resonant frequency of the FBAR 101. The variable capacitance C2 can be formed of a variable capacitance diode ("vari-cap") so as to adjust oscillating frequency. The variable capacitance C2, the fixed capacitance C1, the FBAR 101, the resistance R2, the feedback resistance R1 and the amplifier 105 may be integrated monolithically in an identical substrate, or alternatively can be integrated in a hybrid configuration.

[Transceiver]

Figure 8:
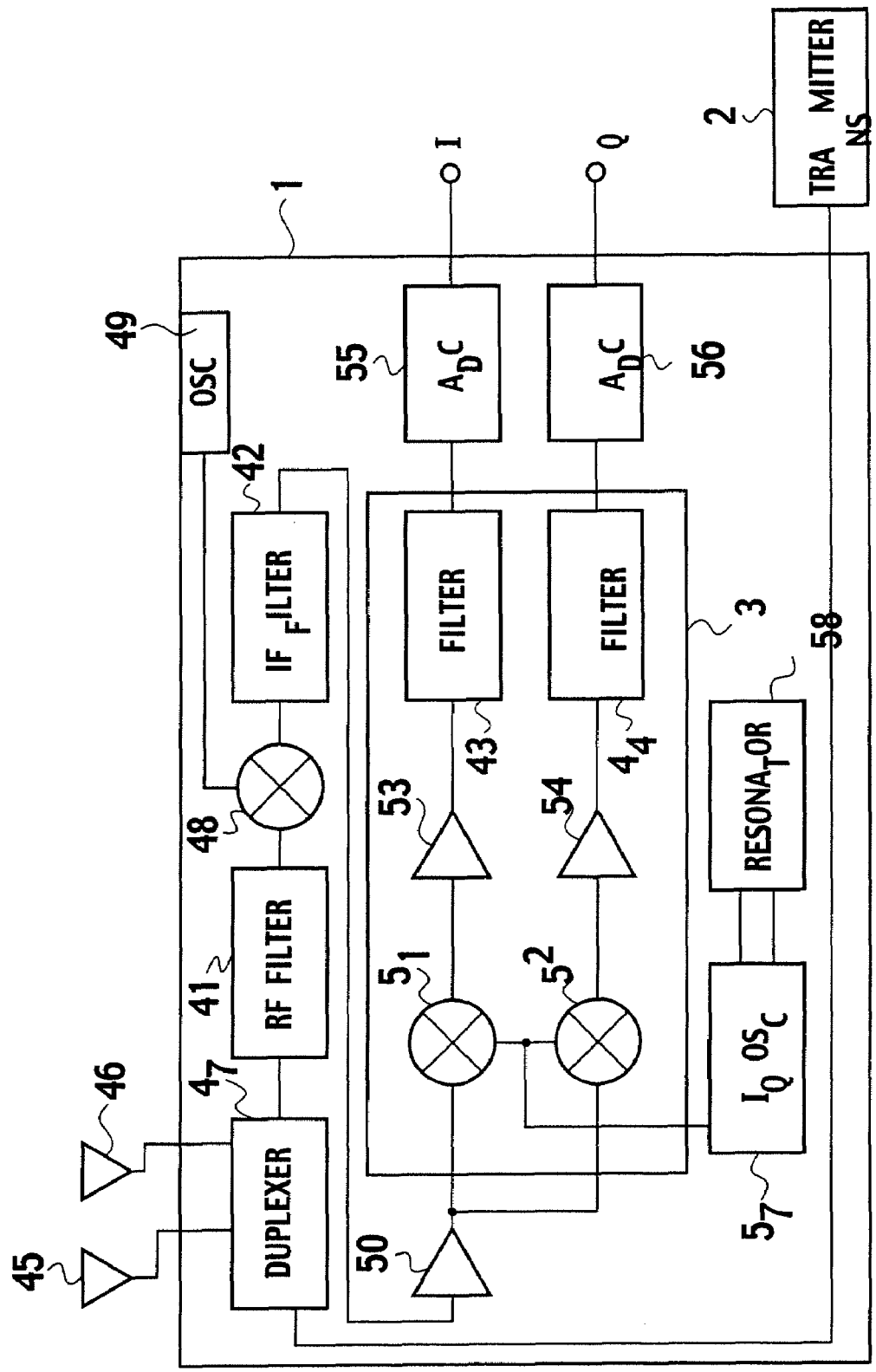
FIG. 8 is a schematic circuit diagram illustrating an example of a receiver circuit of a portable transceiver implemented by a plurality of FBARs of the first embodiment of the present invention.

FIG. 8 shows a receiver circuit 1 of a portable transceiver, which encompasses a plurality of micro mechanical filters shown in FIG. 6 so as to implement a radio-frequency (RF) filter 41 and an intermediate-frequency (IF) filter 42. The receiver circuit 1 of the portable transceiver shown in FIG. 8 includes the RF filter 41 implemented by the micro mechanical filters of FIG. 6, a mixer 48 connected with the RF filter 41 and a local oscillator 49 connected with the mixer 48, as a RF front-end unit. The mixer 48 mixes RF signal delivered from the RF filter 41, with RF signal delivered from the local oscillator 49, so as to generate, for example, the IF signal ranging form 200 MHz to 500 MHz. The RF filter 41 is connected to a first antenna 45 and a second antenna 46 through a duplexer (an antenna switch) 47. Although in FIG. 8, two antennas of the first antenna 45 and the second antenna 46 are connected, the number of the antenna is not limited to two.

The RF signal received at the first antenna 45 and the second antenna 46 and the RF signal delivered from the local oscillator 49, are mixed in the mixer 48 and the mixed signal is transmitted to the IF filter 42 which is implemented by the micro mechanical filters of FIG. 6. The IF filter 42 is connected to an amplifier 50, and the amplifier 50 is further connected to a receiver LSI chip 3, in which an in-phase (I)/quadrature-phase (Q) demodulation circuit is merged. The receiver LSI chip 3 is connected to an IQ oscillator 57, which is connected to a resonator 58. Through the IF filter 42, difference-frequency between the frequency of the RF signal received at the first antenna 45 and/or the second antenna 46, and the frequency of the RF signal delivered from the local oscillator 49, is extracted so as to be converted into the IF signal. And the IF signal, or the difference-frequency, is amplified and stabilized by the amplifier 50. The IF signal is I/Q modulated by the receiver LSI chip 3 to I-signal and Q-signal, which are 90 degrees apart in phase. And lower frequencies, such as base-band I-signal and base-band Q-signal of 10MHz or less, are processed respectively in a mixer 51 and in a mixer 52, which are merged in the receiver LSI chip 3. The base-band I-signal and the base-band Q-signal are amplified respectively by an amplifier 53 and by an amplifier 54 and are transmitted to a base-band filter 43 and a base-band filter 44. Further, the base-band I-signal and the base-band Q-signal which go through the base-band filter 43 and the base-band filter 44, are converted into digital signals by an analog-to-digital (A/D) converter 55 and an A/D converter 56, and are further delivered to a digital base-band processor (DBBP), the illustration of which is omitted. Namely, the base-band I signal which is extracted through the base-band filter 43 is converted to the digital base-band I signal by the A/D converter 55 and is processed by the DBBP. Similarly, the base-band Q signal which is extracted through the base-band filter 44 is converted to the digital base-band Q signal by the A/D converter 56 so as to be processed by the DBBP.

Figure 9:
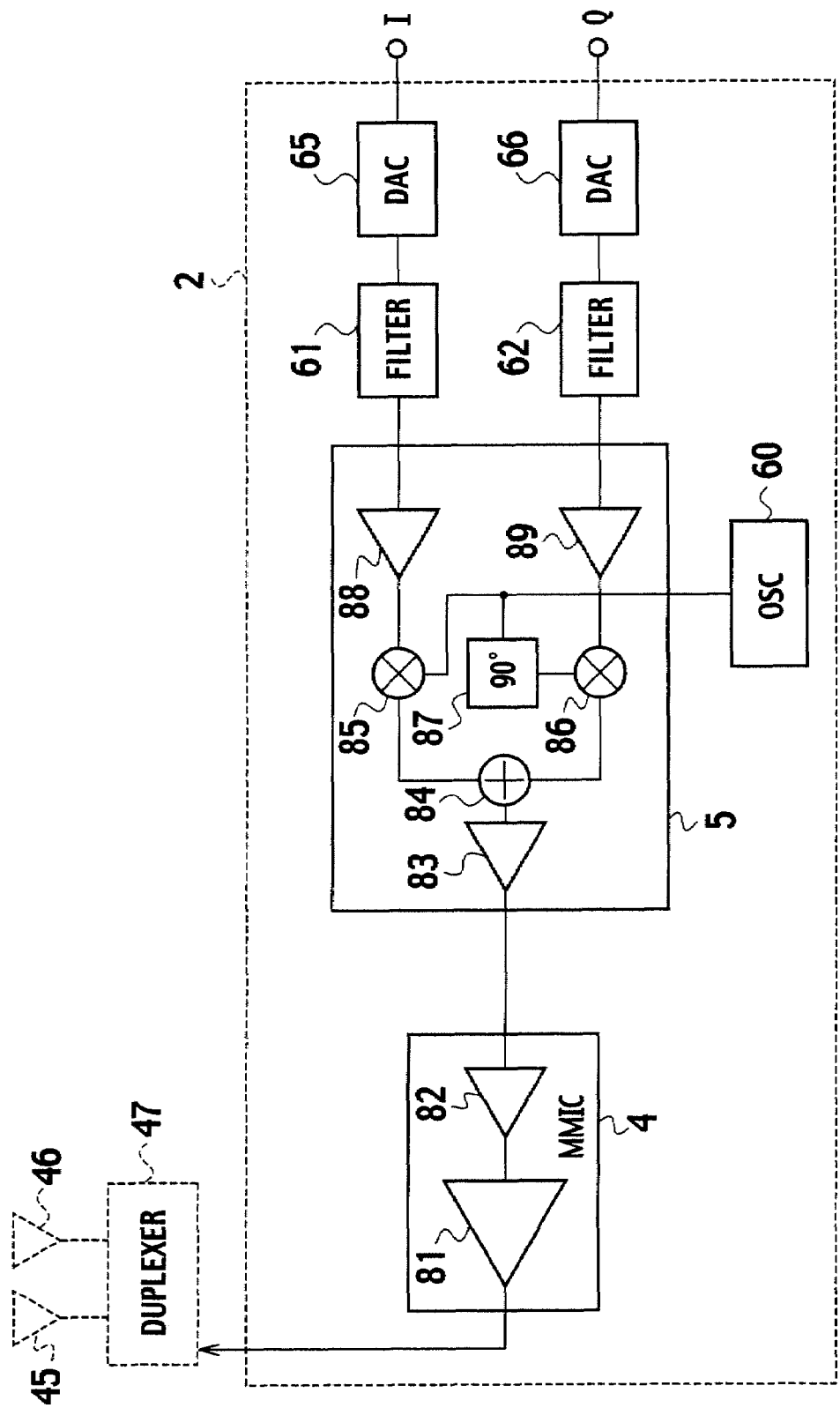
FIG. 9 is a schematic circuit diagram illustrating an example of a transmitter circuit of a portable transceiver implemented by a plurality of FBARs of the first embodiment of the present invention.

FIG. 9 shows a transmitter circuit 2 of the portable transceiver. In the base-band processing unit of the transmitter circuit 2, a digital-to-analog (D/A) converter 65 and a D/A converter 66, which convert digital signal of the base-band I-signal and digital signal of the base-band Q-signal from the DBBP into analog signal, are provided. By the D/A converter 65 and the D/A converter 66, the digital base-band I-signal and the digital base-band Q-signal are converted to the analog base-band I-signal and the analog base-band Q-signal, and are delivered to an amplifier 88 and an amplifier 89 of a modulator LSI chip 5 through a base-band filter 61 and a base-band filter 62.

The modulator LSI chip 5 encompasses the amplifiers 88, 89 and mixers 85, 86 which are connected to the amplifiers 88, 89. In addition, the modulator LSI chip 5 encompasses an oscillator 60 and a phase shifter 87. To the mixer 85 and the mixer 86, carrier wave of RF frequency from the oscillator 60 is supplied, each phase of the RF frequency is shifted to 90 degrees by the phase shifter 87. Output of the amplifiers 88, 89 is mixed with the carrier wave of the RF frequency from the oscillator 60, and is modulated at the mixers 85, 86. The modulator LSI chip 5 also encompasses an amplifier 83, which is connected to an output terminal of the adder 84. Output of the mixer 85 and the mixer 86 is delivered to the adder 84, and output of the adder 84 is delivered to the amplifier 83. And output of the amplifier 83 is supplied to MMIC 4, which implements the RF front-end unit of the transmitter circuit 2. The MMIC 4 encompasses a power microwave transistor 81 and a power microwave transistor 82 connected in series so as to implement a multi-stage amplification. Output of the MMIC 4 is supplied to the first antenna 45 and the second antenna 46 through the duplexer (antenna switch) 47, after amplification at RF frequency by the power microwave transistors 81, 82.

In the portable transceiver shown in FIG. 8 and FIG. 9, since miniaturized micro mechanical filters are used for the RF filter 41 and the IF filter 42 instead of a LC circuit using a cavity resonator and an inductor, a portable transceiver which is miniaturized to a small and thin shape and operates in a microwave band of about 1 to 5 GHz with a low power consumption, can be achieved. Of course, although the FBARs can implement such filters operating at a low frequency band as the base-band filters 43, 44 of FIG. 8, or alternatively the base-band filters 61, 62 of FIG. 9, etc., it is preferable to use the FBARs in a microwave band over 300 MHz, especially in a microwave band about 1 to 5 GHz in view of excellent high-frequency characteristics of the micro mechanical filter shown in FIG. 6.

Second Embodiment

Figure 10:
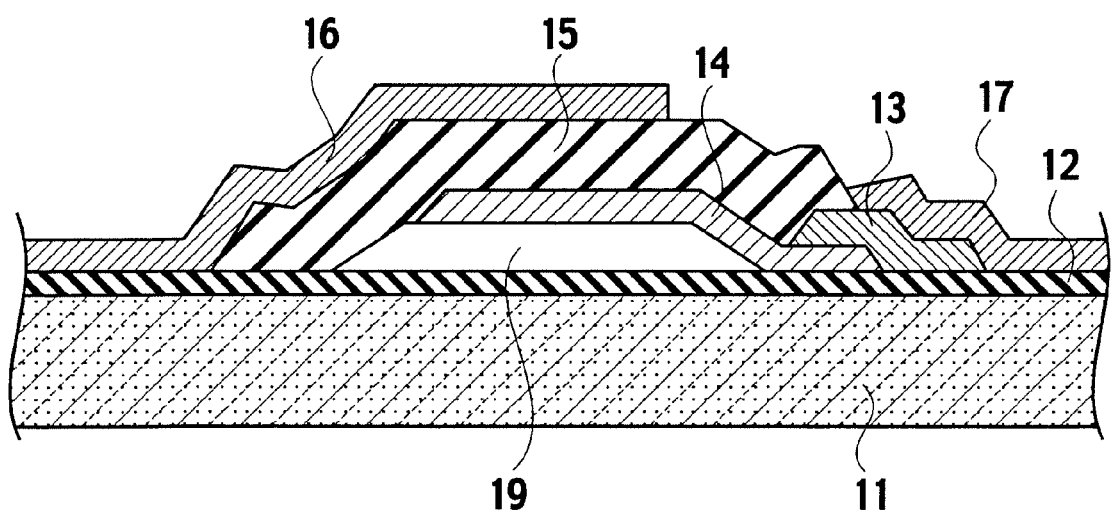
FIG. 10 is a schematic cross sectional view of the FBAR according to a second embodiment, corresponding to the cross-sectional view taken on line IB-IB in FIG. 1A.

As shown in FIG. 10, a FBAR according to a second embodiment of the present invention includes a substrate 11, an insulating film 12 formed on the substrate 11, a bottom electrode 14, one side of which is fixed to the substrate 11 through the insulating film 12 and the other side of which is mechanically suspended above the insulating film 12 through a trapezoidal cavity 19, a metallic intermediate electrode 13, part of which is disposed on one end of the bottom electrode 14 so as to be electrically connected to the bottom electrode 14, a piezoelectric layer 15 disposed on the bottom electrode 14 and part of the metallic intermediate electrode 13, a top electrode 16 delineated on the piezoelectric layer 15 and a bottom electrode wiring 17 connected to the metallic intermediate electrode 13. FIG. 10 shows a cross-sectional view of the FBAR of the second embodiment. Since a planar pattern of the FBAR is similar to FIG. 1A, the illustration is omitted, the piezoelectric layer 15 covers the entire surface of the bottom electrode 14 in the inside of the contour of the piezoelectric layer 15, defining the shape of the piezoelectric layer 15 in a plan view. And similar to the plan view shown in FIG. 1A, the contour of the piezoelectric layer 15 crosses a top surface of the metallic intermediate electrode 13 and part of the metallic intermediate electrode 13 extends to an outside of the contour of the piezoelectric layer 15, from a contour of the piezoelectric layer 15.

As shown in FIG. 10, the trapezoidal cavity 19 is disposed above a top surface of the substrate 11. The trapezoidal cavity 19 is a closed cavity, which is defined by a bottom surface of the bottom electrode 14, a slanting plane of the bottom surface of the bottom electrode 14, a top surface of the insulating film 12 and the other slanting plane forming part of the bottom surface (belly) of the piezoelectric layer 15. In other words, the part of the bottom surface (belly) of the piezoelectric layer 15 is exposed in the trapezoidal cavity 19, at a vicinity of one of the slanting planes of the trapezoidal cavity 19, and part of the piezoelectric layer 15 is suspended above the trapezoidal cavity 19.

As shown in FIG. 10, part of the metallic intermediate electrode 13 clamber over an end of the bottom electrode 14 so as to establish a level difference due to a thickness of the bottom electrode. Then, a cross-sectional view of the metallic intermediate electrode 13 is shaped like the letter Z, shapes of the both sidewall faces of the metallic intermediate electrode 13 are tapered, similar to the configuration shown in FIG. 1. Similar to the FBAR of the first embodiment, 45 degrees or less is preferable for a taper angle in the slanted sidewall of the metallic intermediate electrode 13 and 30 degrees or less is more suitable for the taper angle. Although theoretically, the taper angle in the slanted sidewall of the metallic intermediate electrode 13 can be set below ten degrees, the occupation area by the metallic intermediate electrode 13 relatively increases and area efficiency decreases. A planar shape of the intermediate 13 is a rectangle in a striped configuration similar to FIG. 1A.

The FBAR of the second embodiment shown in FIG. 10 is different from the FBAR of the first embodiment in that the bottom electrode 14 and the metallic intermediate electrode 13 are electrically connected by such a configuration that one side of the bottom electrode 14 creeps into the intermediate 13. However, the FBAR of the second embodiment shown in FIG. 10 is similar to the FBAR of the first embodiment in that resonance frequency can be determined by adjusting the film thicknesses of the piezoelectric layer 15 and the bottom electrode 14, through utilizing a longitudinal vibration mode along the thickness direction of the piezoelectric layer 15. Also since the metallic intermediate electrode 13 of the FBAR according to the second embodiment may have the bcc lattice structure of <110> orientation, the fcc lattice structure of <111> orientation, or alternatively the hcp lattice structure of <0001> orientation, the metallic intermediate electrode 13 has a specific orientation which facilitates the matching with <0001> orientation of hexagonal crystal having a wurtzite lattice structure. Therefore, when AlN, or alternatively ZnO having the wurtzite lattice structure is employed to implement the piezoelectric layer 15, the orientation of the piezoelectric layer 15 is easy to be oriented uniformly along the c-axis, namely along the <0001> orientation. By controlling a polarization direction (orientation) of the piezoelectric layer 15 to the c-axis, an electromechanical coupling factor $k_t^2$ and a Q-value are easy to be ensured. Therefore, similar to the FBAR of the first embodiment, for material of the metallic intermediate electrode 13 of the FBAR according to the second embodiment, a metallic film, which includes at least one of the metals selected from a group consisting of Ta, Mo, W, Ni, Co, Cr, Cu, Ti, Ir, Ru and Pt, is preferable. Other structure and materials are similar to the structure and materials already explained in the first embodiment, and overlapping or redundant description may be omitted in the second embodiment.

For instance, the FBAR encompassing the metallic intermediate electrode 13 formed of Ir film with a 500 nm film thickness, the bottom electrode 14 formed of Al film with a 300 nm film thickness, the piezoelectric layer 15 formed of AlN film with a 2 µm film thickness, the top electrode 16 formed of Al film with a 300 nm film thickness and the bottom electrode wiring 17 formed of Al film with a 300 nm film thickness shows excellent resonance characteristics such that the resonance frequency is 2.0 GHz, the electromechanical coupling factor $k_r^2$ is 6.2%, the Q-value at the resonance frequency is 600, and the Q-value at the anti-resonance frequency is 550, according to an evaluation by a measurement using a vector network analyzer.

With reference to FIGS. 11A-11D, a sequence of manufacturing processes of the FBAR according to the second embodiment is explained. Note that the FBAR of the second embodiment can be manufactured by various manufacturing methods including a modification of the second embodiment, other than the sequence of manufacturing processes disclosed by the following example.

Figure 11A:
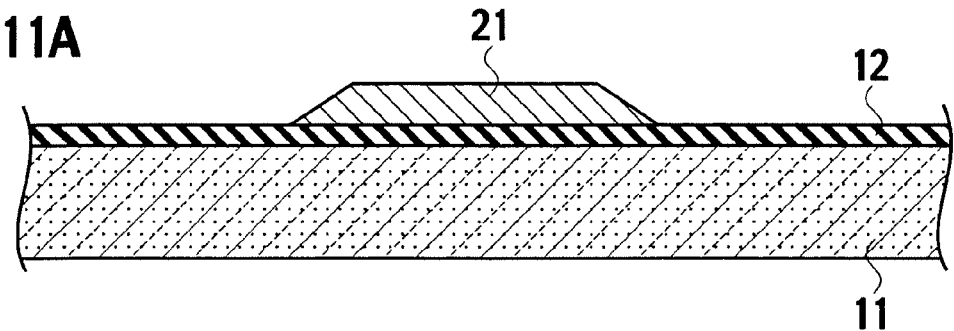
FIG. 11A is a process flow cross sectional view showing an intermediate product of the FBAR taken on line IB-IB in FIG. 10, explaining a manufacturing method of the FBAR according to the second embodiment.

(a) First, as shown in FIG. 11A, on the Si (100) substrate 11 on which an insulating film 12 is formed by thermal oxidation methods, etc., a Mo film having a 0.5 to 2 µm film thickness, or preferably a 0.8 to 1.5 µm film thickness, for instance, a Mo film with a 1 µm film thickness is deposited using RF magnetron sputtering, etc. And the Mo film is delineated by photolithography and accompanying CDE method with fluoride based etching gas, so as to form a pattern of a Mo sacrificial layer 21. A planar shape of the Mo sacrificial layer 21 is a rectangular pattern in which a branch member of striped configuration is established so that the branch member of striped configuration is orthogonal to one of the sides of the rectangular pattern, although the plan view is omitted. More than two branch members may be established to the rectangular pattern.

Figure 11B:
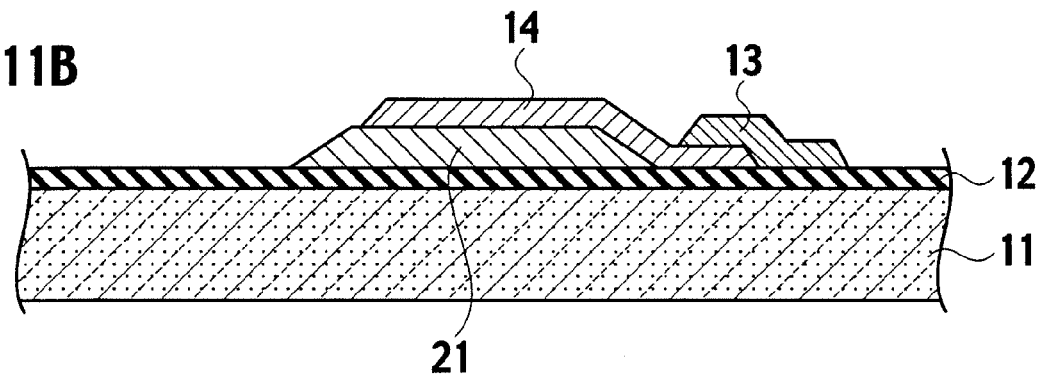
FIG. 11B is a subsequent process flow cross sectional view showing the intermediate product of the FBAR according to the second embodiment after the process stage shown in FIG. 11A.

(b) Next, on the sacrificial layer 21, an Al film, having a 150 to 600 nm film thickness, or preferably a 250 to 350 nm film thickness, is deposited as a piezoelectric dielectric film (mother material film) using RF magnetron sputtering, etc. And the Al film is delineated by photolithography and RIE method using chloride based etching gas, so as to form a bottom electrode 14. Furthermore, a lift-off pattern of photoresist film is delineated by photolithography and an Ir film having a 200 to 800 nm film thickness, or preferably a 400 to 600 nm film thickness is deposited on the lift-off pattern by RF magnetron sputtering. And the Ir film is delineated by "lift-off process" through submerging the substrate 11 in N-methyl-2-pyrrolidone (NMP) solution for sixty minutes, so as to remove the lift-off pattern of photoresist and to form a pattern of the metallic intermediate electrode 13 formed of the Ir film as shown in FIG. 11B.

Figure 11C:
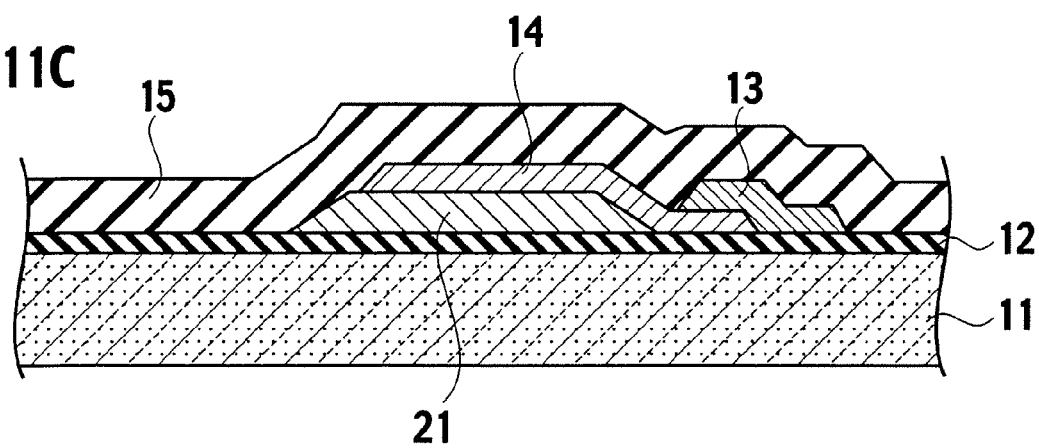
FIG. 11C is a subsequent process flow cross sectional view showing the intermediate product of the FBAR according to the second embodiment, after the process stage shown in FIG. 11B.

(c) Afterwards, as shown in FIG. 11C, on the bottom electrode 14 and on the metallic intermediate electrode 13, an AlN film, having a 0.5 to 3 µm film thickness, is stacked using RF magnetron sputtering, etc. In a case in which the resonance frequency is designated at about 2.0 GHz, the film thickness of the AlN film may be set at about 2 µm. And the AlN film is delineated by photolithography and accompanying RIE method with chloride based etching gas, so as to form a pattern of the piezoelectric layer 15. The AlN film is delineated such that one of the sidewall faces of the piezoelectric layer 15 may be located on the metallic intermediate electrode 13, and part of the metallic intermediate electrode 13 comes to show up from the contour of the piezoelectric layer 15. Further, in the plan view of FIG. 1, the branch member of striped configuration which is established at one of the sides of the rectangular pattern of the sacrificial layer 21, comes to show up from the contour of the piezoelectric layer 15. The AlN film may be selectively etched by RIE method with chloride based etching gas, in a case using a Mo film for the metallic intermediate electrode 13, which serves indirectly as an etching stopper layer over the bottom electrode 14. If the metallic intermediate electrode 13 is formed of such electrically-conductive materials as W, Mo, Ru, Rh, Pd, Ir and Pt, other than Ir, the etching selectivity of the piezoelectric dielectric film (mother material film) for the piezoelectric layer 15 over the metallic intermediate electrode 13 can be increased and the metallic intermediate electrode 13 serves as the etching stopper layer when the piezoelectric layer 15 is delineated.

Figure 11D:
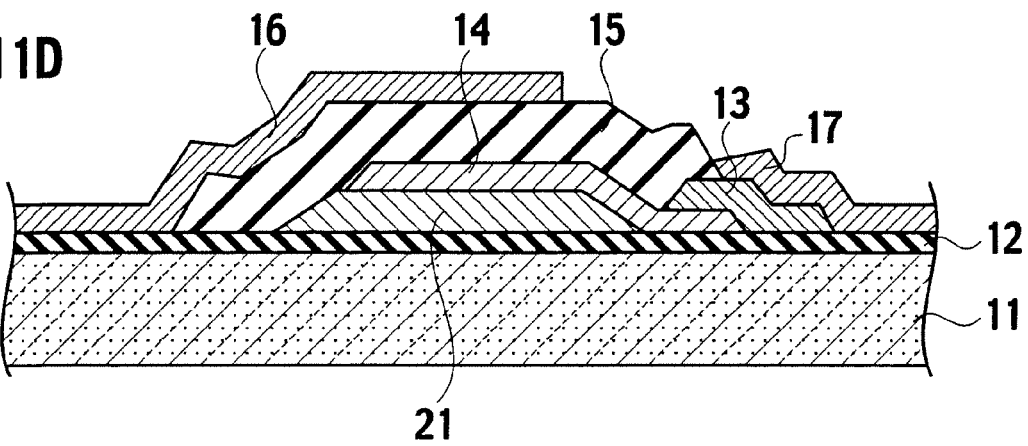
FIG. 11D is a further subsequent process flow cross sectional view showing the intermediate product of the FBAR according to the second embodiment after the process stage shown in FIG. 11C.

(d) Subsequently, an Al film having a 150 to 600 nm film thickness, or preferably a 250 to 350 nm film thickness, is deposited so that the Al film can cover entire surfaces of the piezoelectric layer 15, the metallic intermediate electrode 13 laid bare from the contour of the piezoelectric layer 15, and the insulting film 12. Afterwards the Al film is delineated by photolithography and accompanying wet etching using such solutions as potassium hydroxide (KOH), tetra methyl ammonium hydroxide (TMAH), so as to form the top electrode 16 and the bottom electrode wiring 17 as shown in FIG. 11D.

(e) Next, the branch member of striped configuration in the rectangular pattern of the sacrificial layer 21, being laid bare from the contour of the piezoelectric layer 15, is etched by submerging the substrate 11 in hydrogen peroxide ($H_2O_2$) solution, the temperature of which is set at 50 degrees C. As etching of the branch member in the striped configuration proceeds, a conduit of the etching solution to the Mo sacrificial layer 21, which is buried in the bottom surface (belly) of the piezoelectric layer 15, is formed. And the Mo sacrificial layer 21 is etched through the conduit of the etching solution, so as to form the trapezoidal cavity 19 shown in FIG. 10. After the etching by using the $H_2O_2$ solution, rinsed by isopropyl alcohol and dried, the cross-sectional structure shown in FIG. 11D is completed.

According to the manufacturing method of the FBAR of the second embodiment, by establishing the metallic intermediate electrode 13 formed of such materials as W, Mo, Ru, Rh, Pd, Ir, Pt, the etching selectivity of the piezoelectric layer 15 over the bottom electrode 14 can be ensured to some extent. In other words, the metallic intermediate electrode 13 can serve as the etching stopper indirectly toward the bottom electrode 14 when the pattern of the piezoelectric layer 15 is delineated. Therefore, there is no possibility that the bottom electrode 14 becomes too thin by over-etching and is disconnected by after-corrosion. And, because the metallic intermediate electrode 13 can prevent increase of the series resistance of the bottom electrode 14 over a designated value by etching failure, an excellent high frequency characteristic in frequency band up to GHz can be achieved.

According to the manufacturing method of the FBAR of the second embodiment, the metallic intermediate electrode 13 is so formed that the metallic intermediate electrode 13 is formed of electrically-conductive materials which have the large etching selectivity over the piezoelectric layer 15, any material constraints for the bottom electrode 14 and process margins for the film thickness of the bottom electrode 14 are not necessary. And, since the film thickness of the metallic intermediate electrode 13 has no relation with resonator characteristics directly, it is possible to increase the film thickness of the metallic intermediate electrode 13. Furthermore, a range of selecting materials for the bottom electrode 13, in view of resistivity and etching selectivity, etc., can be expanded. Further a margin for instabilities of processes such as fluctuation of the processing condition also extends. Therefore, a large technical advantage in the manufacturing of the FBAR is achieved by the employment of the metallic intermediate electrode 13.

Note that before the process of depositing the Al film of FIG. 11B, it is preferable to deposit an amorphous metallic film formed of such materials as a Ta—Al alloy film and a $TiB_2$ film having a 5 to 100 nm film thickness, or preferably a 15 to 30 nm film thickness, so that the amorphous metallic film may cover the entire surface of the sacrificial layer 21. Namely, when the amorphous metallic film is deposited between the bottom electrode 14 and the sacrificial layer 21, the c-axis orientation of the AlN film, which deposits on the amorphous metallic film, is remarkably improved. Compared with a case in which the amorphous metallic film is not established, the electromechanical coupling factor $k_t^2$ and the Q-value which affect greatly performances of the FBAR can increase when the amorphous metallic film 37 is deposited. And as mentioned in the modification of the first embodiment, high frequency characteristic is further improved by selectively etching the amorphous metallic film, which exposes at the bottom face of the cavity 18.

The FBARs according to the second embodiment can implement the ladder-type filter 41 shown in FIG. 6 and the VCO of mobile communication devices shown in FIG. 7 as mentioned in the first embodiment. Also the FBAR of the second embodiment can be employed in the portable transceiver shown in FIG. 8 and FIG. 9, so as to implement the micro mechanical filters for the RF filter 41 and the IF filter 42.

Third Embodiment

Figure 12:
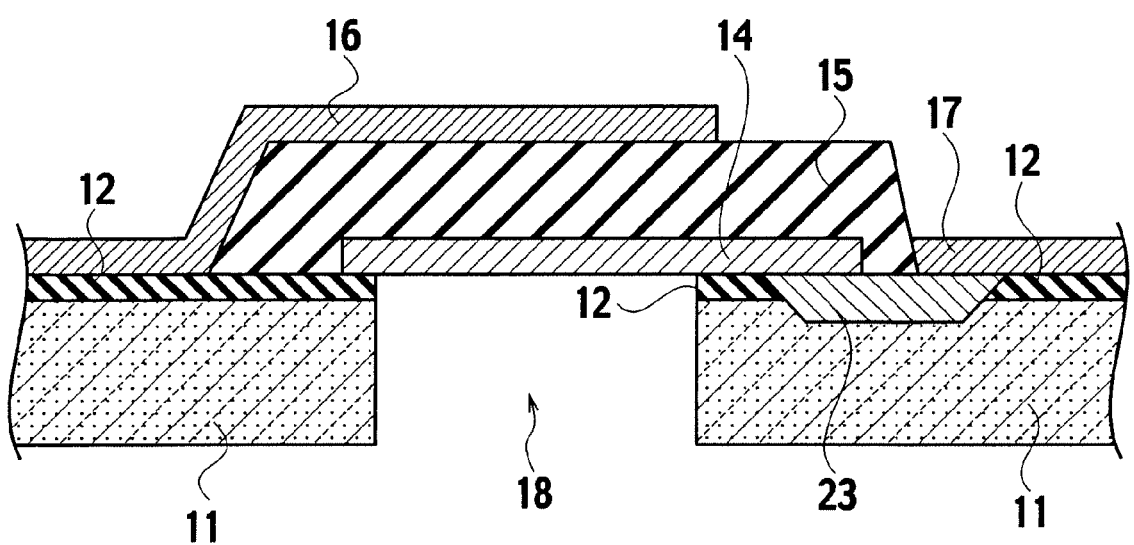
FIG. 12 is a schematic cross sectional view of the FBAR according to a third embodiment, corresponding to the cross-sectional view taken on line IB-IB in FIG. 1A.

As shown in FIG. 12, a FBAR according to a third embodiment of the present invention includes a substrate 11, an insulating film 12 formed on the substrate 11, an intermediate electrode 23 located such that the intermediate electrode 23 penetrates through the insulating film 12 and is buried into the substrate 11 with a bathtub-shaped (reverse trapezoid) or a U-groove configuration, a bottom electrode 14 disposed on the insulating film 12 and on the intermediate electrode 23, a piezoelectric layer 15 disposed on the bottom electrode 14 and on the intermediate electrode 23, a top electrode 16 delineated on the piezoelectric layer 15 and a bottom electrode wiring 17 connected to the intermediate electrode 23. FIG. 12 shows a cross-sectional view of the FBAR of the third embodiment. Since a planar pattern of the FBAR is similar to FIG. 1A, the illustration is omitted, the piezoelectric layer 15 covers the entire surface of the bottom electrode 14 in the inside of the area defined by the contour of the piezoelectric layer 15 in a plan view. And similar to the plan view shown in FIG. 1A, the contour of the piezoelectric layer 15 crosses a top surface of the intermediate electrode 23 and part of the intermediate electrode 23 extends to an outside of the contour of the piezoelectric layer 15, from a contour of the piezoelectric layer 15.

A planar shape of the intermediate electrode 23 is a rectangle in a striped configuration similar to FIG. 1A. One side of the bottom electrode 14 is disposed on the metallic intermediate electrode 13 and the bottom electrode 14 and the intermediate electrode 23 are electrically connected. In addition, the FBAR according to the third embodiment includes a cavity 18, which is formed along a direction from the bottom surface of the substrate 11 to the top surface of the substrate 11 for exposing a bottom surface of the bottom electrode 14. Therefore, part of the bottom electrode 14 is mechanically suspended above a cavity 18 and another part of which is mechanically fixed to the substrate 11. In the FBAR shown in FIG. 12, resonance frequency can be determined by adjusting the film thickness of the piezoelectric layer 15 and the bottom electrode 14, since the FBAR utilizes a longitudinal vibration mode along the thickness direction of the piezoelectric layer 15.

Similar to the FBARs of the first and second embodiments, since the intermediate electrode 23 of the FBAR according to the third embodiment may have the bcc lattice structure of <110> orientation, the fcc lattice structure of <111> orientation, or alternatively the hcp lattice structure of <0001> orientation, by designating the orientation of the intermediate electrode 23 to be a specific orientation which facilitates the matching with <0001> orientation of hexagonal crystal having a wurtzite lattice structure, the orientation of the piezoelectric layer 15 is easy to be oriented uniformly along the c-axis, namely along the orientation <0001> orientation. Therefore, by controlling a polarization direction (orientation) of the piezoelectric layer 15 to the c-axis, a high electromechanical coupling factor $k_t^2$ and a high Q-value are easy to be ensured. Therefore, similar to the FBARs of the first and second embodiments, for material of the intermediate electrode 23 of the FBAR according to the third embodiment, a metallic film, which includes at least one of the metals selected from a group consisting of Ta, Mo, W, Ni, Co, Cr, Cu, Ti, Ir, Ru and Pt, is preferable. Other structure and materials are similar to the structure and materials already explained in the first and second embodiments, and overlapping or redundant description may be omitted in the third embodiment.

And, different from the FBARs of the first and second embodiments, since the cross sectional shape of the intermediate electrode 23 of the FBAR of the third embodiment has a bathtub-shaped (reverse trapezoid) or a U-groove configuration, reverse taper angles at both edges of the intermediate electrode 23 does not affect the orientation of the piezoelectric layer 15. Therefore, each of the reverse taper angles may be above 45 degrees. However, in respect of area efficiency, it is more suitable to set the taper angle at the edge of the intermediate electrode 23 to be 90 degrees, namely to delineate the intermediate electrode 23 so as to be defined by a vertical sidewall so that the occupation area by the intermediate electrode 23 is minimized. When the taper angles at the edges of the metallic intermediate electrode 13 are set above 90 degrees, the occupation area by the intermediate electrode 23 relatively increases and the area efficiency decreases, which does not meet the demand for miniaturization.

For instance, the FBAR encompassing the intermediate electrode 23 formed of W film with a 400 nm film thickness, the bottom electrode 14 formed of Al film with a 300 nm film thickness, the piezoelectric layer 15 formed of AlN film with a 2.5 µm film thickness, the top electrode 16 formed of Al film with a 300 nm film thickness and the bottom electrode wiring 17 formed of Al film with a 300 nm film thickness shows excellent resonance characteristics such that at a resonance frequency of 2.0 GHz, the electromechanical coupling factor $k_t^2$ is 6.5%, the Q-value at the resonance frequency is 800, and the Q-value at the anti-resonance frequency is 680, according to an evaluation by a measurement using a vector network analyzer.

With reference to FIGS. 13A-13E, a sequence of manufacturing processes of the FBAR according to the third embodiment is explained. Note that the FBAR of the third embodiment can be manufactured by various manufacturing methods including a modification of the third embodiment, other than the sequence of manufacturing processes disclosed by the following example.

Figure 13A:
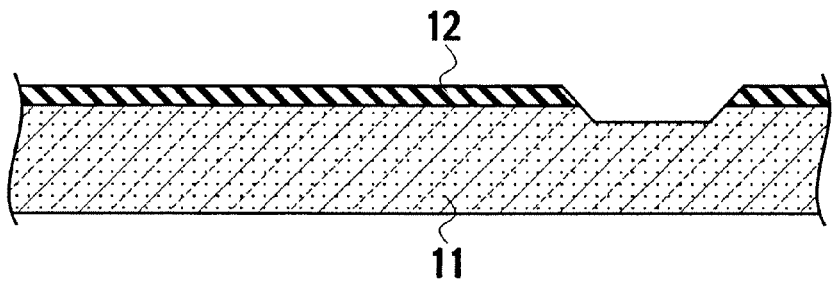
FIG. 13A is a process flow cross sectional view showing an intermediate product of the FBAR taken on line IB-IB in FIG. 10, explaining a manufacturing method of the FBAR according to the third embodiment.

(a) First, as shown in FIG. 13A, on the Si (100) substrate 11 on which an insulating film 12 is formed by thermal oxidation methods, etc., a bathtub-shaped (shaped like the letter U) cavity having a 200 to 800 nm depth, or preferably a 300 to 500 nm depth, is delineated by RIE method with fluoride based etching gas.

Figure 13B:
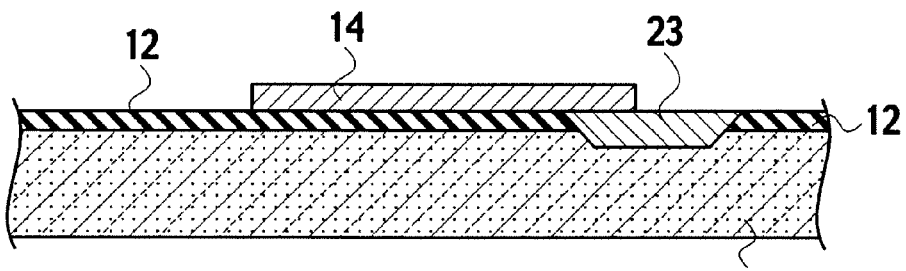
FIG. 13B is a subsequent process flow cross sectional view showing the intermediate product of the FBAR according to the third embodiment after the process stage shown in FIG. 13A.

(b) For instance, when the bathtub-shaped cavity having a 400 nm depth is used, a W film, having a 600 nm film thickness, is deposited using RF magnetron sputtering, etc. And the top surface of the W film is planarized by chemical mechanical polishing (CMP) so as to bury an intermediate electrode 23 in the bathtub-shaped cavity. Next, on the insulating film 12 and on the intermediate 23, an Al film, having a 150 to 600 nm film thickness, or preferably a 250 to 350 nm film thickness, is deposited as a piezoelectric dielectric film (mother material film) using RF magnetron sputtering, etc. And the Al film is delineated by photolithography and RIE method using chloride based etching gas, so as to form a bottom electrode 14 as shown in FIG. 13B. The Al film is delineated such that the one side of the bottom electrode 14 is located on the intermediate electrode 23 and the bottom electrode 14 and the intermediate electrode 23 are electrically connected.

Figure 13C:
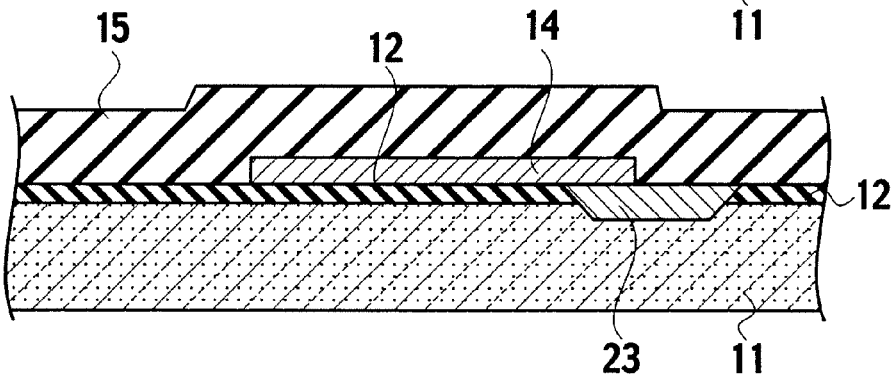
FIG. 13C is a subsequent process flow cross sectional view showing the intermediate product of the FBAR according to the third embodiment, after the process stage shown in FIG. 13B.

(c) Afterwards, as shown in FIG. 13C, on the bottom electrode 14 and on the intermediate electrode 23, an AlN film, having a 2.5 μm film thickness, is stacked using RF magnetron sputtering, etc. And the AlN film is delineated by photolithography and accompanying RIE method with chloride based etching gas, so as to form a pattern of the piezoelectric layer 15. The AlN film is delineated such that one of the sidewall faces of the piezoelectric layer 15 may be located on the intermediate electrode 23, and part of the intermediate electrode 23 comes to show up from the contour of the piezoelectric layer 15. The AlN film may be selectively etched by RIE method with chloride based etching gas, since the W film is used for the intermediate electrode 23, which serves indirectly as an etching stopper layer over the bottom electrode 14.

Figure 13D:
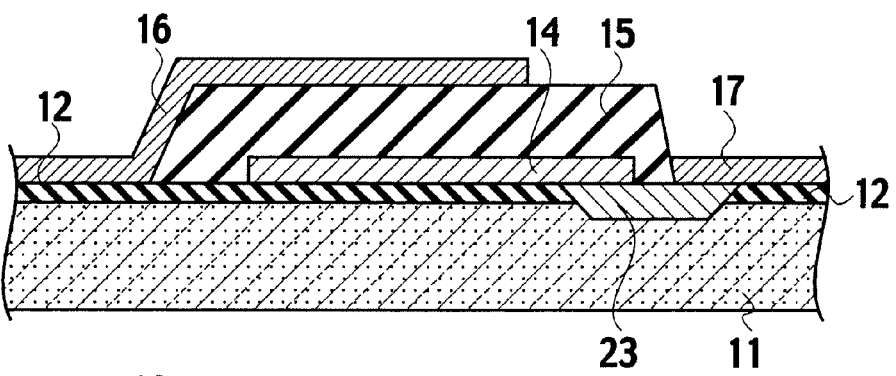
FIG. 13D is a further subsequent process flow cross sectional view showing the intermediate product of the FBAR according to the third embodiment after the process stage shown in FIG. 13C.
Figure 13E:
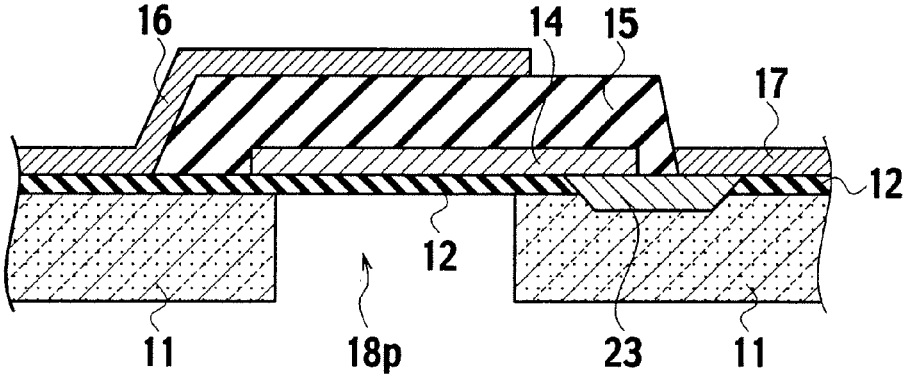
FIG. 13E is a still further subsequent process flow cross sectional view showing the intermediate product of the FBAR according to the third embodiment after the process stage shown in FIG. 13D.

(d) Subsequently, an Al film having a 150 to 600 nm film thickness, or preferably a 250 to 350 nm film thickness, is deposited so that the Al film can cover the entire surfaces of the piezoelectric layer 15, the intermediate electrode 23 laid bare from the contour of the piezoelectric layer 15, and the insulting film 12. Afterwards the Al film is delineated by photolithography and accompanying wet etching using a combination of nitric acid ($HNO_3$), acetic acid ($CH_3COOH$), phosphoric acid ($H_3PO_4$) so as to delineate the top electrode 16 and the bottom electrode wiring 17c as shown in FIG. 13D. The bottom electrode wiring 17 is electrically connected to the intermediate electrode 23 laid bare from the contour of the piezoelectric layer 15.

(e) Next, after the thickness of the Si substrate 11 is adjusted to 100 nm by polishing, an etching-mask is delineated on the bottom surface of the Si substrate 11 by photolithography using a lithography aligner configured to facilitate projection of images on both sides of the Si substrate 11. And the Si substrate 111 is selectively etched from the bottom surface by RIE method with $CF_4$ and $SF_6$ etching gas, so as to establish the cavity 18p as shown in FIG. 5E. Afterwards, the insulting film 12, which remains at the bottom of the cavity 18p, is removed as shown in FIG. 12, using wet etching by RIE method with fluoride based etching gas, thereby completing the sequence of formation processes of the FBAR of the third embodiment.

Note that before the process of depositing the Al film of FIG. 13B, it is preferable to deposit an amorphous metallic film formed of such materials as a Ta—Al alloy film and a $TiB_2$ film having a 5 to 100 nm film thickness, or preferably a 15 to 30 nm film thickness, so that the amorphous metallic film may cover the entire surface of the insulating film 12. Namely, when the amorphous metallic film is deposited between the bottom electrode 14 and the insulating film 12, the c-axis orientation of the AlN film, which deposits on the amorphous metallic film, is remarkably improved. Compared with a case in which the amorphous metallic film is not established, the electromechanical coupling factor $k_t^2$ and the Q-value which affect greatly performances of the FBAR can be increased when the amorphous metallic film 37 is deposited. And as mentioned in the first embodiment, high frequency characteristic is further improved by selectively etching the amorphous metallic film, which exposes at the bottom face of the cavity 18.

According to the manufacturing method of the FBAR of the third embodiment, although the intermediate electrode 23 is formed of such a material as W, the intermediate electrode 23 can also be formed of such electrically conductive materials as W, Mo, Ru, Rh, Pd, Ir and Pt. By establishing the intermediate electrode 23 formed of such materials as W, Mo, Ru, Rh, Pd, Ir, and Pt, the etching selectivity of the piezoelectric layer 15 over the bottom electrode 14 can be ensured to some extent. In other words, the intermediate electrode 23 can serve as the etching stopper indirectly toward the bottom electrode 14 when the pattern of the piezoelectric layer 15 is delineated. Therefore, there is no possibility that the bottom electrode 14 becomes too thin by over-etching and is disconnected by after-corrosion. And, because the intermediate electrode 23 can prevent increase of the series resistance of the bottom electrode 14 over a designated value by etching failure, an excellent high frequency characteristic in frequency band up to GHz can be achieved.

According to the manufacturing method of the FBAR of the third embodiment, the intermediate electrode 23 is so formed that the intermediate electrode 23 is formed of electrically-conductive materials which have the large etching selectivity over the piezoelectric layer 15, any material constraints for the bottom electrode 14 and process margins for the film thickness of the bottom electrode 14 are not necessary. And, since the film thickness of the intermediate electrode 23 has no relation with resonator characteristics directly, it is possible to increase the film thickness of the intermediate electrode 23. Furthermore, a range of selecting materials for the bottom electrode 23, in view of resistivity and etching selectivity, etc., can be expanded. Further a margin for instabilities of processes such as fluctuation of the processing condition also extends. Therefore, a large technical advantage in the manufacturing of the FBAR is achieved by the employment of the intermediate electrode 23.

The FBAR according to the third embodiment can implement the ladder-type filter 41 shown in FIG. 6 and the VCO of mobile communication devices shown in FIG. 7 as mentioned in the first embodiment. Also a plurality of FBARs of the third embodiment can be employed in the portable transceiver shown in FIG. 8 and FIG. 9, so as to implement the micro mechanical filters for the RF filter 41 and the IF filter 42.

Fourth Embodiment

Figure 14:
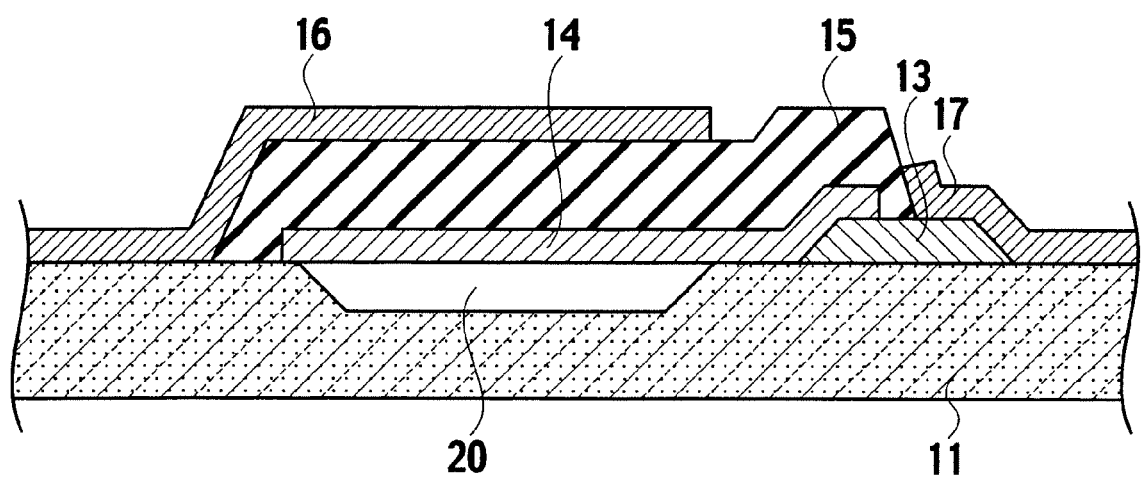
FIG. 14 is a schematic cross sectional view of the FBAR according to a fourth embodiment, corresponding to the cross-sectional view taken on line IB-IB in FIG. 1A.

As shown in FIG. 14, a FBAR according to a fourth embodiment of the present invention includes a substrate 11, a cavity 20, having a bathtub-shaped (reverse trapezoid) or a U-groove configuration, formed on the top surface of the substrate 11, a bottom electrode 14, part of which is mechanically suspended above a cavity 20 and another part of which is mechanically fixed to the substrate 11, the cavity 20 is formed between the substrate 11 and the bottom electrode 14, a metallic intermediate electrode 13 disposed on the top surface of the different site of the substrate 11 apart from the site in which the cavity 20 is formed, configured to be 20 electrically connected with the bottom electrode 14, a piezoelectric layer 15 disposed on the bottom electrode 14 and on the metallic intermediate electrode 13, a top electrode 16 delineated on the piezoelectric layer 15 and a bottom electrode wiring 17 connected to the metallic intermediate electrode 13. The cavity 20 is a closed cavity implemented by a groove dug at a top surface of and in the substrate 11.

Since a planar pattern of the FBAR is similar to FIG. 1A, the illustration of the plan view is omitted, and FIG. 14 shows only a cross-sectional view of the FBAR of the fourth embodiment. The piezoelectric layer 15 covers the entire surface of the bottom electrode 14 in the inside of the area defined by the contour of the piezoelectric layer 15 in a plan view. And similar to the plan view shown in FIG. 1A, the contour of the piezoelectric layer 15 crosses a top surface of the metallic intermediate electrode 13 and part of the metallic intermediate electrode 13 extends to an outside of the contour of the piezoelectric layer 15, from the contour of the piezoelectric layer 15.

Similar to FIG. 1A, a shape of both sidewall faces in the edge of the metallic intermediate electrode 13 is a tapered configuration. And the taper angle in the slanted sidewall of the metallic intermediate electrode 13 may preferably set at below 45 degrees similar to the FBAR of the first embodiment, and it is more preferable to set the taper angle at below 30 degrees and above ten degrees. A planar shape of the metallic intermediate electrode 13 is a striped configuration similar to FIG. 1A. One end of the bottom electrode 14 extends along a tapered sidewall face of the metallic intermediate electrode 13, and is disposed on the top surface of the metallic intermediate electrode 13. And similar to the FBARs of the first to third embodiments, in the FBAR shown in FIG. 14, resonance frequency can be determined by adjusting the film thicknesses of the piezoelectric layer 15 and the bottom electrode 14, since the FBAR utilizes a longitudinal vibration mode along the thickness direction of the piezoelectric layer 15.

Also, similar to the FBARs of the first and third embodiments, since the metallic intermediate electrode 13 of the FBAR according to the fourth embodiment may have the bcc lattice structure of <110> orientation, the fcc lattice structure of <111> orientation, or alternatively the hcp lattice structure of <0001> orientation, the metallic intermediate electrode 13 has a specific orientation which facilitates the matching with <0001> orientation of hexagonal crystal having a wurtzite lattice structure. Therefore, when AlN, or alternatively ZnO having the wurtzite lattice structure is employed to implement the piezoelectric layer 15, the orientation of the piezoelectric layer 15 is easy to be oriented uniformly along the c-axis, namely along the <0001> orientation. By controlling a polarization direction (orientation) of the piezoelectric layer 15 to the c-axis, an electromechanical coupling factor $k_t^2$ and a Q-value are easy to be ensured. The features of the FBAR of the fourth embodiment is similar to the FBARs of the first to third embodiments, other overlapped explanations are omitted.

For instance, the FBAR of the fourth embodiment, encompassing the metallic intermediate electrode 13 formed of Mo film with a 400 nm film thickness, the bottom electrode 14 formed of Al film with a 300 nm film thickness, the piezoelectric layer 15 formed of AlN film with a 2.5 μm film thickness, the top electrode 16 formed of Al film with a 300 nm film thickness and the bottom electrode wiring 17 formed of Al film with a 300 nm film thickness shows excellent resonance characteristics such that at a resonance frequency of 2.1 GHz, the electromechanical coupling factor $k_t^2$ is 6.3%, the Q-value at the resonance frequency is 700, and the Q-value at the anti-resonance frequency is 580, according to an evaluation by a measurement using a vector network analyzer.

With reference to FIGS. 15A-15D, a sequence of manufacturing processes of the FBAR according to the fourth embodiment is explained. Note that the FBAR of the fourth embodiment can be manufactured by various manufacturing methods including various modifications of the fourth embodiment, other than the sequence of manufacturing processes disclosed by the following example.

Figure 15A:
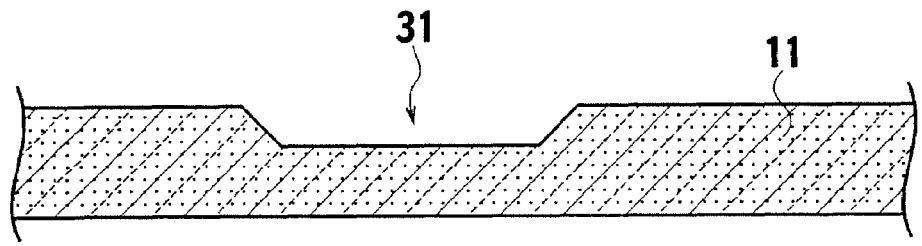
FIG. 15A is a process flow cross sectional view showing an intermediate product of the FBAR taken on line IB-IB in FIG. 10, explaining a manufacturing method of the FBAR according to the fourth embodiment.

(a) First, as shown in FIG. 15A, on the Si (100) substrate 11, a groove 31 having a 0.5 to 2 μm depth, or preferably a 0.8 to 1.5 μm depth, by photolithography with fluoride based etching gas, is formed. A plan view of the groove 31 is a rectangular pattern in which a branch member of striped configuration is established so that the branch member of striped configuration is orthogonal to one of the sides of the rectangular pattern, although the plan view is omitted. More than two branch members may be established to the rectangular pattern.

Figure 15B:
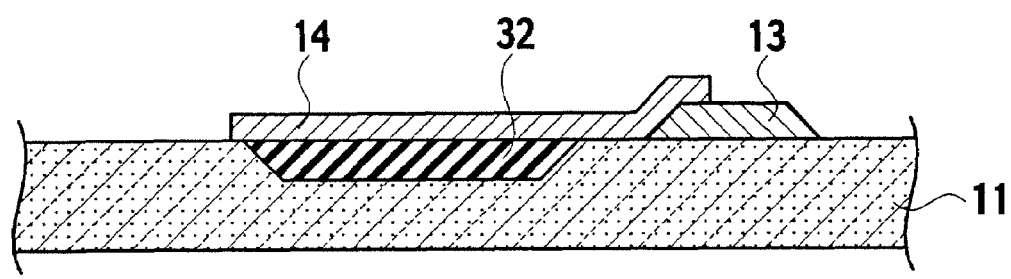
FIG. 15B is a subsequent process flow cross sectional view showing the intermediate product of the FBAR according to the fourth embodiment after the process stage shown in FIG. 15A.

(b) For instance, when the groove 31 has a 1.0 μm depth, a BPSG film, having an about 1.2 μm film thickness is deposited by chemical vapor deposition (CVD) method on the groove 31, and the BPSG film is planarized by CMP method so as to form a pattern of a sacrificial layer 32. A plan view of the sacrificial layer 32 is a similar rectangular pattern to the plan view of the groove 31, in which a branch member of striped configuration is established so that the branch member of striped configuration is orthogonal to one of the sides of the rectangular pattern. Next, a Mo film, having a 200 to 700 nm film thickness, or preferably a 300 to 500 nm film thickness, is deposited on the substrate 11 and on the sacrificial layer 32 and is delineated by photolithography and accompanying RIE method using chloride based etching gas, so as to form a metallic intermediate electrode 13. Further, a Ru film, having a 150 to 600 nm, or preferably a 100 to 150 nm film thickness, is stacked using RF magnetron sputtering, etc. And the Ru film is delineated by photolithography and accompanying RIE method with chloride based etching gas, so as to form a pattern of the bottom electrode 14 as shown in FIG. 15B. In the formation process, one of the ends of the bottom electrode 14 is stacked on the metallic intermediate electrode 13 so that the bottom electrode 14 electrically connects to the metallic intermediate electrode 13.

Figure 15C:
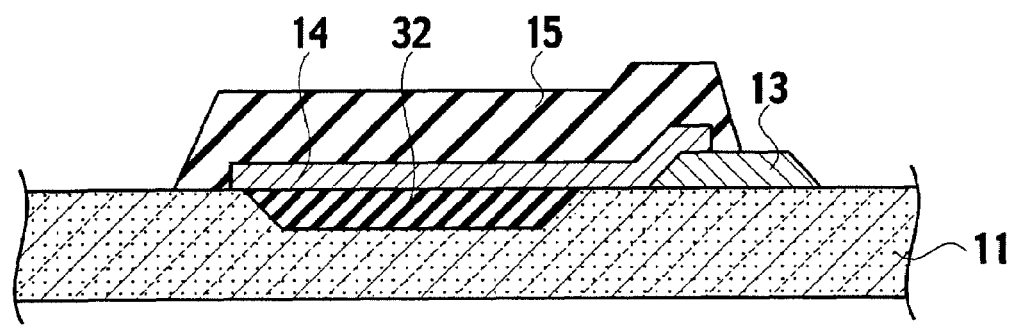
FIG. 15C is a subsequent process flow cross sectional view showing the intermediate product of the FBAR according to the fourth embodiment, after the process stage shown in FIG. 15B.

(c) Afterwards, as shown in FIG. 15C, on the bottom electrode 14 and on the metallic intermediate electrode 13, an AlN film, having an about 2.5 μm film thickness, is stacked as a piezoelectric dielectric film (mother material film) using RF magnetron sputtering, etc. And the AlN film is delineated by photolithography and accompanying RIE method with chloride based etching gas, so as to form a pattern of the piezoelectric layer 15 as shown in FIG. 15C.

The AlN film is delineated such that one of the sidewall faces of the piezoelectric layer 15 may be located on the metallic intermediate electrode 13, and part of the metallic intermediate electrode 13 comes to show up from the contour of the piezoelectric layer 15. The AlN film may be selectively etched by RIE method with chloride based etching gas, if a Mo film is employed for the metallic intermediate electrode 13, because the Mo film serves indirectly as an etching stopper layer over the bottom electrode 14. Further, in the plan view of FIG. 15C, the branch member of striped configuration which is established at one of the sides of the rectangular pattern of the sacrificial layer 32, comes to show up from the contour of the piezoelectric layer 15.

Figure 15D:
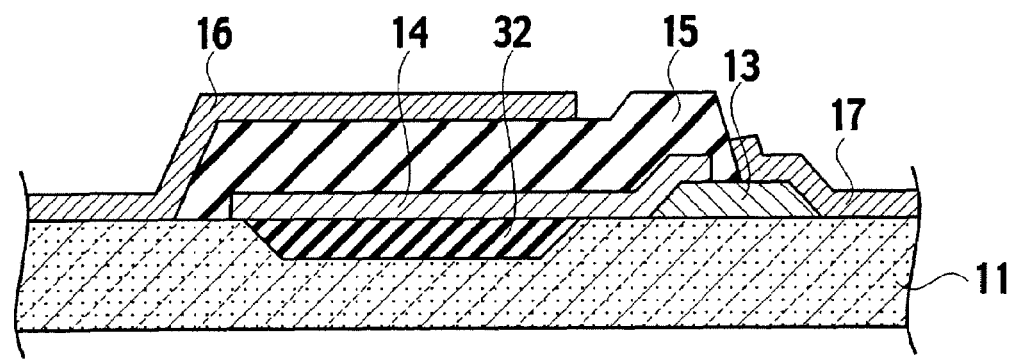
FIG. 15D is a further subsequent process flow cross sectional view showing the intermediate product of the FBAR according to the fourth embodiment after the process stage shown in FIG. 15C.

(d) Subsequently, an Ru film having a 100 to 600 nm film thickness, or preferably a 100 to 150 nm film thickness, is deposited so that the Ru film can cover entire surfaces of the piezoelectric layer 15, the metallic intermediate electrode 13 laid bare from the contour of the piezoelectric layer 15, and the substrate 11. Afterwards the Ru film is delineated by photolithography and accompanying dry etching with chloride based etching gas, so as to form the top electrode 16 and the bottom electrode wiring 17 as shown in FIG. 15D. The bottom electrode wiring 17 is electrically connected to the metallic intermediate electrode 13 laid bare from the contour of the piezoelectric layer 15.

(e) Next, the branch member of striped configuration in the rectangular pattern of the sacrificial layer 32, being laid bare from the contour of the piezoelectric layer 15, is etched by submerging the substrate 111 in a BPSG-etching solution such as fluoride acid (HF), fluoridation ammonium ($NH_4F$). As etching of the branch member in the striped configuration proceeds, a conduit of the etching solution to the Mo sacrificial layer 32, which is buried in the bottom surface (belly) of the bottom electrode 14, is formed. And the Mo sacrificial layer 32 is etched through the conduit of the etching solution, so as to form the cavity 20 shown in FIG. 14. After the etching by the BPSG-etching solution, the substrate 11 is rinsed by isopropyl alcohol and dried, and the cross-sectional structure shown in FIG. 15D is completed.

According to the manufacturing method of the FBAR of the fourth embodiment, although the metallic intermediate electrode 13 is formed of a Mo film, the metallic intermediate electrode 13 can also be formed of such electrically conductive materials as W, Ru, Rh, Pd, Ir and Pt. By establishing the semiconductor intermediate electrode 23 formed of such materials as W, Mo, Ru, Rh, Pd, Ir, and Pt, the etching selectivity of the piezoelectric layer 15 over the bottom electrode 14 can be ensured to some extent. In other words, the metallic intermediate electrode 13 can serve as the etching stopper indirectly toward the bottom electrode 14 when the pattern of the piezoelectric layer 15 is delineated. Therefore, there is no possibility that the bottom electrode 14 becomes too thin by over-etching and is disconnected by after-corrosion. And, because the metallic intermediate electrode 13 can prevent increase of the series resistance of the bottom electrode 14 over a designated value by etching failure, an excellent high frequency characteristic in frequency band up to GHz can be achieved.

According to the manufacturing method of the FBAR of the fourth embodiment, the metallic intermediate electrode 13 is so formed that the metallic intermediate electrode 13 is formed of electrically-conductive materials which have a large etching selectivity over the piezoelectric layer 15, any material constraints for the bottom electrode 14 and process margins for the film thickness of the bottom electrode 14 are not necessary. And, since the film thickness of the metallic intermediate electrode 13 has no relation with resonator characteristics directly, it is possible to increase the film thickness of the metallic intermediate electrode 13. Furthermore, a range of selecting materials for the bottom electrode 13, in view of resistivity and etching selectivity, etc., can be expanded. Further a margin for instabilities of processes such as fluctuation of the processing conditions also extends. Therefore, a large technical advantage in the manufacturing of the FBAR is achieved by the employment of the metallic intermediate electrode 13.

For a FBAR according to a modification of the forth embodiment, such configuration is considered as to deposit an amorphous metallic film under the bottom electrode 14, similar to the modification of the first embodiment shown in FIG. 3, in which the amorphous metallic film is deposited between the bottom electrode 14 and the insulating film 12, and the c-axis orientation of the AlN film, which deposits on the amorphous metallic film, is remarkably improved. Compared with a case in which the amorphous metallic film is not established, the electromechanical coupling factor $k_t^2$ and the Q-value which affect greatly performances of the FBAR can be increased when such amorphous metallic film is deposited. Therefore, it is preferable to deposit an amorphous metallic film formed of such materials as a Ta—Al alloy film and a $TiB_2$ film having a 5 to 100 nm film thickness, or preferably a 15 to 30 nm film thickness, after the Mo film is deposited on the substrate 11 and on the sacrificial layer 32 and the metallic intermediate electrode 13 is delineated as shown in a manufacturing process of FIG. 15B.

The FBAR according to the fourth embodiment can implement the ladder-type filter 41 shown in FIG. 6 and the VCO of mobile communication devices shown in FIG. 7 as mentioned in the first embodiment. Also a plurality of FBARs of the fourth embodiment can be employed in the portable transceiver shown in FIG. 8 and FIG. 9, so as to implement the micro mechanical filters for the RF filter 41 and the IF filter 42.

Fifth Embodiment

Figure 16A:
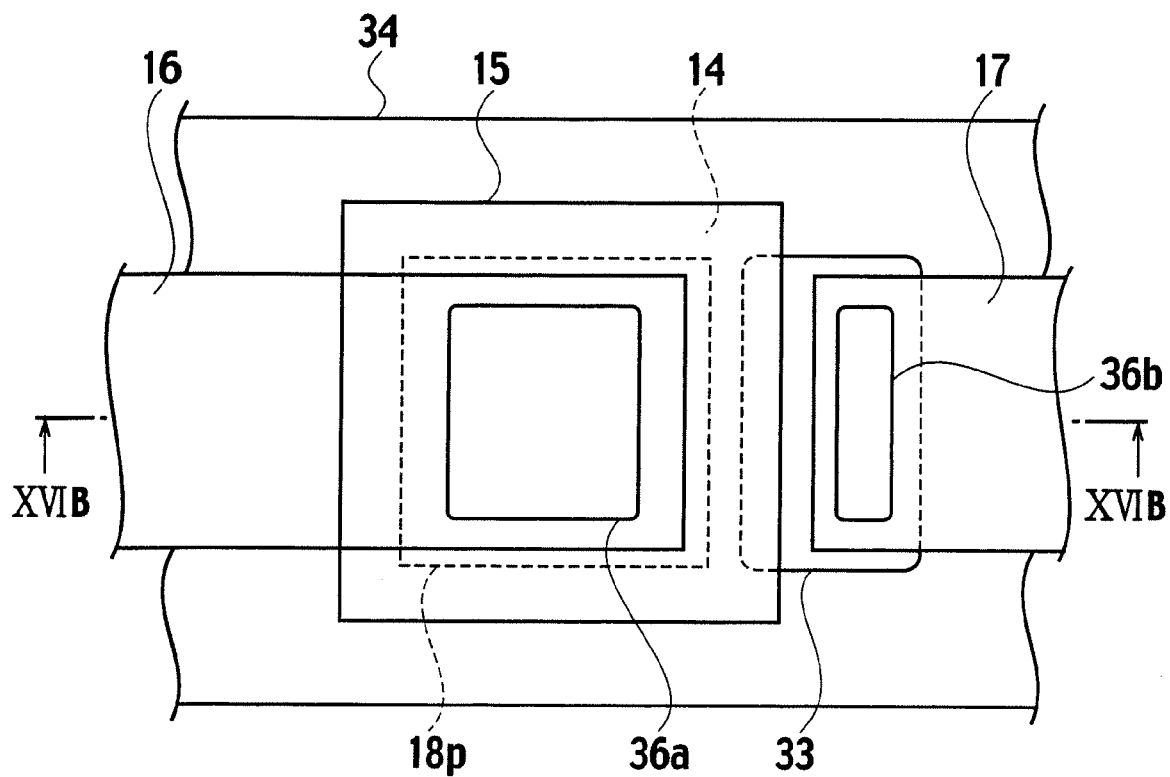
FIG. 16A is a schematic plan view of a FBAR according to a fifth embodiment of the present invention.
Figure 16B:
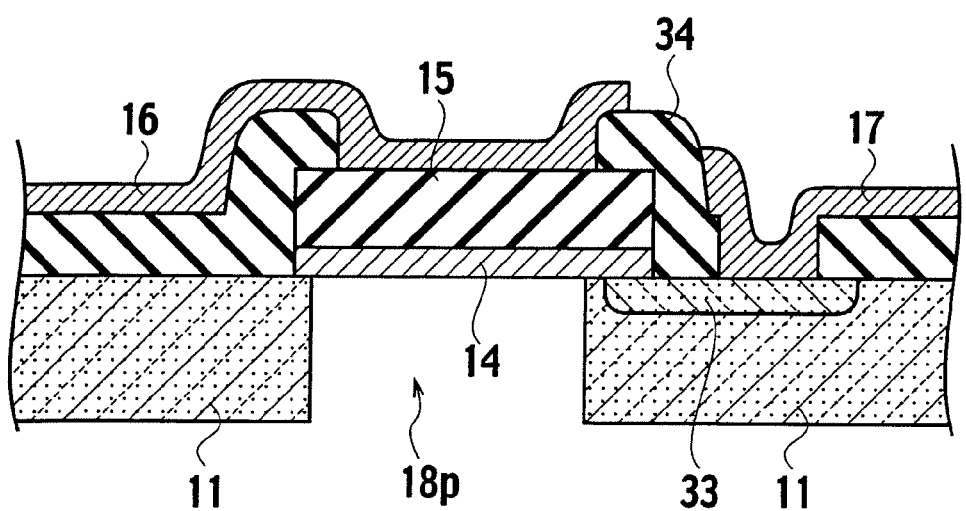
FIG. 16B is a schematic cross sectional view of the FBAR according to a fifth embodiment, taken on line XVIB-XVIB in FIG. 16A.

As shown in FIG. 16, a FBAR according to a fifth embodiment of the present invention includes a substrate 11 formed of semi-insulating or high-resistivity material, a bottom electrode 14, part of which is mechanically suspended above a cavity 18p and another part of which is mechanically fixed to the substrate 11, a piezoelectric layer 15, having the same shape and the same size as the bottom electrode 14 in a plan view of FIG. 16A, disposed on the bottom electrode 14, a top electrode 16 on the piezoelectric layer 15, a semiconductor intermediate electrode 33 buried at and in a top surface of the substrate 11, being located at a contour of the piezoelectric layer 15, defining the shape of the piezoelectric layer 15 in the plan view, the semiconductor intermediate electrode 33 having a lower resistivity than the semiconductor substrate 11, configured to be connected to the bottom electrode 14, a bottom electrode wiring 17 connected to the semiconductor intermediate electrode 33. The FBAR according to the fifth embodiment utilizes a longitudinal vibration mode along a thickness direction of the piezoelectric layer 15. The semiconductor intermediate electrode 33 is a buried semiconductor region from the top surface of the semiconductor substrate 11 into the inside of the semiconductor substrate 11.

Further, the FBAR according to the fifth embodiment of the present invention includes an inter-layer dielectric film 34 formed on the piezoelectric layer 15, the semiconductor substrate 11 being laid bare from the contour of the piezoelectric layer 15 and the semiconductor intermediate electrode (impurity-diffused region) 33. Through a first contact window 36a formed in the inter-layer dielectric film 34, the top electrode 16 is electrically connected to the piezoelectric layer 15 and through a second contact window 36b formed in the inter-layer dielectric film 34, the bottom electrode wiring 17 is electrically connected to the semiconductor intermediate electrode 33. For materials of the inter-layer dielectric film 34, various dielectric films such as a silicon oxide film ($SiO_2$), a silicon nitride ($Si_3N_4$) film or a composite film of the silicon oxide film ($SiO_2$) and the silicon nitride ($Si_3N_4$) film can be used.

As semiconductor substrate 11, for instance a p-type silicon substrate, a main surface of which is implemented by a (100) plane of about 600 Ωcm to 10 kΩcm (impurity concentration of about $2 \times 10^{13}$ cm$^{-3}$-$1 \times 10^{12}$ cm$^{-3}$) is usable. In a case using the p-type silicon substrate, a n-type diffused region of 0.85 Ωcm-0.095 Ωcm (impurity concentration of about $1 \times 10^{20}$ cm$^{-3}$-$5 \times 10^{18}$ cm$^{-3}$) with a depth of about 300 nm to 7 µm, can be adopted for the semiconductor intermediate electrode (impurity-diffused region) 33. On the contrary, a p-type diffused region of 1.2 Ωcm-0.02 Ωcm (impurity concentration of about $1 \times 10^{20}$ cm$^{-3}$-$5 \times 10^{18}$ cm$^{-3}$) with a depth of about 300 nm to 7 µm, may be buried on a n-type silicon substrate for the semiconductor intermediate electrode (impurity-diffused region) 33. In other words, the semiconductor intermediate electrode (impurity-diffused region) 33 can be implemented by a heavily doped semiconductor region buried in the semiconductor substrate 11 of a first conductivity type, the heavily doped semiconductor region having a second conductivity type opposite to the first conductivity type. Although an explanation hereinafter is made using such that p-type is assigned as the first conductivity type and n-type is assigned as the second conductivity type, n-type can be assigned as the first conductivity type and p-type can be assigned as the second conductivity type for establishing the semiconductor intermediate electrode (impurity-diffused region) 33. By burying the semiconductor intermediate electrode 33 implemented by a semiconductor region of the second conductivity type buried in a semiconductor substrate 11 of the first conductivity type, a junction-isolation is established by pn junctions located in a space between adjacent semiconductor intermediate electrodes 33, in an identical semiconductor substrate 11 on which a plurality of FBARs are monolithically integrated.

As shown in FIG. 16, the contour of the piezoelectric layer 15, defining the shape of the piezoelectric layer 15, crosses a top surface of the semiconductor intermediate electrode (impurity-diffused region) 33 and part of the semiconductor intermediate electrode (impurity-diffused region) 33 extends to an outside of the contour of the piezoelectric layer 15, from the contour of the piezoelectric layer 15.

A planar shape of the semiconductor intermediate electrode (impurity-diffused region) 33 is a rectangle in a striped configuration similar to FIG. 16. One side of the bottom electrode 14 is disposed on the semiconductor intermediate electrode (impurity-diffused region) 33 and the bottom electrode 14 and the semiconductor intermediate electrode (impurity-diffused region) 33 are electrically connected. In addition, the FBAR according to the fifth embodiment includes a cavity 18p, which is a open cavity formed along a direction from the bottom surface of the substrate 11 to the top surface of the substrate 11 for exposing a bottom surface of the bottom electrode 14. Therefore, part of the bottom electrode 14 is mechanically suspended above the cavity 18p and another part of which is mechanically fixed to the substrate 11. In the FBAR shown in FIG. 16, resonance frequency can be determined by adjusting the film thicknesses of the piezoelectric layer 15 and the bottom electrode 14, since the FBAR utilizes a longitudinal vibration mode along the thickness direction of the piezoelectric layer 15.

For instance, the FBAR of the fifth embodiment, encompassing the semiconductor intermediate electrode (impurity-diffused region) 33 formed of W film with a 400 nm film thickness, the bottom electrode 14 formed of Al film with a 300 nm film thickness, the piezoelectric layer 15 formed of AlN film with a 2.5 µm film thickness, the top electrode 16 formed of Al film with a 300 nm film thickness and the bottom electrode wiring 17 formed of Al film with a 300 nm film thickness shows excellent resonance characteristics such that at a resonance frequency of 2.0 GHz, the electromechanical coupling factor $k_t^2$ is 6.5%, the Q-value at the resonance frequency is 800, and the Q-value at the anti-resonance frequency is 680, according to an evaluation by a measurement using a vector network analyzer.

With reference to FIGS. 17A-17D, a sequence of manufacturing processes of the FBAR according to the fifth embodiment is explained. Note that the FBAR of the fifth embodiment can be manufactured by various manufacturing methods including a modification of the fourth embodiment, other than the sequence of manufacturing processes disclosed by the following example.

Figure 17A:
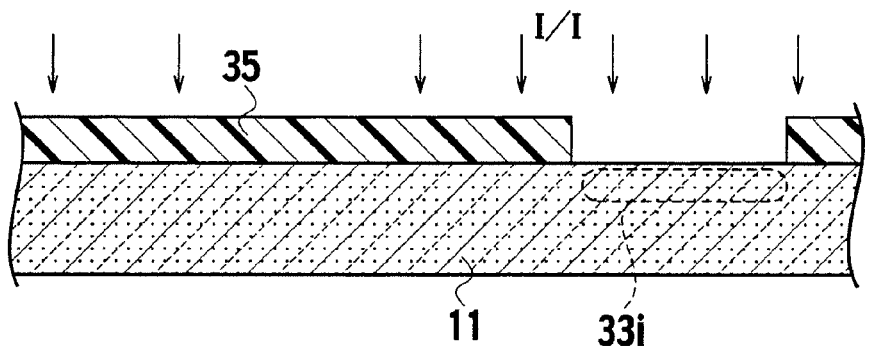
FIG. 17A is a process flow cross sectional view showing an intermediate product of the FBAR taken on line XVIB-XVIB in FIG. 16A, explaining a manufacturing method of the FBAR according to the fifth embodiment.

(a) First, a photoresist 35 is coated on the entire top surface of a semiconductor substrate 11, or a p-type Si (100) substrate 11 having a high-resistivity and the photoresist 35 is delineated by normal photolithography technique so as to form a photoresist-mask. Through the photoresist-mask, n-type impurity ions such as phosphorus ions ($^{31}P^+$) are implanted into the semiconductor substrate 11 with an acceleration voltage of 80-150 kV, and a dose amount of about $3 \times 10^{15}$ cm$^{-2}$-$4 \times 10^{16}$ cm$^{-2}$ so as to form an ion implanted region 33i in the semiconductor substrate 11 as shown in FIG. 17A. In a case in which dose amount is heavy, a metallic thin film such as an aluminum (Al) film may be delineated by the photolithography technology for an ion-implantation mask, instead of the photoresist 35.

Figure 17B:
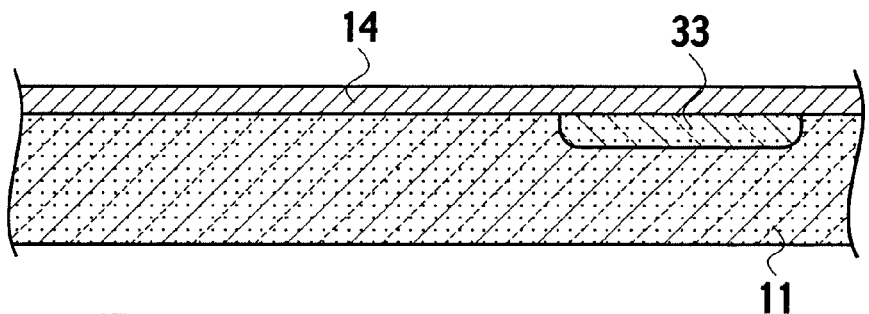
FIG. 17B is a subsequent process flow cross sectional view showing the intermediate product of the FBAR according to the fifth embodiment after the process stage shown in FIG. 17A.
Figure 17C:
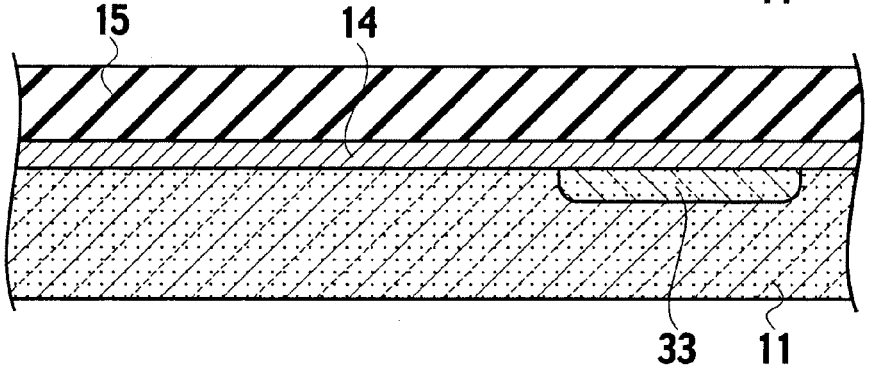
FIG. 17C is a subsequent process flow cross sectional view showing the intermediate product of the FBAR according to the fifth embodiment, after the process stage shown in FIG. 17B.

(b) And after the photoresist-mask used as the ion-implantation mask is removed, the semiconductor substrate 11 is annealed in nitrogen ($N_2$) gas ambient which contains 1-5% oxygen ($O_2$) gas or alternatively, in an inert gas such as helium (He), at 1100 degrees C. to 1200 degrees C. for about 30 minutes to 2 hours. The process activates the implanted impurity ions so as to form the semiconductor intermediate electrode (impurity-diffused region) 33 implemented by the n-type impurity-diffused region. Afterwards, a thin oxide film formed by the activation annealing on the top surface of the semiconductor substrate 11 is removed by diluted fluoride acid (HF) aqueous solution. In addition, an Al film (metallic film for the bottom electrode) 14 with a 150 to 600 nm film thickness and 250 to 350 nm is formed on the semiconductor substrate 11 and on the semiconductor intermediate electrode (impurity-diffused region) 33 by using RF magnetron sputtering as shown in FIG. 17B. Afterwards, for instance, an AlN film 15 with a 2.5 µm film thickness is deposited on the Al film 14 as shown in FIG. 17C as "a piezoelectric dielectric film (mother material film) for forming the piezoelectric layer".

Figure 17D:
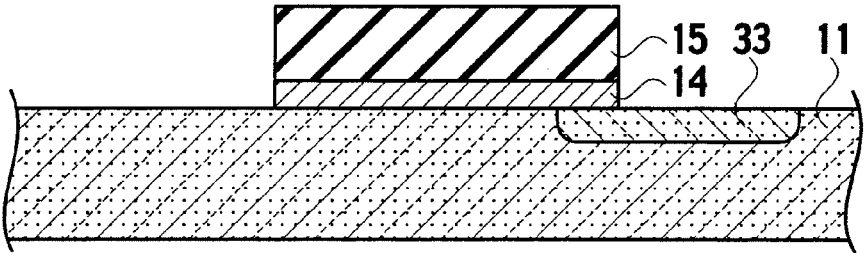
FIG. 17D is a further subsequent process flow cross sectional view showing the intermediate product of the FBAR according to the fifth embodiment after the process stage shown in FIG. 17C.
Figure 17E:
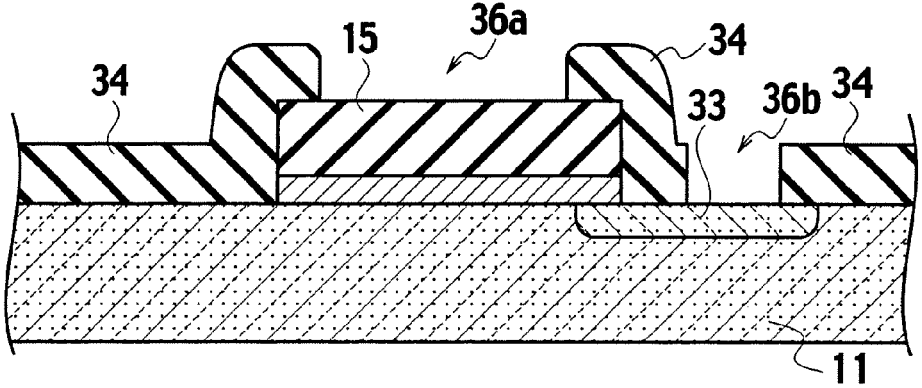
FIG. 17E is a still further subsequent process flow cross sectional view showing the intermediate product of the FBAR according to the fifth embodiment after the process stage shown in FIG. 17D.

(c) Next, after a new photoresist is coated on the entire top surface of the AlN film (piezoelectric dielectric film for forming the piezoelectric layer) 15, the new photoresist on the AlN film is delineated by photolithography. And by using the new photoresist as an etching mask, the AlN film (piezoelectric dielectric film for forming the piezoelectric layer) 15 is selectively removed by RIE method with chloride based etching gas, so as to form a pattern of the piezoelectric layer 15. Subsequently, in the same etching-chamber in which the pattern of the piezoelectric layer 15 is delineated, the Al film (metallic film for the bottom electrode) 14 is selectively removed by RIE method with chloride based etching gas, so as to form a pattern of the bottom electrode 14 as shown in FIG. 17D such that the pattern of the bottom electrode 14 can have the same planar shape and the same size as the pattern of the piezoelectric layer 15, that part of the semiconductor substrate 11 and part of the semiconductor intermediate electrode (impurity-diffused region) 33 are exposed. In the process, as shown in FIG. 17D, one of the sidewall faces of the bottom electrode 14 may be located on the semiconductor intermediate electrode (impurity-diffused region) 33, and the bottom electrode 14 and the semiconductor intermediate electrode (impurity-diffused region) 33 are electrically connected. Therefore, the pattern of the AlN film is simultaneously delineated with the same planar shape of the bottom electrode 14 such that, in a plan view, one of the sidewall faces of the piezoelectric layer 15 may be located on the semiconductor intermediate electrode (impurity-diffused region) 33, and part of the semiconductor intermediate electrode (impurity-diffused region) 33 comes to show up from the contour of the piezoelectric layer 15.

(d) Further, on the piezoelectric layer 15 and on the semiconductor substrate 11, the semiconductor intermediate electrode (impurity-diffused region) 33 which come to show up from the piezoelectric layer 15, an oxide film (a $SiO_2$ film) with a 100 nm to 800 nm film thickness is deposited so as to form the inter-layer dielectric film 34 by CVD method. The inter-layer dielectric film 34 may be formed of a composite film between the silicon oxide film ($SiO_2$) and the silicon nitride ($Si_3N_4$) film. Next, a new photoresist is coated on the inter-layer dielectric film 34, and the new photoresist is exposed with light transmitted through a particular photomask by photolithography and the new photoresist is developed so as to form an etching mask of the new photoresist. And by using the new photoresist as an etching mask, the inter-layer dielectric film 34 is selectively removed by RIE method as shown in FIG. 17D, so as to open a pattern of the first contact window 36a, making visible part of the piezoelectric layer 15, and to open a pattern of the second contact window 36b, making visible part of the semiconductor intermediate electrode (impurity-diffused region) 33.

(e) Subsequently, an Al film having a 150 to 600 nm film thickness, or preferably a 250 to 350 nm film thickness, is deposited on the inter-layer dielectric film 34 through the first contact window 36a and the second contact window 36b. Afterwards, the Al film is delineated by photolithography and accompanying wet etching using a combination of nitric acid ($HNO_3$), acetic acid ($CH_3COOH$), phosphoric acid ($H_3PO_4$) so as to delineate the top electrode 16 and the bottom electrode wiring 17. The top electrode 16 is electrically connected to the top surface of the piezoelectric layer 15 laid bare from the bottom surface of the first contact window 36a and the bottom electrode wiring 17 is electrically connected to the semiconductor intermediate electrode (impurity-diffused region) 33 laid bare from the bottom surface of the second contact window 36b respectively.

(f) Next, after the thickness of the semiconductor substrate 11 is adjusted to 100 nm by polishing, an etching-mask is delineated on the bottom surface of the semiconductor substrate 11 by photolithography using a photolithography aligner configured to project images on both sides of the semiconductor substrate 11. And the semiconductor substrate 11 formed of silicon, is selectively etched from the bottom surface by RIE method with $CF_4$ and $SF_6$ etching gas, so as to establish the cavity 18p as shown in FIG. 16.

Note that in the above-mentioned description, though a case in which the semiconductor intermediate electrode (impurity-diffused region) 33 is formed through ion implantation, various diffusion methods such as vapor phase diffusion (pre-deposition) using liquid diffusion-sources such as phosphoryl chloride ($POCl_3$) and vapor diffusion-sources such as phosphine ($PH_3$) gas, etc., solid phase diffusion using phosphosilicate glass (PSG), can be adopted for establishing the semiconductor intermediate electrode (impurity-diffused region) 33 And in the vapor phase diffusion, an silicon oxide film having an about 600 nm to 1 μm film thickness may be used as a diffusion mask.

Generally, a FBAR has a simple configuration such that a piezoelectric layer 15 is sandwiched by a bottom electrode 14 and a top electrode 16. Because a film thickness of the piezoelectric layer 15 is usually above 1 μm, the general FBAR is accompanied by various technical problems. Namely, the piezoelectric layer 15 is susceptible to be cracked by a stress ascribable to a level difference in the boundary where the bottom electrode 14 is inserted under the piezoelectric layer 15. The piezoelectric layer 15 is subject to be cracked because the film thickness becomes thick when we attempt to reduce the stress in piezoelectric layer 15, and because the piezoelectric layer 15 has a grain crystal structure in a pillar configuration. Therefore in an earlier technology, it is necessary that the bottom electrode 14 is delineated so as to be associated with taper angles, which are set at several decades degree. However, the controlling of the taper angle is actually very difficult. Even though the taper angles are implemented by sidewalls of the bottom electrode 14, by residual stresses in the piezoelectric layer 15 concentrate around locations at which the tapered sidewalls of the piezoelectric layer 15 begin, and to locations at which the tapered sidewall end above the bottom electrode 14, there is a high possibility that cracks would occur around the location at which the tapered sidewall begins and around the locations at which the tapered sidewall end, which reduces a manufacturing yield to a low level.

However, according to the manufacturing method of the FBAR of the fifth embodiment, the semiconductor intermediate electrode (impurity-diffused region) 33 can be formed without a level difference on part of the semiconductor substrate 11, and a piezoelectric film is stacked on the bottom electrode 14 successively so that piezoelectric layer 15 is delineated simultaneously with the bottom electrode 14 as a single piece of unit. Because the simultaneous delineation process is employed, there is no level difference of the piezoelectric layer 15 on the bottom electrode 14, and there is no sidewall defined by the taper angle. Therefore, the generation of the cracks in the piezoelectric layer 15 can be prevented, and it is not necessary that the taper angel of the bottom electrode 14 is strictly controlled at several decades degrees and the manufacturing yield becomes high.

Also a characteristic of the piezoelectric layer 15 has a close relation with the orientation of a film of the piezoelectric layer 15. So as to obtain a highly-oriented film along the c-axis, it is preferable that the piezoelectric layer 15 is successively disposed on a highly-oriented bottom electrode 14. According to the manufacturing method of the FBAR of the fifth embodiment, the piezoelectric layer 15, which is stacked on the bottom electrode 14, is delineated simultaneously with the bottom electrode 14 as a single piece of unit, and the highly oriented piezoelectric layer 15 can be grown. In the result, the electromechanical coupling factor $k_r^2$ and the Q-value can be increased.

According to the manufacturing method of the FBAR of the fifth embodiment, there is no possibility that the bottom electrode 14 becomes too thin by over-etching and is disconnected by after-corrosion. And, because the semiconductor intermediate electrode (impurity-diffused region) 13 can prevent increase of the series resistance of the bottom electrode 14 over a designated value by etching failure, an excellent high frequency characteristic in frequency band up to GHz can be achieved. Further, by the manufacturing method of the FBAR of the fifth embodiment, there is no necessity of cleaning processes of the top surface of the bottom electrode 14 before the deposition of the piezoelectric layer 15, and with a high-manufacturing yield, the FBAR operating with high efficiency can be manufactured at a low-cost.

First Modification of the Fifth Embodiment

A plan view of the semiconductor intermediate electrode (impurity-diffused region) 33 is not limited to the rectangle in the striped shape as shown in FIG. 16. As shown in FIG. 18, in the FBAR of a modification (a first modification) of the fifth embodiment, a plan view of the semiconductor intermediate electrode (impurity-diffused region) 33 is a concave polygon, arranged like the letter C, disposed around the piezoelectric layer 15. As similar to FIG. 16, since the bottom electrode 14 is delineated so as to have the same planar shape and the same size as the piezoelectric layer 15, the outer three sides of the bottom electrode 14, in a plan view, is located on the semiconductor intermediate electrode (impurity-diffused region) 33 in the inside of the occupied area defining the concave shape of the semiconductor intermediate electrode (impurity-diffused region) 33. Because the bottom electrode 14 and the semiconductor intermediate electrode (impurity-diffused region) 33 are mutually electrically connected in the inner three sides of the concave polygon, arranged like the letter C implemented by the semiconductor intermediate electrode (impurity-diffused region) 33, the FBAR of the first modification of the fifth embodiment achieves a structure which can establish electrically lower resistance than the structure shown in FIG. 16.

The inter-layer dielectric film 34 is formed on the piezoelectric layer 15, the semiconductor substrate 11 being laid bare from the sides of the piezoelectric layer 15 and the semiconductor intermediate electrode (impurity-diffused region) 33. The semiconductor intermediate electrode (impurity-diffused region) 33 implemented by the concave polygon is electrically connected to the bottom electrode wiring 17 through the second contact window 36b formed in the inter-layer dielectric film 34. As shown in FIG. 18, by leaving a metallic film, etc, implemented by the bottom electrode wiring 17, even when the resistivity in the semiconductor region (impurity diffused region) of the intermediate electrode 33 is not low enough, resistance of the semiconductor intermediate electrode (impurity-diffused region) 33 can be decreased effectively by the metallic film, etc.

Further, through the first contact window 36a formed in the inter-layer dielectric film 34, the piezoelectric layer 15 is electrically connected to the top electrode 16 on the piezoelectric layer 15. The top electrode 16 shown in the plan view of FIG. 18A extends vertically, different from the horizontal pattern of the top electrode 16 shown in the plan view of FIG. 16. Other structure and materials are similar to the structure and materials of the FBAR already explained along FIG. 16, and overlapping or redundant description may be omitted in the fifth embodiment.

The plan view of the semiconductor intermediate electrode (impurity-diffused region) 33 is not limited to the concave polygon, arranged like the letter C, shown in FIG. 18, such a concave polygon arranged like the letter like the letter L formed along two adjacent sides of the bottom electrode 14, a rectangular loop configuration which circles along all sides of the bottom electrode 14, may be adopted, or alternatively, a rectangular area of striped shape may be arranged in parallel along two opposing sides of the bottom electrode 14.

[Micro Mechanical Filter]

The FBAR according to the fifth embodiment can implement the ladder-type filter 41 shown in FIG. 6 and the VCO of mobile communication devices shown in FIG. 7 as mentioned in the first embodiment. Also a plurality of FBARs of the fifth embodiment can be employed in the portable transceiver shown in FIG. 8 and FIG. 9, so as to implement the micro mechanical filters for the RF filter 41 and the IF filter 42. Furthermore, the other example of a micro mechanical filter implemented by a plurality of FBARs of the fifth embodiment is shown with reference to FIG. 19.

Figure 19A:
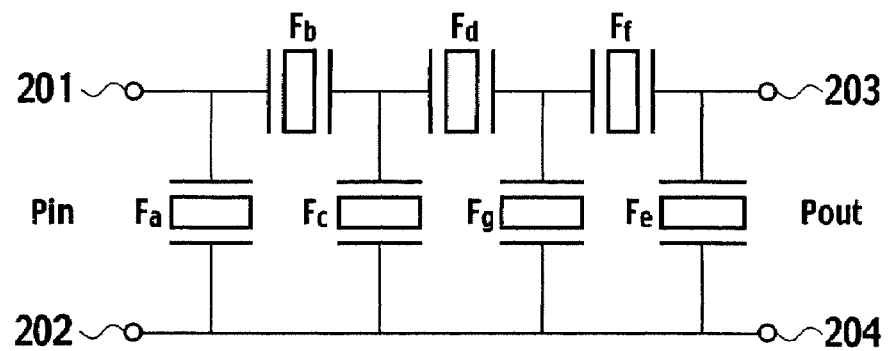
FIG. 19A is a schematic circuit diagram illustrating an example of a micro mechanical filter implemented by a plurality of FBARs of the fifth embodiment of the present invention.

A ladder-type filter 41 shown in FIG. 19A is arranged so that seven FBARs $F_a$, $F_b$, $F_c$, $F_d$, $F_e$, $F_f$, $F_g$ are connected in series and in parallel to each other. The FBARs $F_b$, $F_d$, $F_f$ are connected in series and the FBARs $F_a$, $F_c$, $F_e$, $F_g$ are connected in parallel so as to implement the ladder-type filter 41 with three and a half stages.

Figure 19B:
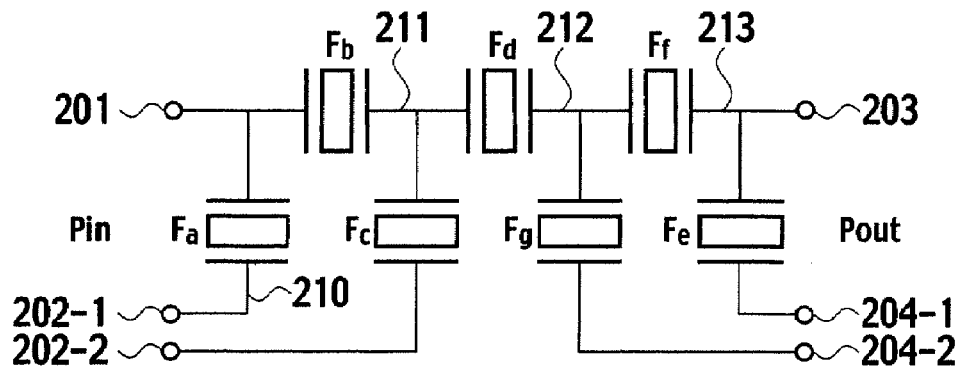
FIG. 19B is an equivalent circuit diagram of FIG. 19A.
Figure 20:
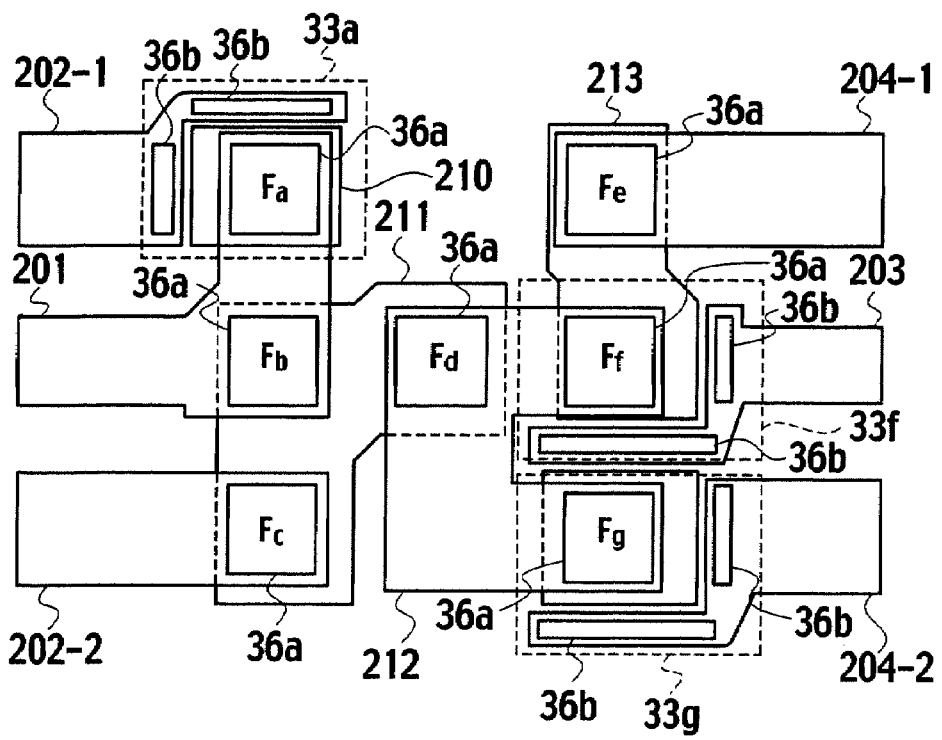
FIG. 20 is an example of an actual plan view of the micro mechanical filter shown in FIGS. 19A and 19B.

With regard to a circuit configuration of the ladder-type filter 41 shown in FIG. 19A, when the ladder-type filter 41 is actually manufactured, various topologies can be considered. FIG. 19B is a circuit configuration equivalent to FIG. 19A, corresponding to a plan view of FIG. 20 which shows an example in which the ladder-type filter 41 is actually manufactured. FIG. 19B includes two common terminals 202-1 and 202-2 at an input port $P_{in}$ which are divided from a terminal 202 in FIG. 19A, and also FIG. 19B includes two common terminals 204-1 and 204-2 at an output port $P_{out}$ which are divided from a terminal 204 in FIG. 19A In FIG. 20, one of the terminals at input port $P_{in}$, or the input-terminal 201 is delineated as a common top electrode for the FBARs $F_a$, $F_b$. In other words, one of the terminals at input port $P_{in}$, or the input-terminal 201 serves as a top electrode of the FBAR $F_a$, and the other terminals at input port $P_{in}$, or a common-terminal 201-1 serves as a bottom electrode of the FBAR $F_a$. In the FBAR $F_a$ of FIG. 20, a plan view of an semiconductor intermediate electrode (impurity-diffused region) 33a is a rectangular loop shape which circles along all sides of a bottom electrode 210 and the semiconductor intermediate electrode (impurity-diffused region) 33a is formed of a n-type heavily doped region, buried in a p-type semiconductor substrate. And similar to FIGS. 16 and 18, the bottom electrode 210 is delineated with the same planar shape and the same size as the pattern of the FBAR $F_a$. Four sides of the bottom electrode 210 are located on inner sides of the semiconductor intermediate electrode (impurity-diffused region) 33 a rectangular loop shape. The bottom electrode 210 and the semiconductor intermediate electrode (impurity-diffused region) 33a are electrically connected at a contact area assigned near the four sides of the semiconductor intermediate electrode (impurity-diffused region) 33a, the contact area is located in the semiconductor intermediate electrode 33a. Further, the semiconductor intermediate electrode (impurity-diffused region) 33a of the rectangular loop is electrically connected to a bottom electrode wiring 202-1 through the second contact window 36b formed in the inter-layer dielectric film 34. Two contact windows 36bs shown in FIG. 20A are arranged being shaped like the letter L along two adjacent sides of the bottom electrode 210. And further, through the first contact window 36a formed in the inter-layer dielectric film 34, the top electrode 201 shared with the FBAR $F_b$, is electrically connected to the FBAR $F_a$.

As shown in FIG. 20, a pattern of the bottom electrode 211 of the FBAR $F_b$ is delineated so that the bottom electrode 211 can serve as a bottom electrode shared between the FBAR $F_c$ and the FBAR $F_d$. And similar to FIGS. 16 and 18, the common bottom electrode 211 for the FBARs $F_b$, $F_c$ and $F_d$, is delineated with the same planar shape and the same size as the pattern of the piezoelectric layers of the FBARs $F_b$ $F_c$, and $F_d$ so as to delineate a single pattern of the piezoelectric layers of the FBARs $F_b$, $F_c$ and $F_d$.

And through the first contact window 36a in the inter-layer dielectric film 34, the common top electrode 212 for the FBARs $F_d$, the $F_f$, and $F_g$ is electrically connected to corresponding piezoelectric layers of the FBARs $F_d$, $F_f$ and $F_g$ respectively. A pattern of a bottom electrode 213 of the FBAR $F_f$ is delineated as a common bottom electrode of the FBAR $F_e$. The bottom electrode 213 is delineated with the same planar shape and the same size as the patterns of the piezoelectric layers of the FBARs $F_f$ and $F_e$, so as to delineate a single pattern of the piezoelectric layers for the FBARs $F_f$ and $F_e$.

In the FBAR $F_f$ of FIG. 20, a plan view of a semiconductor intermediate electrode (impurity-diffused region) 33f is a rectangular loop shape, which encloses around the first contact window 36a of the FBAR $F_f$. And the semiconductor intermediate electrode (impurity-diffused region) 33f is an n-type heavily doped region, buried in a p-type semiconductor substrate. And, the semiconductor intermediate electrode (impurity-diffused region) 33f of the rectangular loop is electrically connected to a bottom electrode wiring 203 through the two second contact windows 36b in the inter-layer dielectric film 34. The bottom electrode wiring 203 is an out-put terminal at the output port $P_{out}$ shown in FIG. 19. The two contact windows 36bs are arranged being shaped like the letter L along two adjacent sides of the first contact window 36a of the FBAR $F_f$.

In the FBAR $F_g$ of FIG. 20, a plan view of a semiconductor intermediate electrode (impurity-diffused region) 33g is a rectangular loop shape which encloses around the first contact window 36a of the FBAR $F_g$. And the semiconductor intermediate electrode (impurity-diffused region) 33g is an n-type heavily doped region, buried in the p-type semiconductor substrate. And, the semiconductor intermediate electrode (impurity-diffused region) 33f and the semiconductor intermediate electrode (impurity-diffused region) 33g are mutually junction-isolated by pn-junctions between the p-type semiconductor substrate and the n-type impurity-diffused regions, which implement the semiconductor intermediate electrode (impurity-diffused region) 33f and the semiconductor intermediate electrode (impurity-diffused region) 33g. And the semiconductor intermediate electrode (impurity-diffused region) 33g of the rectangular loop is electrically connected to a bottom electrode wiring 204-2 through the second contact windows 36b in the inter-layer dielectric film 34. The bottom electrode wiring 204-2 is a common terminal at the output port $P_{out}$ shown in FIG. 19B. The two contact windows 36b are arranged being shaped like the letter L along two adjacent sides of the first contact window 36a of the FBAR $F_g$.

Further, through each of the first contact windows 36a in the inter-layer dielectric film 34, a piezoelectric layer of the FBAR $F_e$ is electrically connected a top electrode 204-1 of the FBAR $F_e$. The top electrode wiring 204-1 is a common terminal at the output port $P_{out}$ shown in FIG. 19B.

Second Modification of the Fifth Embodiment

Figure 21:
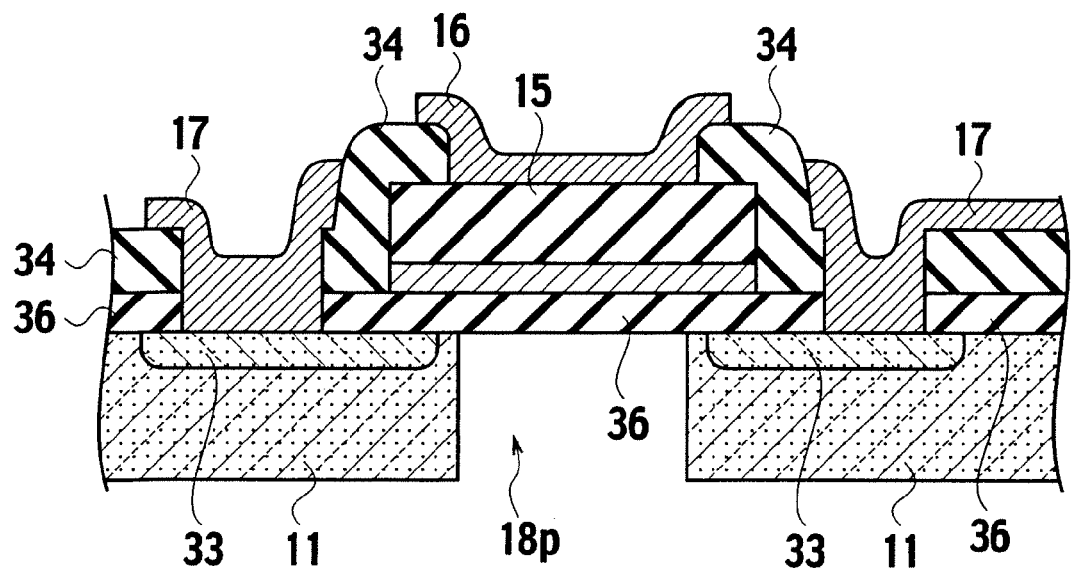
FIG. 21 is a schematic cross sectional view of the FBAR according to a second modification of the fifth embodiment, corresponding to the cross-section taken on line XVIIIB-XVIIIB in FIG. 18A.

As shown in FIG. 21, a FBAR according to another modification (second modification) of the fifth embodiment of the present invention includes a substrate 11 formed of semi-insulating or high-resistivity material, a semiconductor intermediate electrode (impurity-diffused region) 33 buried at and in a top surface of the substrate 11, an insulating film 36 formed on the semiconductor intermediate electrode (impurity-diffused region) 33 and the substrate 11, a bottom electrode 14 formed on the insulating film 36, a piezoelectric layer 15, having the same shape and the same size as the bottom electrode 14 disposed on the bottom electrode 14, an inter-layer dielectric film 34 formed on the piezoelectric layer 15, an inter-layer dielectric film 34 formed on the piezoelectric layer 15, the semiconductor substrate 11 being laid bare from the sides of the piezoelectric layer 15 and the semiconductor intermediate electrode (impurity-diffused region) 33, a top electrode 16 connected to the piezoelectric layer 15, through a contact window in the inter-layer dielectric film 34, and a bottom electrode wiring 17 connected to the semiconductor intermediate electrode (impurity-diffused region) 33 through a contact window in the inter-layer dielectric film 34. For materials of the insulating film 36, similar to the materials for the inter-layer dielectric film 34, various dielectric films such as a silicon oxide film ($SiO_2$), a silicon nitride ($Si_3N_4$) film or a composite film of the silicon oxide film ($SiO_2$) and the silicon nitride ($Si_3N_4$) film can be used.

A plan view of the semiconductor intermediate electrode (impurity-diffused region) 33 is similar to the plan view shown in FIG. 18, being shaped like the letter C, disposed around the piezoelectric layer 15. Namely, the bottom electrode 14 is delineated having the same planar shape and the same size as the piezoelectric layer 15, three sides of the bottom electrode 14, in a plan view, are located on the semiconductor intermediate electrode (impurity-diffused region) 33. However, the bottom electrode 14 and the semiconductor intermediate electrode (impurity-diffused region) 33 are not materially connected, but are capacitively coupled, since the three sides of the semiconductor intermediate electrode (impurity-diffused region) 33 are formed through the insulating film 36. In a frequency bond having a resonance frequency of 2.0 GHz, the bottom electrode 14 can be electrically connected to the semiconductor intermediate electrode (impurity-diffused region) 33 even though such a capacitive coupling through the insulating film 36 is adopted.

As shown in FIG. 21, by protecting the semiconductor intermediate electrode (impurity-diffused region) 33 with the insulating film 36, an operation of the FBAR is further stabilized.

Other structure and materials are similar to the structure and materials of the FBAR already explained along FIG. 18, and overlapping or redundant description may be omitted in the second modification of the fifth embodiment.

Sixth Embodiment

Figure 22:
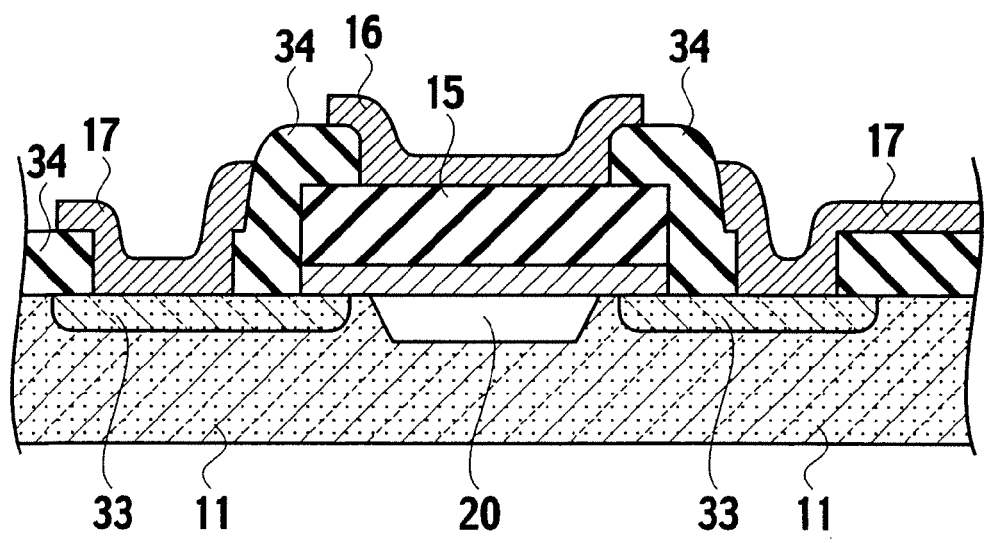
FIG. 22 is a schematic cross sectional view of the FBAR according to a sixth embodiment, corresponding to the cross-section taken on line XVIIIB-XVIIIB in FIG. 18A.

As shown in FIG. 22, a FBAR according to a sixth embodiment of the present invention includes a substrate 11 formed of semi-insulating or high-resistivity material, semiconductor intermediate electrodes (impurity-diffused regions) 33 buried at and in a top surface of the substrate 11, a cavity 20, having a bathtub-shaped (reverse trapezoid) or a U-groove configuration in a cross sectional view, formed at and in the top surface of the substrate 11, sandwiched by the semiconductor intermediate electrodes (impurity-diffused regions) 33, a bottom electrode 14, part of which is mechanically suspended above the cavity 20 and another part of which is mechanically fixed to the substrate 11 so that the cavity 20 is formed between the substrate 11 and the bottom electrode 14, a piezoelectric layer 15, having the same shape and the same size as the bottom electrode 14, disposed on the bottom electrode 14, an inter-layer dielectric film 34 formed on the piezoelectric layer 15, the semiconductor substrate 11 being laid bare from the contour of the piezoelectric layer 15 and the semiconductor intermediate electrode (impurity-diffused region) 33, a top electrode 16 connected to the piezoelectric layer 15 through a contact window formed in the inter-layer dielectric film 34, a bottom electrode wiring 17 connected to the semiconductor intermediate electrode 33 through a contact window formed in the inter-layer dielectric film 34. The cavity 20 is a closed cavity implemented by a groove dug at a top surface of and in the substrate 11. For materials of the inter-layer dielectric film 34, various dielectric films such as a silicon oxide film ($SiO_2$), a silicon nitride ($Si_3N_4$) film or a composite film of the silicon oxide film ($SiO_2$) and the silicon nitride ($Si_3N_4$) film can be used, similar to the FBAR of the fifth embodiment. And as the semiconductor substrate 11, for instance, a p-type silicon substrate, a main surface of which is identified by a (100) plane, having a resistivity of about 600 Ωcm to 10 k Ωcm (impurity concentration of about $2 \times 10^{13}$ cm$^{-3}$-$1 \times 10^{12}$ cm$^{-3}$), is usable. In a case using the p-type silicon substrate, a n-type diffused region of 0.001 Ωcm-0.02 Ωcm (impurity concentration of about $1 \times 10^{20}$ cm$^{-3}$-$5 \times 10^{18}$ cm$^{-3}$) with a depth of about 300 nm to 7 μm, can be adopted for the semiconductor intermediate electrode (impurity-diffused region) 33.

Figure 18A:
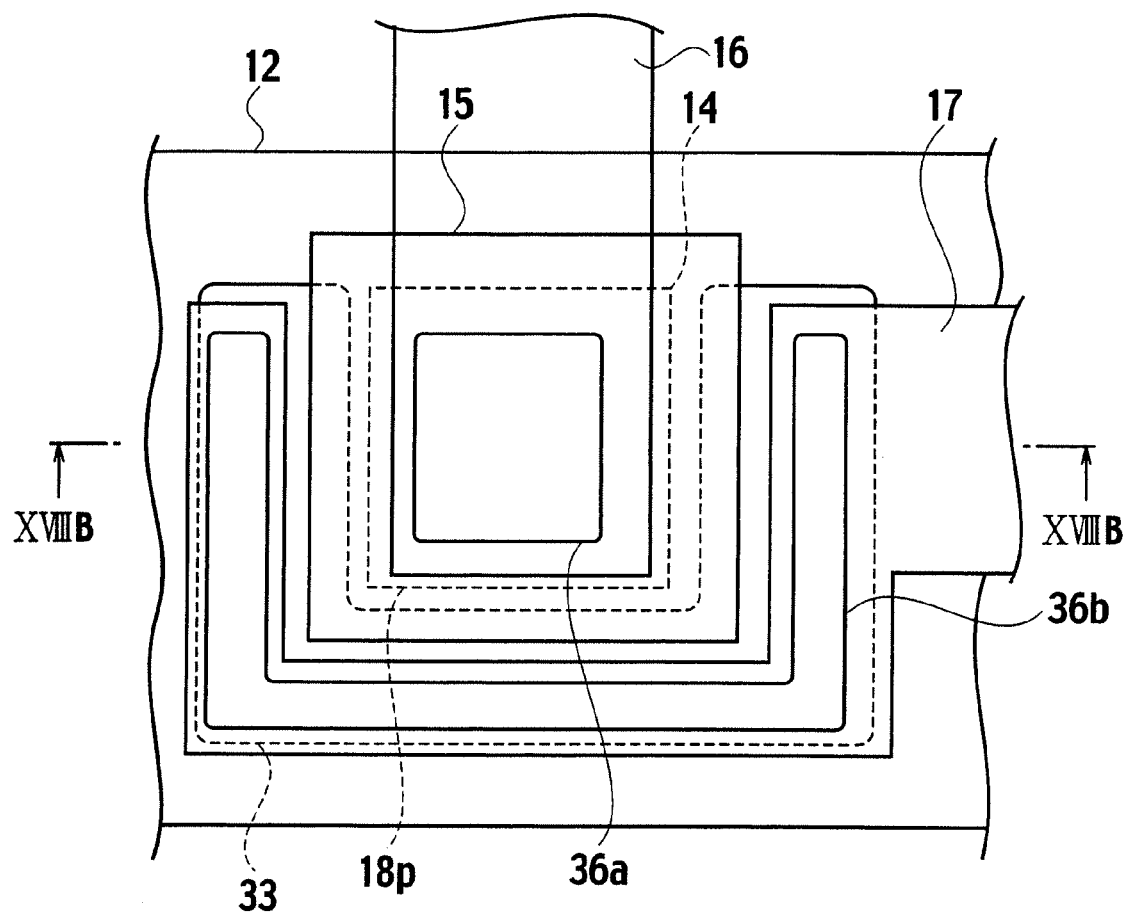
FIG. 18A is a schematic plan view of a FBAR according to a first modification of the fifth embodiment of the present invention.
Figure 18B:
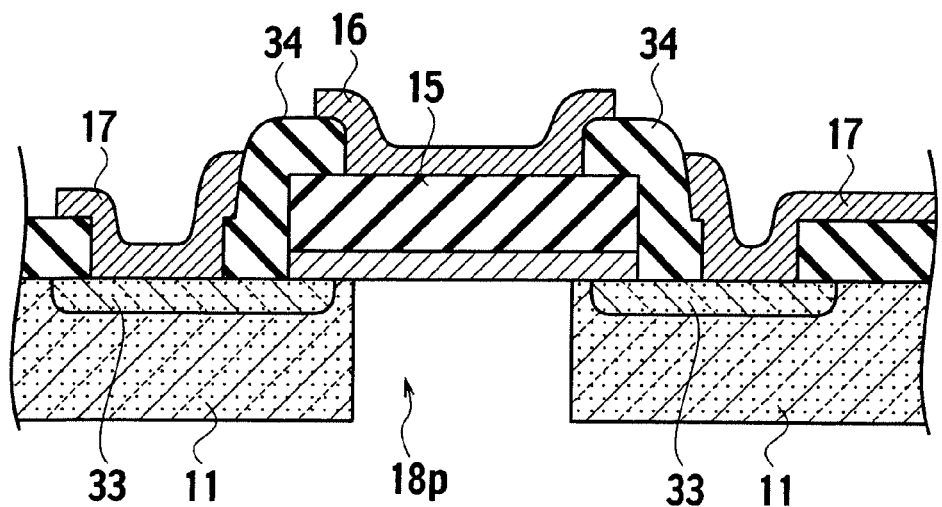
FIG. 18B is a schematic cross sectional view of the FBAR according to the first modification of the fifth embodiment, taken on line XVIIIB-XVIIIB in FIG. 18A.

A plan view (not shown) of the semiconductor intermediate electrode (impurity-diffused region) 33 is concave polygon, similar to the plan view shown in FIG. 18A, being shaped like the letter C, disposed around the piezoelectric layer 15. Namely, the bottom electrode 14 is delineated having the same planar shape and the same size as the piezoelectric layer 15, three sides of the bottom electrode 14 are located on the semiconductor intermediate electrode (impurity-diffused region) 33 shaped in concave polygon. Through a second contact window 36b formed in the inter-layer dielectric film 34, the bottom electrode wiring 17 is electrically connected to the semiconductor intermediate electrode (impurity-diffused region) 33 shaped in concave polygon. As shown in FIGS. 18A and 18B, by leaving a metallic film, etc, implementing the bottom electrode wiring 17, on and around the semiconductor intermediate electrode (impurity-diffused region) 33 through the second contact window 36b in the inter-layer dielectric film 34, even when the resistivity in the semiconductor region (impurity diffused region) of the intermediate electrode 33 is not low enough, resistance of the semiconductor intermediate electrode (impurity-diffused region) 33 can be decreased effectively by the metallic film, etc. The plan view of the semiconductor intermediate electrode (impurity-diffused region) 33 is not limited to the concave polygon, arranged like the letter C, shown in FIG. 18A, another concave polygon arranged like the letter L formed along two adjacent sides of the bottom electrode 14, a rectangular loop configuration which encloses along all sides of the bottom electrode 14, may be adopted, or alternatively, a rectangular area of striped shape may be arranged as shown in FIG. 16A. Further, in the FBAR of the sixth embodiment, through the first contact window 36a formed in the inter-layer dielectric film 34, the piezoelectric layer 15 is electrically connected to the top electrode 16 on the piezoelectric layer 15. A plan view of the top electrode 16 extends vertically, similar to the plan view of FIG. 18A.

With reference to FIGS. 23A-23E, a sequence of manufacturing processes of the FBAR according to the sixth embodiment is explained. Note that the FBAR of the sixth embodiment can be manufactured by various manufacturing methods including a modification of the sixth embodiment, other than the sequence of manufacturing processes disclosed by the following example.

(a) First, as similar to FIG. 17A, a photoresist is coated on the entire top surface of a semiconductor substrate 11, or a p-type Si (100) substrate 11 having a high-resistivity and the photoresist is delineated by normal photolithography technique so as to form a photoresist-mask. Through the photoresist-mask, n-type impurity ions such as phosphorus ions ($^{31}P^+$) are implanted into the semiconductor substrate 11 with an acceleration voltage of 80-150 kV, and a dose amount of about $3 \times 10^{15}$ cm$^{-2}$-$4 \times 10^{16}$ cm$^{-2}$ so as to form an ion implanted region 33 in the semiconductor substrate 11.

Figure 23A:
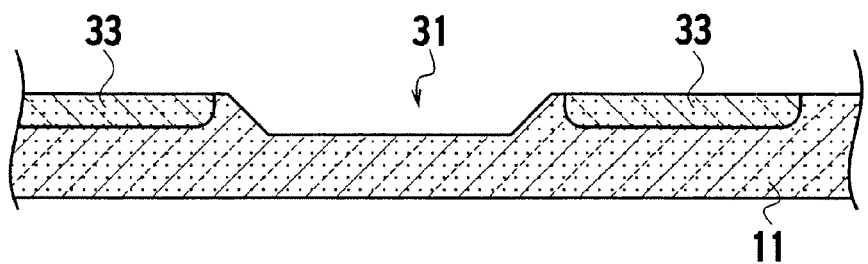
FIG. 23A is a process flow cross sectional view showing an intermediate product of the FBAR, corresponding to the cross-section taken on line XVIIIB-XVIIIB in FIG. 18A, explaining a manufacturing method of the FBAR according to the sixth embodiment.

(b) And after the photoresist-mask used as the ion-implantation mask is removed, the semiconductor substrate 11 is annealed in nitrogen ($N_2$) gas ambient which contains 1-5% oxygen ($O^2$) gas or alternatively, in an inert gas such as helium (He), at 1100-1200 degrees C. for about 30 minutes to 2 hours. The process activates the implanted impurity ions so as to form the semiconductor intermediate electrode (impurity-diffused region) 33 implemented by the n-type impurity-diffused region. Afterwards, as shown in FIG. 23A, on the Si (100) substrate 11, a groove 31 having a 0.5 to 2 μm depth, or preferably a 0.8 to 1.5 μm depth, is formed by photolithography with fluoride based etching gas. A plan view of the groove 31 is a rectangular pattern in which a branch member of striped configuration is established so that the branch member of striped configuration is orthogonal to one of the sides of the rectangular pattern, although the plan view is omitted. More than two branch members may be established to the rectangular pattern.

Figure 23B:
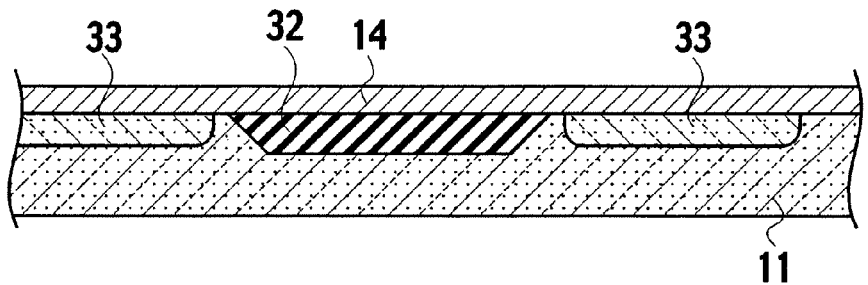
FIG. 23B is a subsequent process flow cross sectional view showing the intermediate product of the FBAR according to the sixth embodiment after the process stage shown in FIG. 23A.

(b) For instance, when the groove 31 has a 1.0 μm depth, a BPSG film, having an about 1.2 μm film thickness is deposited by chemical vapor deposition (CVD) method on the groove 31, and the BPSG film is planarized by CMP method so as to form a pattern of a sacrificial layer 32. A plan view of the sacrificial layer 32 is a similar rectangular pattern to the plan view of the groove 31, in which a branch member of striped configuration is established so that the branch member of striped configuration is orthogonal to one of the sides of the rectangular pattern. Next, an Al film 14, or a metallic film for the bottom electrode, with a 150 to 600 nm film thickness, or preferably 250 to 350 nm, is formed on the entire top surfaces of the semiconductor substrate 11 and the semiconductor intermediate electrode (impurity-diffused region) 33 by using RF magnetron sputtering as shown in FIG. 23B.

Figure 23C:
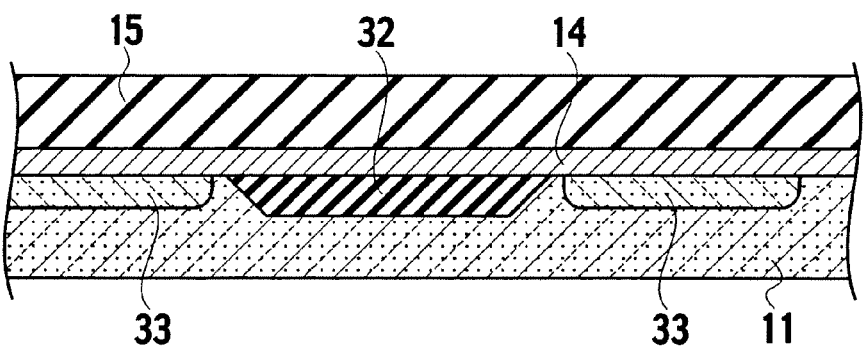
FIG. 23C is a subsequent process flow cross sectional view showing the intermediate product of the FBAR according to the sixth embodiment, after the process stage shown in FIG. 23B.
Figure 23D:
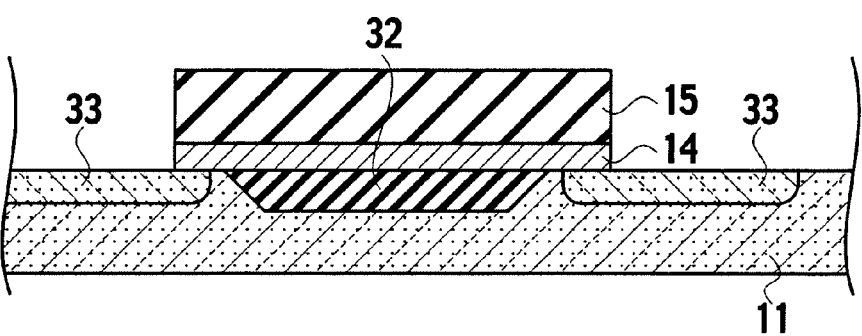
FIG. 23D is a further subsequent process flow cross sectional view showing the intermediate product of the FBAR according to the sixth embodiment after the process stage shown in FIG. 23C.

(c) Afterwards, for instance, an AlN film 15, or a piezoelectric dielectric film (mother material film) for forming the piezoelectric layer, with a 2.5 μm film thickness is deposited on the entire top surface of the Al film 14 as shown in FIG. 23C. And after a new photoresist is coated on the entire top surface of the AlN film (piezoelectric dielectric film for forming the piezoelectric layer) 15, the new photoresist on the AlN film is delineated by photolithography. And by using the new photoresist as an etching mask, the AlN film (piezoelectric dielectric film for forming the piezoelectric layer) 15 is selectively removed by RIE method with chloride based etching gas, so as to form a pattern of the piezoelectric layer 15. Subsequently, in the same etching-chamber in which the pattern of the piezoelectric layer 15 is delineated, the Al film (metallic film for the bottom electrode) 14 is selectively removed by RIE method with chloride based etching gas, so as to form a pattern of the bottom electrode 14 as shown in FIG. 23D such that the pattern of the bottom electrode 14 can have the same planar shape and the same size as the pattern of the piezoelectric layer 15. In the process, as shown in FIG. 23D, part of the semiconductor substrate 11 and part of the semiconductor intermediate electrode (impurity-diffused region) 33 are laid bare. In other words, as shown in FIG. 23D, three sides of the bottom electrode 14 may be located on the semiconductor intermediate electrode (impurity-diffused region) 33, and the bottom electrode 14 and the semiconductor intermediate electrode (impurity-diffused region) 33 are electrically connected—although, in a cross-sectional view shown in FIG. 23D, as if two semiconductor intermediate electrodes (impurity-diffused regions) 33 appear under two sides of the bottom electrode 14, at the near side of the paper, the semiconductor intermediate electrode (impurity-diffused region) 33 is also formed under the other remaining side of the bottom electrode 14 so as to implement the concave polygon, shaped like the letter C. Further, in the plan view, a branch member of striped configuration, established in a rectangular pattern of the sacrificial layer 32, comes to show up from the side of a double-layer structure implemented by the piezoelectric layer 15 and the bottom electrode 14.

Figure 23E:
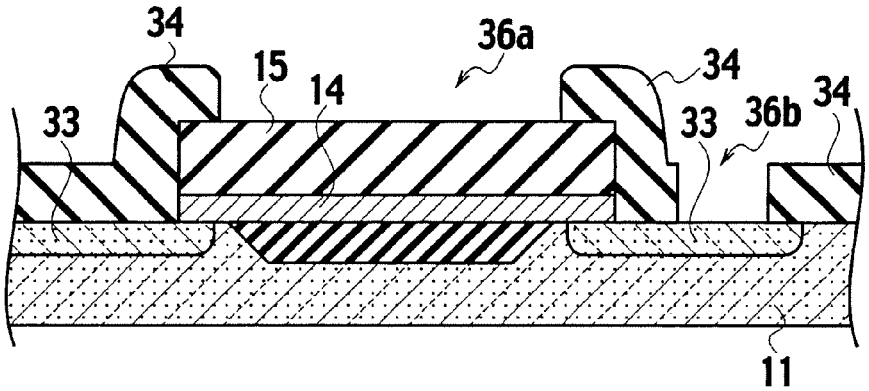
FIG. 23E is a still further subsequent process flow cross sectional view showing the intermediate product of the FBAR according to the sixth embodiment after the process stage shown in FIG. 23D.

(d) Further, on the piezoelectric layer 15, on the branch member of the sacrificial layer 32 and on the semiconductor substrate 11 and the semiconductor intermediate electrode (impurity-diffused region) 33 which come to show up from the side of the piezoelectric layer 15, a silicon nitride ($Si_3N_4$) film with a 100 nm to 400 nm film thickness is deposited so as to form the inter-layer dielectric film 34 by CVD method. The inter-layer dielectric film 34 may be formed of insulating materials which have a large etching selectivity over the BPSG film used for the pattern of the sacrificial layer 32, other than the silicon nitride ($Si_3N_4$) film. Next, a new photoresist is coated on the inter-layer dielectric film 34, and the new photoresist is exposed with light transmitted through a particular photo-mask by photolithography and the new photoresist is developed so as to form an etching mask of the new photoresist. And by using the new photoresist as an etching mask, the inter-layer dielectric film 34 is selectively removed by RIE method as shown in FIG. 23E, so as to open a pattern of the first contact window 36a, making visible part of the piezoelectric layer 15 and to open a pattern of the second contact window 36b, making visible part of the semiconductor intermediate electrode (impurity-diffused region) 33. Although a cross-sectional view is omitted, in the process, the inter-layer dielectric film 34 formed on the branch member of the sacrificial layer 32 is selectively etched so as to form a conduit (longitudinal hole) of an etching solution.

(e) Next, the substrate 11 is submerged in a BPSG-etching solution such as fluoride acid (HF), fluoridation ammonium $NH_4F$). By the process, the branch member of striped configuration in a rectangular pattern of the sacrificial layer 32, laid bare from the side of the double-layer structure of the piezoelectric layer 15 with the bottom electrode 14, is etched through the conduit (vertical hole) of the etching solution in the inter-layer dielectric film 34. As etching of the branch member in the striped configuration proceeds, a conduit (lateral hole) of the etching solution to the sacrificial layer 32, which is buried under the bottom surface (belly) of the bottom electrode 14, is formed. And the sacrificial layer 32 is etched through the conduit of the etching solution, so as to form the cavity 20 shown in FIG. 22. After the etching by the BPSG-etching solution, the substrate 11 is rinsed by isopropyl alcohol and dried.

(f) Subsequently, an Al film having a 150 to 600 nm film thickness, or preferably a 250 to 350 nm film thickness, is deposited on the inter-layer dielectric film 34 through the first contact window 36a and the second contact window 36b. Afterwards, the Al film is delineated by photolithography and accompanying wet etching using a combination of nitric acid ($HNO_3$), acetic acid ($CH_3COOH$), phosphoric acid ($H_3PO_4$) so as to delineate the top electrode 16 and the bottom electrode wiring 17. The top electrode 16 is electrically connected to the top surface of the piezoelectric layer 15 laid bare from the bottom surface of the first contact window 36a and the bottom electrode wiring 17 is electrically connected to the semiconductor intermediate electrode (impurity-diffused region) 33 laid bare from the bottom surface of the second contact window 36b respectively.

The FBAR according to the sixth embodiment can implement the ladder-type filter 41 shown in FIGS. 6 and 19, and the VCO of mobile communication devices shown in FIG. 7 as mentioned in the first embodiment. Also a plurality of FBARs of the sixth embodiment can be employed in the portable transceiver shown in FIG. 8 and FIG. 9, so as to implement the micro mechanical filters for the RF filter 41 and the IF filter 42.

Other Embodiments

Various modifications will become possible for those skilled in the art after receiving the teaching of the present disclosure without departing from the scope thereof.

In the plan view of FIG. 20, the example of the configuration in which the micro mechanical filters implemented by a plurality of FBARs according to the fifth embodiment, are actually manufactured. The ladder-type filter 41 with three and a half stages shown in FIG. 19, is not limited to such filters as implemented by the FBARs including the semiconductor intermediate electrode (impurity-diffused region) 33. For instance, by adopting the FBAR having the intermediate electrode 23 formed of metallic materials, the ladder-type filter 41 with three and a half stages shown in FIG. 19, can be achieved.

Figure 24:
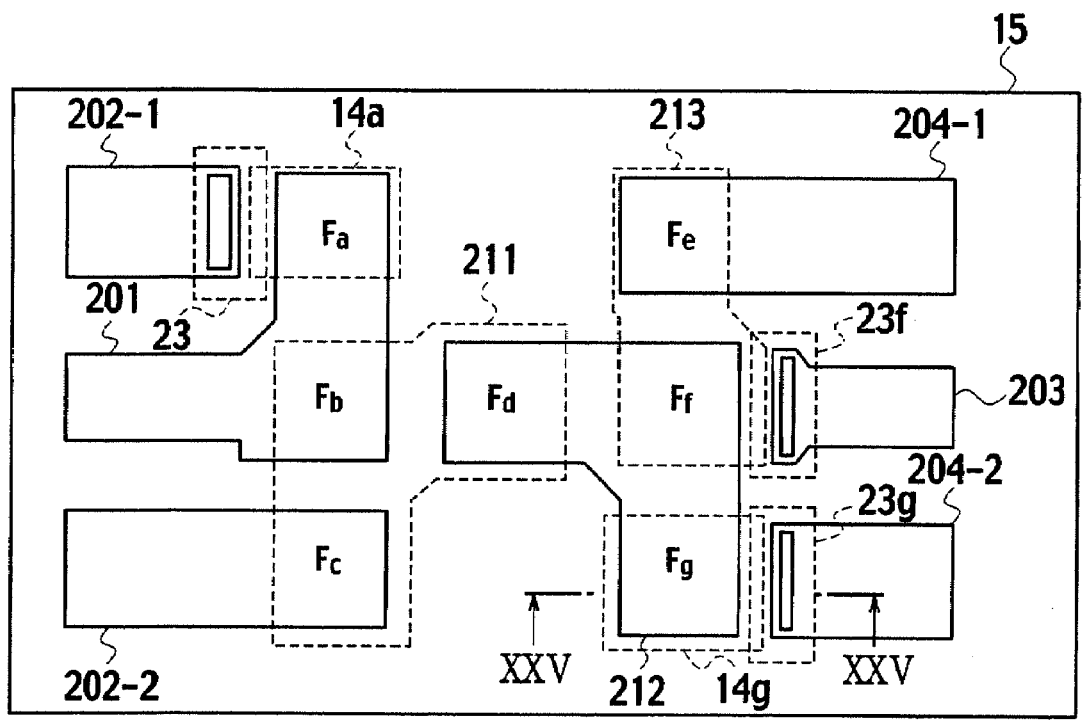
FIG. 24 is an example of an actual plan view of the micro mechanical filter implemented by a plurality of FBARs according to another embodiment of the present invention.

FIG. 24 shows an example in which the ladder-type filter 41 with three and a half stages shown in FIG. 19, is implemented by using a plurality of FBARs with such metallic intermediate electrode 23. In a plan view, a piezoelectric layer 15 is merged into a single piece of large rectangular pattern such that a piezoelectric layer 15 covers an entire area which seven FBARs $F_a$, $F_b$, $F_c$, $F_d$, $F_e$, $F_f$, $F_g$ occupy.

Figure 25:
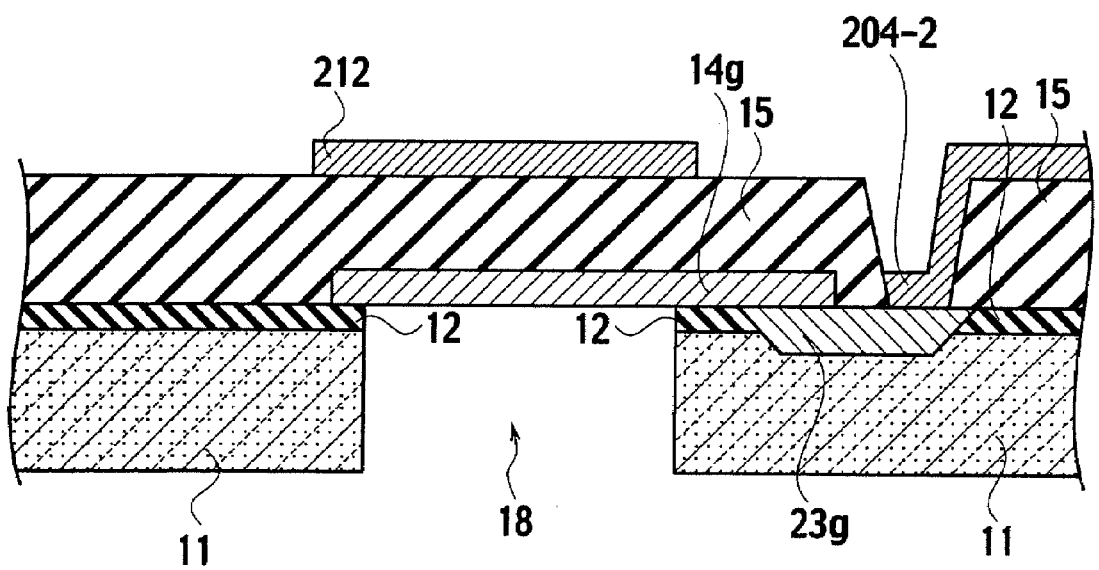
FIG. 25 is a schematic cross sectional view of one of the FBARs according to another embodiment, taken on line XXV-XXV in FIG. 24.

FIG. 25 shows a cross-sectional view of the FBAR $F_g$ shown in FIG. 24, taken on line B-B. In the FBAR $F_g$, a plan view of a metallic intermediate electrode 23 is a rectangle in a striped shape as shown in a broken line of FIG. 24, and the metallic intermediate electrode 23g of rectangular shape is electrically connected to a bottom electrode wiring 204-2 through a contact window of rectangular slit formed in the piezoelectric layer 15. The bottom electrode wiring 204-2 is a common terminal at the output port $P_{out}$ shown in FIG. 19B. The two contact windows of rectangular slit are arranged as part of a pattern of the metallic intermediate electrode 23g of the FBAR $F_g$. In the FBAR $F_g$, one side of a bottom electrode 14g is disposed on the metallic intermediate electrode 23g and the bottom electrode 14g and the metallic intermediate electrode 23g are electrically connected. In addition, the FBAR $F_g$ according to the other embodiment includes a cavity 18, which is formed along a direction from a bottom surface of a substrate 11 to a top surface of the substrate 11 for exposing a bottom surface of the bottom electrode 14g. Therefore, central part of the bottom electrode 14g is mechanically suspended above the cavity 18 by fixing peripheral part of the bottom electrode 14g to the substrate 11.

In FIG. 24, similar to FIG. 20, one of the terminals at input port $P_{in}$, or the input-terminal 201 shown in FIG. 19, is delineated as a common top electrode for the FBARs $F_a$, $F_b$. In other words, one of the terminals at input port $P_{in}$, or the input-terminal 201 serves as a top electrode of the FBAR $F_a$, and the other terminals at input port $P_{in}$, or a common-terminal 202-1 serves as a bottom electrode of the FBAR $F_a$. In FIG. 24, the FBAR $F_a$ includes the metallic intermediate electrode 23 of rectangular shape shown in a broken line.

A plan view of the metallic intermediate electrode 23 of the FBAR $F_a$ is a striped shape in a rectangular pattern as shown in the broken line. One side of the bottom electrode 14a is located on one sides of the metallic intermediate electrode 23 of rectangular shape, the bottom electrode 14a and the metallic intermediate electrode 23 are electrically connected in one side of the bottom electrode 14. Further, the metallic intermediate electrode 23 is electrically connected to a bottom electrode wiring 202-1 through a contact window of rectangular slit formed in the piezoelectric layer 15 similar to the FBAR $F_g$ (see FIG. 25). The contact window of the rectangular slit is arranged along one side of the bottom electrode 14.

As shown in FIG. 24, a pattern of a bottom electrode 211 of the FBAR $F_b$ is delineated so that the bottom electrode 211 can serve as a common bottom electrode shared between the FBAR $F_c$ and the FBAR $F_d$. Further, a common top electrode 212 for the FBARs $F_d$, $F_f$, and $F_g$ is electrically connected to corresponding piezoelectric layers 15 such that the common top electrode 212 is located opposing to each of the corresponding bottom electrodes of the FBARs $F_d$, $F_f$ and $F_g$ respectively.

A pattern of a bottom electrode 213 of the FBAR $F_f$ is delineated as a common bottom electrode of the FBAR $F_e$. And a metallic intermediate electrode 23f of the FBAR $F_f$ is electrically connected to a bottom electrode wiring 203 through the contact window of the rectangular slit formed in the piezoelectric layer 15. The bottom electrode wiring 203 is an out-put terminal at the output port $P_{out}$ shown in FIG. 19, while the FBAR $F_e$ is electrically connected a top electrode 204-1. The top electrode wiring 204-1 is a common terminal at the output port $P_{out}$ shown in FIG. 19B.

Figure 26:
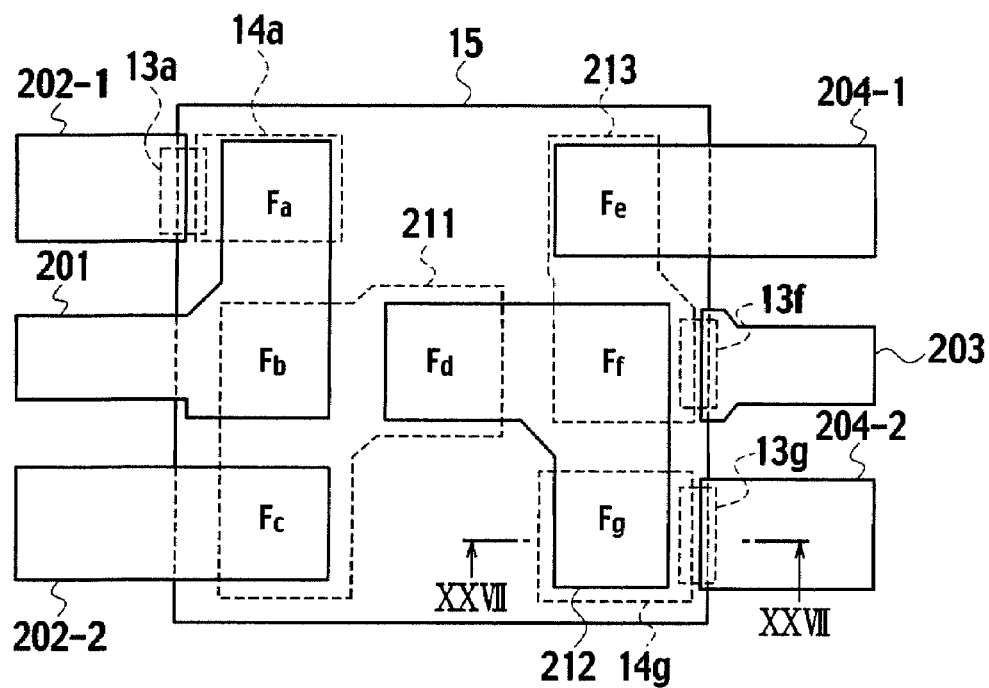
FIG. 26 is an example of an actual plan view of the micro mechanical filter implemented by a plurality of FBARs according to still another embodiment of the present invention.

FIG. 26 shows another example in which the ladder-type filter 41 with three and a half stages shown in FIG. 19, is implemented by using a plurality of FBARs with a metallic intermediate electrode 13 shown in the fifth embodiment. In a plan view, a piezoelectric layer 15 is arranged as a smaller rectangular pattern than the pattern of piezoelectric layer 15 shown in FIG. 24, such that a piezoelectric layer 15 covers an area which seven bottom electrodes of seven FBARs $F_a$, $F_b$, $F_c$, $F_d$, $F_e$, $F_f$, $F_g$ occupy. And the contour of the piezoelectric layer 15, defining the shape of the piezoelectric layer 15, crosses top surfaces of a metallic intermediate electrode 13a of the FBAR $F_a$, a metallic intermediate electrode 13f of the FBAR $F_f$, a metallic intermediate electrode 13g of the FBAR $F_g$, shown in the broken line, respectively, parts of the metallic intermediate electrodes 13a, 13f and 13g extends to an outside of the contour of the piezoelectric layer 15, from the contour of the piezoelectric layer 15

Plan views of the metallic intermediate electrodes 13a, 13f and 13g are striped geometries in rectangular patterns as shown in the broken line of FIG. 26.

Figure 27:
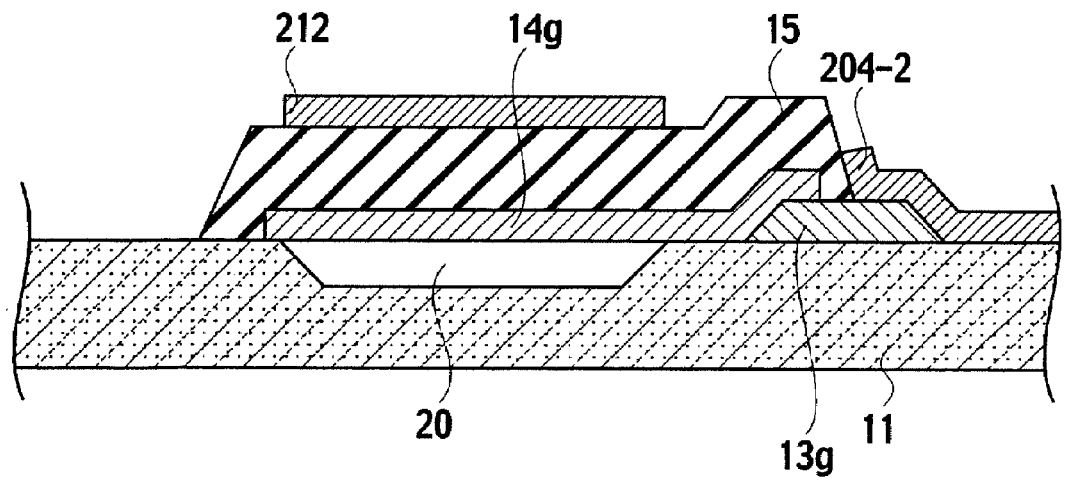
FIG. 27 is a schematic cross sectional view of one of the FBARs according to the still another embodiment, taken on line XXVII-XXVII in FIG. 26.

FIG. 27 shows a cross-sectional view of the FBAR $F_g$ shown in FIG. 26, taken on line B-B. In the FBAR $F_g$, as shown in FIG. 27, sidewall faces of the metallic intermediate electrodes 13g is a tapered configuration. One side of a bottom electrode 14g is connected on the tapered left sidewall face of the metallic intermediate electrodes 13g and further extends on the metallic intermediate electrodes 13g. A bottom electrode wiring 204-1 is electrically connected on the right side of the metallic intermediate electrodes 13 laid bare from the sidewall face of the piezoelectric layer 15. A bottom electrode wiring 204-2 is a common terminal at the output port $P_{out}$ shown in FIG. 19B. Further a cavity 20, having a bathtub-shaped (reverse trapezoid) or a U-groove configuration is formed at and in a top surface of a substrate 11, and part of a bottom electrode 14g is mechanically suspended above a cavity 20 and another part of which is mechanically fixed to the substrate 11.

In FIG. 26, similar to FIGS. 20 and 24, one of the terminals at input port $P_{in}$, or the input-terminal 201 shown in FIG. 19, is delineated as a common top electrode for the FBARs $F_a$, $F_b$. In other words, one of the terminals at input port $P_{in}$, or the input-terminal 201 serves as a top electrode of the FBAR $F_a$, and the other terminals at input port $P_{in}$, or a common-terminal 202-1 serves as a bottom electrode wiring of the FBAR $F_a$. In FIG. 26, the FBAR $F_a$ includes a metallic intermediate electrode 13a of rectangular shape shown in a broken line.

One side of a bottom electrode 14a is located on inner sides of the metallic intermediate electrode 13a of rectangular shape, the bottom electrode 14a and the metallic intermediate electrode 13a are electrically connected in one side of the bottom electrode 14. Further, the metallic intermediate electrode 13a is electrically connected to a bottom electrode wiring 202-1.

As shown in FIG. 26, a pattern of a bottom electrode 211 of the FBAR $F_b$ is delineated so that the bottom electrode 211 can serve as a common bottom electrode shared between the FBAR $F_c$, and the FBAR $F_d$. Further, a common top electrode 212 for the FBARs $F_d$, $F_f$, and $F_g$ is electrically connected to corresponding piezoelectric layers 15 such that the common top electrode 212 is located opposing to each of the corresponding bottom electrodes of the FBARs $F_d$, $F_f$, and $F_g$ respectively.

A pattern of a bottom electrode 213 of the FBAR $F_f$ is delineated as a common bottom electrode of the FBAR $F_e$. And a metallic intermediate electrode 13f of the FBAR $F_f$ laid bare from the sidewall face of the piezoelectric layer 15 is electrically connected to a bottom electrode wiring 203. The bottom electrode wiring 203 is an out-put terminal at the output port $P_{out}$ shown in FIG. 19, while the FBAR $F_e$ is electrically connected a top electrode 204-1. The top electrode wiring 204-1 is a common terminal at the output port $P_{out}$ shown in FIG. 19B.

Thus, the present invention of course includes various embodiments and modifications and the like which are not detailed above. Therefore, the scope of the present invention will be defined in the following claims.

What is claimed is:

1. A film bulk acoustic-wave resonator comprising:
   a substrate having a cavity, the substrate being formed of one of semi-insulating material and high-resistivity material;
   a bottom electrode partially fixed to the substrate, part of the bottom electrode is mechanically suspended above the cavity;
   a piezoelectric layer disposed on the bottom electrode, the shape of the piezoelectric layer is defined by a contour;
   a top electrode on the piezoelectric layer;
   a semiconductor intermediate electrode buried at and in a surface of the substrate, being located at the contour of the piezoelectric layer, the semiconductor region having a lower resistivity than the substrate, the intermediate electrode is connected to the bottom electrode in the inside of the contour; and
   a bottom electrode wiring connected to the semiconductor intermediate electrode extending from the contour to an outside of the contour in the plan view,
   wherein a longitudinal vibration mode along a thickness direction of the piezoelectric layer is utilized.

2. The film bulk acoustic-wave resonator of claim 1, further comprising:
   an inter-layer dielectric film formed on the piezoelectric layer, the semiconductor substrate being laid bare from the contour of the piezoelectric layer and the semiconductor intermediate electrode,
   wherein through a first contact window formed in the inter-layer dielectric film, the top electrode is electrically connected to the piezoelectric layer and through a second contact window formed in the inter-layer dielectric film, the bottom electrode wiring is electrically connected to the semiconductor intermediate electrode.

3. The film bulk acoustic-wave resonator of claim 2, wherein the cavity is an open cavity implemented by a through-hole penetrating the substrate along a direction from the bottom surface of the substrate to the top surface of the substrate for exposing a bottom surface of the bottom electrode.

4. The film bulk acoustic-wave resonator of claim 2, wherein the cavity is a closed cavity implemented by a groove dug at a top surface of and in the substrate.

5. A method for manufacturing a film bulk acoustic-wave resonator, comprising:
   forming a semiconductor intermediate electrode on a semiconductor substrate, the semiconductor intermediate electrode having a lower resistivity than the semiconductor substrate;
   stacking a metallic film for forming a bottom electrode on the entire surface of the semiconductor substrate so as to include the semiconductor intermediate electrode;
   stacking a piezoelectric dielectric film on the entire surface of the bottom electrode and on the semiconductor intermediate electrode;
   delineating the piezoelectric dielectric film and the metallic film with an identical etching mask so as to form the piezoelectric layer and the bottom electrode, the piezoelectric layer has a same shape and a same size as the bottom electrode in a plan view, the bottom electrode is connected to the semiconductor intermediate electrode;
   forming a top electrode on the piezoelectric layer; and
   forming a bottom electrode wiring so as to be connected to the semiconductor intermediate electrode.

* * * * *